US012777439B2

(12) United States Patent
Soualle et al.

(10) Patent No.: US 12,777,439 B2
(45) Date of Patent: Oct. 27, 2026

(54) METHOD FOR RESOLVING TIME AMBIGUITY, A RELATED SYSTEM, A RELATED TRANSMITTER AND A RELATED RECEIVER

(71) Applicant: THE EUROPEAN UNION, REPRESENTED BY THE EUROPEAN COMMISSION, Brussels (BE)

(72) Inventors: Francis Soualle, Taufkirchen (DE); Jean-Jacques Floch, Taufkirchen (DE); Till Schmitt, Noordwijk (NL); Giacomo Da Broi, Noordwijk (NL)

(73) Assignee: THE EUROPEAN UNION, REPRESENTED BY THE EUROPEAN COMMISSION, Brussels (BE)

( * ) Notice: Subject to any disclaimer, the term of this patent is extended or adjusted under 35 U.S.C. 154(b) by 65 days.

(21) Appl. No.: 18/689,529

(22) PCT Filed: Sep. 6, 2022

(86) PCT No.: PCT/EP2022/074757
§ 371 (c)(1),
(2) Date: Mar. 6, 2024

(87) PCT Pub. No.: WO2023/031483
PCT Pub. Date: Mar. 9, 2023

(65) Prior Publication Data

US 2024/0406899 A1 Dec. 5, 2024

(30) Foreign Application Priority Data

Sep. 6, 2021 (EP) .................................... 21194966

(51) Int. Cl.
*H04W 56/00* (2009.01)
*G01S 19/02* (2010.01)
(Continued)

(52) U.S. Cl.
CPC ......... *H04W 56/0035* (2013.01); *G01S 19/02* (2013.01); *G01S 19/42* (2013.01); *H03M 13/19* (2013.01)

(58) Field of Classification Search
CPC .... H04W 56/0035; G01S 19/02; G01S 19/42; H03M 13/19
See application file for complete search history.

(56) References Cited

U.S. PATENT DOCUMENTS

2010/0063742 A1* 3/2010 Hart ....................... G16B 40/00 702/19
2011/0206091 A1* 8/2011 Sutton .................... H04B 1/707 375/150

(Continued)

OTHER PUBLICATIONS

Pelliccioni Giovanni et al: "De Bruijn sequences as spreading codes in extreme Doppler conditions: Analysis and results", IEEE International Conference on Wireless for Space and Extreme Environments, IEEE, Nov. 7, 2013 (Nov. 7, 2013) , pp. 1-6.

(Continued)

*Primary Examiner* — Kenny S Lin
(74) *Attorney, Agent, or Firm* — FisherBroyles, LLP; Roger L. Browdy; James E. Mrose

(57) ABSTRACT

Embodiment of the invention relate to a Method and related devices for resolving time ambiguity between a radio transmitter of a plurality of transmitters having a first time scale and a radio receiver of a plurality of radio receivers having a second time scale, said radio transmitter being coupled to said radio receiver, said radio transmitter transmitting a radio signal to said radio receiver wherein said method (Continued)

comprising the steps of generating, by said radio transmitter an overlay sequence comprising a set of symbols per time ambiguity interval, said set of symbols having a predetermined length, said overlay sequence satisfying a condition of single occurrence of a subset of symbols within said set of symbols of said time ambiguity interval, each said time ambiguity interval comprising an implicit time marker and transmitting said radio signal, by said radio transmitter to said radio receiver said radio signal comprising said overlay sequence modulated onto a carrier of said radio signal and receiving said radio signal by said radio receiver and capturing a snapshot of said radio signal by said radio receiver ($RX_1$), said snapshot comprising a subset of symbols of said overlay sequence comprising N symbols, processing said snapshot, by said radio receiver to determine a relative position of said implicit time marker of said radio signal based on the position of said subset of symbols included in said snapshot within said set of symbols of said time ambiguity interval and resolving said Time Ambiguity between said first time scale and said second time scale by evaluating a delay between said implicit time marker expressed in said first time scale and based on said processing of said snapshot and said implicit time marker within said overlay sequence generated based on the second time scale wherein said overlay sequence consists of a M-ary sequence which is based on M-ary De Bruijn sequence.

15 Claims, 20 Drawing Sheets

(51) Int. Cl.
*G01S 19/42* (2010.01)
*H03M 13/19* (2006.01)

(56) References Cited

U.S. PATENT DOCUMENTS

| | | | | |
|---|---|---|---|---|
| 2016/0161614 | A1 | 6/2016 | Lukcin et al. | |
| 2017/0044602 | A1* | 2/2017 | Hubbell | C12Q 1/6869 |
| 2021/0357907 | A1* | 11/2021 | Shpak | H04W 4/029 |
| 2023/0065422 | A1* | 3/2023 | Garcia Molina | G01S 19/39 |

OTHER PUBLICATIONS

Wallner Stefan et al: "Novel Concepts on GNSS Signal Design serving Emerging GNSS User Categories: Quasi-Pilot Signal", 2020 European Navigation Conference (ENC), German Institute of Navigation—DGON, Nov. 23, 2020 (Nov. 23, 2020), pp. 1-22.

Naofumi Aoki: "A Synchronization Technique Using De Bruijn Sequences for Inaudible Sound Communication Systems", IEICE Proceedings, Dec. 2, 2020 (Dec. 2, 2020), p. P2-P4.

* cited by examiner

| L | Examples of Overlay Binary Sequence ("De Bruijn") |
|---|---|
| 16 | 0 1 1 1 1 0 0 0 0 1 0 0 1 1 0 1 |
| 32 | 0 0 1 0 1 0 0 0 1 0 0 1 1 1 0 1 1 1 1 1 0 0 0 0 0 1 1 0 1 0 1 1 |
| 64 | 0 0 1 0 1 0 0 0 0 0 0 1 1 0 1 1 1 1 0 1 1 0 1 0 0 1 1 0 0 0 0 1 0<br>1 1 0 0 1 1 1 1 1 1 0 0 0 1 0 0 0 1 1 1 0 1 0 1 0 1 1 1 0 0 1 |
| 128 | 0 1 0 0 0 0 0 0 0 1 1 1 1 1 0 0 1 1 0 1 1 1 1 1 1 1 0 1 1 0 1 1 0<br>0 1 1 1 0 1 1 1 0 1 0 1 1 0 1 0 1 0 1 0 0 0 0 1 1 0 1 0 0 0 1 1 0<br>0 0 1 0 0 1 1 0 0 1 0 1 0 1 1 1 0 0 0 1 1 1 0 0 1 0 0 1 0 1 1 0 0<br>0 0 0 1 0 1 1 1 1 0 1 0 0 1 0 0 0 1 0 1 0 0 1 1 1 1 0 0 0 |

FIG. 7

| N | 3 | | 5 | | | | 6 | |
|---|---|---|---|---|---|---|---|---|
| L | **8** | **8** | **32** | **32** | **32** | **32** | **64** | **64** |
| Overlay Symbol Duration, $T_s$ [ms] | 40 | 44 | 40 | 44 | 60 | 64 | 44 | 64 |
| Snapshot Duration, $T_{Snp}$ [ms] | 120 | 132 | 200 | 220 | 300 | 320 | 264 | 384 |
| Time Ambiguity Resolution, TAR [s] | ±0,16 | ±0,176 | ±0,64 | ±0,704 | ±0,96 | ±1,024 | ±1,408 | ±2,048 |

FIG.12

| TAR | N | 1 | 2 | 3 | 4 | 5 |
|---|---|---|---|---|---|---|
| K | $L=L_1$ | 2 | 4 | 8 | 16 | 32 |
| 1 | | 0,08 | 0.48 | 2,24 | 9,6 | 39,68 |
| 2 | | 0 | 0.32 | 1,92 | 8,96 | 38,4 |
| 3 | | -0,08 | 0.16 | 1,6 | 8,32 | 37,12 |
| 4 | | -0,16 | 0 | 1,28 | 7,68 | 35,84 |
| 5 | | -0,24 | -0,16 | 0,96 | 7,04 | 34,56 |
| 6 | | -0,32 | -0,32 | 0,64 | 6,4 | 33,28 |
| 7 | | -0,4 | -0,48 | 0,32 | 5,76 | 32 |
| 8 | | -0,48 | -0,64 | 0 | **5,12** | 30,72 |
| 9 | | -0,56 | -0,8 | -0,32 | 4,48 | 29,44 |
| 10 | | -0,64 | -0,96 | -0,64 | 3,84 | 28,16 |
| 11 | | -0,72 | -1,12 | -0,96 | 3,2 | 26,88 |
| 12 | | -0,8 | -1,28 | -1,28 | 2,56 | 25,6 |
| 13 | | -0,88 | -1,44 | -1,6 | 1,92 | 24,32 |
| 14 | | -0,96 | -1,6 | -1,92 | 1,28 | 23,04 |
| 15 | | -1,04 | -1,76 | -2,24 | 0,64 | 21,76 |
| 16 | | -1,12 | -1,92 | -2,56 | 0 | 20,48 |
| 17 | | -1,2 | -2,08 | -2,88 | -0,64 | 19,2 |
| 18 | | -1,28 | -2,24 | -3,2 | -1,28 | 17,92 |
| 19 | | -1,36 | -2,4 | -3,52 | -1,92 | 16,64 |
| 20 | | -1,44 | -2,56 | -3,84 | -2,56 | 15,36 |
| 21 | | -1,52 | -2,72 | -4,16 | -3,2 | 14,08 |
| 22 | | -1,6 | -2,88 | -4,48 | -3,84 | 12,8 |
| 23 | | -1,68 | -3,04 | -4,8 | -4,48 | 11,52 |
| 24 | | -1,76 | -3,2 | -5,12 | -5,12 | 10,24 |
| 25 | | -1,84 | -3,36 | -5,44 | -5,76 | 8,96 |
| 26 | | -1,92 | -3,52 | -5,76 | -6,4 | 7,68 |
| 27 | | -2 | -3,68 | -6,08 | -7,04 | 6,4 |
| 28 | | -2,08 | -3,84 | -6,4 | -7,68 | **5,12** |
| 29 | | -2,16 | -4 | -6,72 | -8,32 | 3,84 |
| 30 | | -2,24 | -4,16 | -7,04 | -8,96 | 2,56 |
| 31 | | -2,32 | -4,32 | -7,36 | -9,6 | 1,28 |
| 32 | | -2,4 | -4,48 | -7,68 | -10,24 | 0 |

FIG.14

| De Bruijn Sequence | [0 0 0 0 1 0 0 1 1 1 1 0 1 0 1 1][0 0 0 0 1 ... | |
|---|---|---|
| Erroneous Snapshot of 10 symbols | 0 1 0 1 0 0 1 1 1 1 | |
| Initial Symbol Index | Error Free Snapshot of 10 symbols | Hamming Distance |
| 1 | 0 0 0 0 1 0 0 1 1 1 | 4 |
| 2 | 0 0 0 1 0 0 1 1 1 1 | 1 |
| 3 | 0 0 1 0 0 1 1 1 1 0 | 5 |
| 4 | 0 1 0 0 1 1 1 1 0 1 | 4 |
| 5 | 1 0 0 1 1 1 1 0 1 0 | 6 |
| 6 | 0 0 1 1 1 1 0 1 0 1 | 6 |
| 7 | 0 1 1 1 1 0 1 0 1 1 | 3 |
| 8 | 1 1 1 1 0 1 0 1 1 0 | 5 |
| 9 | 1 1 1 0 1 0 1 1 0 0 | 6 |
| 10 | 1 1 0 1 0 1 1 0 0 0 | 5 |
| 11 | 0 1 0 1 1 0 0 0 0 1 | 10 |
| 12 | 1 0 1 1 0 0 0 0 1 0 | 4 |
| 13 | 0 1 0 1 1 0 0 0 0 1 | 6 |
| 14 | 1 0 1 1 0 0 0 0 1 0 | 5 |
| 15 | 0 1 1 0 0 0 0 1 0 0 | 4 |
| 16 | 1 1 0 0 0 0 1 0 0 1 | 6 |

METHOD FOR RESOLVING TIME AMBIGUITY, A RELATED SYSTEM, A RELATED TRANSMITTER AND A RELATED RECEIVER

TECHNICAL FIELD

Embodiments of the present invention relate to a method for resolving time ambiguity in a radio navigation system, a related system, transmitter and a related receiver.

BACKGROUND ART

Currently, in a radio navigation system, such as a Global Navigation Satellite System (GNSS) radio navigation system, comprising a plurality of radio transmitters, and at least one radio receiver where, at least one receiver is adapted to receive radio navigation signals transmitted by each of said plurality of transmitters, such received signals can be applied for localisation and synchronisation purposes.

Recent years have witnessed the emergence of a new type of localisation service (also called positioning service) and Timing service, resulting from the convergence of new trends. Firstly, the rapid development of terrestrial networks offering 10 to 1000 times more data throughput, especially with the up-coming fifth-Generation (5G) communication standard, has placed mobile devices, such as smartphones, as the main interface between users and their community or ecosystem. This change of perspective then relegates the former Position Navigation Devices (PND), or non-connected "GPS swatches" to a marginal role for the Mass-Market segment. Far to be "smartphone-centric", connected devices can comprise all kinds of "Things" which can ease the daily life, such as connected keys, household devices, etc. It is even noted that those "Things" do not have to directly interfere in the daily life of users, but can also embrace "Micro-things" (e.g. sensors such as "mote" or "smart dust") or "Macro-things" (e.g. drones) as part of a new and transparent layer at the service of each of us. Secondly, most of the projections agree for a massive growth of those connected objects which could yield to a huge increase of the overall power needed to feed all of those end-devices, if no counter-measure is proposed. This aspect is especially important at a period where the global warming and the non-renewability of raw materials such as fossil resources, cannot be ignored.

Hence, as a new category of positioning but also timing service shall emerge from those millions, if not billions, of connected "things" that will also need their coarse position and time in an absolute referential for most of them. It is also outlined that the driving Figure of Merit for this new type of applications is not the accurate or high accurate positioning and timing performance, since accuracy in the order of meters or even decimetres can already be achieved with other GNSS signals and augmentation services, but rather a fast provision of both time and position, preferably with a limited power need to get access to this information.

Faced with this evolution, such radio navigation systems, like for example Global Navigation Satellite Systems, may still play a role, as GNSS is able to provide the absolute time and position referential.

However, the current radio navigation signals of such existing systems such as for example a Global Navigation Satellite System (GNSS) system have not been designed and optimized to support the fast and sensitive synchronization of user devices, further referred to as radio receivers, between a first time scale, such as the GNSS time scale w.r.t. to the second time scale, such as for example time scale of the terrestrial network, the radio receiver e.g. the user device is connected with, or such as the local time scale generated by the receiver clock of such radio receiver. Indeed, it is outlined that due to the drift of the receiver clock the local time scale of the receiver can rapidly diverge from the first time scale, depending on the type local oscillator implemented in the receiver.

In the following, some mathematical descriptions are now presented to formalise the methods, as part of the background art, which are typically implemented in radio receivers e.g. user devices, to estimate their position and time. This description will especially familiarise the non-skilled person to state-of-the art methods used to derive the pseudo-range from received GNSS signals and from the content of the navigation message embedded in the GNSS signal, to state-of-the art methods used to estimate the position and time of radio receiver connected to a communication network as part of Assisted GNSS (A-GNSS), or to state-of-the art methods used to estimate the position and time based on a short portion of the signal, also called "snapshot" positioning. Some mathematical elements introduced in the description of these methods will also be used to support the description of the invention presented later in this application.

The description of those background art methods will make reference to the following publications:

[Ref 1]: "Using GNSS Raw Measurements On Android Devices (White Paper)" Raw Measurements Task Force. *European GSA.*

[Ref 2]: "A-GPS: Assisted GPS, GNSS, and SBAS. Frank Van Diggelen. GNSS Technology And Application Series. *Artech House.*

[Ref 3]: "Code Tracking Pseudoranges. How can pseudorange measurements be generated from code tracking?. ". M. Rao. G. Falo. InsideGNSS. January/February 2012.

[Ref 4]: "Estimation of Satellite-User Ranges Through GNSS Code Phase Measurements". *Marco Pini.*

[Ref 5]: "GPS Position Can Be Computed without the Navigation Data". N. Sirola. *ION GPS* 2002, 24-27 Sep. 2002. Portland.

The following presents the background-art method used to compute the pseudo-ranges based on the reception of the received signal and the modulated navigation message, as well as background-art method used to compute the position of the GNSS radio receiver based on the corresponding pseudo-ranges. A GNSS radio receiver needs to process at least four GNSS signals to retrieve its position and time. Here it is assumed that the receiver can demodulate the navigation message during tracking. It is recalled that four satellites are needed at minimum to ensure a solvable position equation accounting for the 3 coordinates (x, y, z) and the user receiver time offset, Δb. The Pseudo-Range, $\rho_i$, comprises two essential contributions: the "physical" range, $r_i$, between the satellite Sati and the user device, and an offset, Δb, which accounts for the clock alignment error between the user receiver and the GNSS time scale, as shown in the following equation, and where co designates the light velocity:

$$\rho_i = r_i + \Delta b / c_0 \quad \text{(eq. 1)}$$

The Pseudo-Range, $\rho_i$ is also defined as the difference between the time of transmission at satellite side, expressed in the GNSS time scale, and the time of reception at User Device side, expressed in the Receiver time scale:

$$\rho_i = (t_{rx,i}^{Rec} - t_{tx,i}^{GNSS})/c_0 \quad \text{(eq. 2)}$$

To derive the pseudo-range, currently existing radio satellite navigation signals comprise so-called Time-Markers which indicate when the signal left the satellite, at Time of Transmission (ToT). Such time markers may take different forms. For example, in case of GPS signals the time markers comprise a Telemetry Word (TLM) and a Handover World (HOW) containing the Time of Transmission (ToT). The TLM words are encoded in the legacy signals at positions distant of several seconds within the navigation message, which force the radio receiver, such as a user device, to process such signals over a longer time to retrieve those TLM words, which is not optimal to reduce the power consumption of such radio receiver such as the user device. The TLM shall be transmitted synchronously w.r.t. the GNSS time scale. The corresponding synchronous transmission is illustrated on the left part of FIG. 3. It is noted that due to the satellite clock offset, $\Delta b^{sat}$, perfect synchronization of the ToT is not achieved among satellites, but the User Device can correct the pseudo-range for this additional contribution based on a satellite clock correction model provided into the navigation message.

At least two main approaches exist to compute the pseudo-range with the "common reception time" on a one side, and with the "common transmission time" on the other side (see [Ref 1], [Ref 3] and [Ref 4]). Both are equivalent, and the one chosen for illustration is the "common reception time". It consists in computing all pseudo-ranges at the same epoch, denoted $t^{GNSS}_{rx,i}$ when expressed on the GNSS time scale, or denoted $t^{Rec}_{rx,i}$ when expressed on the receiver time scale. At reception, the corresponding TLM word will not be received at the same epoch due to the different distances between satellites and the User Device, which leads to different propagation times. This is illustrated on the right part of FIG. 3. To compute the pseudo-range $\rho_i$, the receiver "just needs" to wait for the reception of TLM word to demodulate it and to know when the signal was transmitted at epoch $t^{GNSS}_{ToT,i}$. By combining the fractional part within the spreading code at epoch, $t^{GNSS}_{rx,i}$ and the accumulated number of full spreading code periods (e.g. 1 ms for GPS C/A, 4 ms for Galileo E1-B/E1-C) between $t^{Rec}_{rx,i}$ (expressed on the receiver time scale) and the "reading" of the TLM, the receiver can access to the relative receive time offset, $\delta_i$, between satellite and user device. The transmission time at satellite i, is then given by:

$$t_{tx,i}^{GNSS} = t_{ToT,i}^{GNSS} + \delta_i \quad \text{(eq. 3)}$$

In order to build an absolute pseudo-range, it is necessary to generate the measured time $t^{Rec}_{rx,i}$. This one is calculated as the sum of the transmission time $t^{GNSS}_{tx,i}$ and an estimate of the distance between the satellite and the user, $\rho^{est}_i$. For both common transmission and reception time methods, it is usual to consider the first channel, among the four, which receives and demodulates at first the TLM, as reference for the construction of all other (e.g. three) pseudo-ranges.

For the first epoch (k=1) (i.e. at initialization), it is usual to set a coarse value for $\rho^{est}_1[1]=\rho_1$. $\rho_1$ is set to the minimal travel time between satellite and user: ~65 ms and ~85 ms for GPS and ~77 ms to ~96 ms for Galileo.

$$t_{rx,1}^{Rec}[1] = t_{tx,1}^{GNSS}[1] + \rho_1^{est}[1] = t_{tx,1}^{GNSS}[1] + \rho_1 \quad \text{(eq. 4)}$$

For the following epochs (k>1), $\rho^{est}_1[k]$ is based on the last estimation of the satellite-to-user distance, $r^{est}_i[k-1]$ based on information provided from the demodulated navigation message and the estimated user position ($x_{est}$, $y_{est}$, $z_{est}$): $\rho^{est}_1[k]=r^{est}_1[k-1]$.

$$t_{rx,1}^{Rec}[k] = t_{tx,1}^{GNSS}[k] + \rho^{est1}[k] = t_{tx,1}^{GNSS}[k] + r_1^{est}[k-1] \quad \text{(eq. 5)}$$

Finally, the time of reception in both the GNSS and receiver time scales, can be expressed based on the receiver clock offset, $\Delta b$. In the following description, the epoch index [k] will be omitted to ease description.

$$t_{rx,i}^{GNSS} = t_{rx,i}^{Rec} - \Delta b \quad \text{(eq. 6)}$$

It is then possible to build the absolute pseudo-ranges, for all four satellites by re-using equations (eq. 2), (eq. 4) and (eq. 6) as follows:

$$\rho_i = (t_{rx,i}^{GNSS} + \Delta b - t_{ToT,i}^{GNSS} - \delta_i)/c \;\; i \in [1,4] \quad \text{(eq. 7)}$$

Once the pseudo-ranges $\rho_i$ are available for the N (N≥4) lines of sight, the absolute position solution $x_{est}$, $y_{est}$, $z_{est}$ is obtained from the linearization of the pseudo-range equation as follows:

$$\delta\rho_i = -\underline{e}_i \times [\delta x_{est}, \delta y_{est}, \delta z_{est}] + \delta\Delta b + \varepsilon_i \quad \text{(eq. 8)}$$

Herein:

$e_i$: represents the normalised vector joining the user device position and the satellite i position.

$\delta_x=[\delta x_{est}, \delta y_{est}, \delta z_{est}]$ is the vector of differential for the three estimated coordinates such as $x_{est}=x_0+\delta x_{est}$, $y_{est}=y_0+\delta y_{est}$ and $z_{est}=z_0+\delta z_{est}$, and $[x_0,y_0,z_0]$ is the reference position used for the linearization, which can be either a coarse position estimate at initialisation of the position filter, or the last state of the estimated position in an iterative solution. The reference position enables to express the absolute position solution $[x_{est}, y_{est}, z_{est}]$ based on the relative position solution $[\delta x_{est}, \delta y_{est}, \delta z_{est}]$.

$\delta\Delta b$ represents similarly the residual for clock bias estimate.

$\varepsilon_i$ represents the additive measurement noise to the pseudo-range.

The relative position solution for $\delta\underline{X}^{ext}=[\delta\underline{X}, \delta\Delta b]=[\delta x_{est}, \delta y_{est}, \delta z_{est}, \delta\Delta b]$ at each iteration is then given by the following equation (from [Ref 2]).

$$\delta\underline{X}^{ext} = (\underline{\underline{H}}^T\underline{\underline{H}})^{-1}\underline{\underline{H}}^T\delta\underline{\rho} \quad \text{(eq. 9)}$$

Herein:

$\delta\underline{\rho}$ is a vector of N residual pseudo-ranges as per (eq. 8)

$\underline{\underline{H}}$ is the so-called design matrix constituted of N raws of the form $[-\underline{e}_i\ 1]$.

The following presents the background-art method used to compute the pseudo-ranges in an Assisted-GNSS context. Many radio receivers are connected to terrestrial communication networks that offer important a-priori and information regarding both user positions and time, referenced to the second time scale such as the receiver time scale. This feature represents an opportunity to accelerate the provision of the exact position and time, referenced to the first time scale e.g. the GNSS time scale, to the final users, or related applications. Such scenarios, called Assisted GNSS (A-GNSS), differ from standalone GNSS by the fact that the receiver does not have access to the navigation data modulated in the GNSS signal. It only tracks the GNSS signals to derive pseudo-ranges. It means that the user device does not anymore have access neither to the satellite Clock and Ephemeris Data (CED) usually modulated in the navigation message, nor to the TLM and HOW which marks the transmission time of the navigation signal.

To palliate to this lack of information, a communication network will provide part of those information such as the Clock and Ephemeris Data, but will not be able to provide all necessary information such as the TLM and HOW. It is further outlined that other type of information can also be given to the connected devices such as its coarse position (for example using the cellular cell dimension and position), or any other kind of data which can ease signal acquisition, tracking or pseudo-range calculation. When such information is communicated to the connected device, Assisted GNSS is usually meant.

It is noted that both the satellite position and clock offset are calculated at a time of transmission, $t^{Ntx}_{ToT,i}$, which is expressed w.r.t. the time scale of receiver, potentially connected to a network. This one can however differ with few milliseconds from the GNSS time scale, in which case "fine time assistance" is considered. It can also differ from several hundreds of millisecond up to few seconds, in which case "coarse time" assistance is considered. In the following, the time offset, or synchronization error, between the receiver and the GNSS time scale, will be called $\Delta T$, which can also be expressed as $\Delta T=2\times\Delta T_{max}$. A typical value of $\Delta T$, for coarse time scale is $\pm 2$s, in which case $\Delta T_{max}=2$s.

The first implications of A-GNSS onto the pseudo-range calculations can be deduced:

- First, since the user device does not demodulate the TLM and HOW, this information necessary in the pseudo-range construction (see (eq. 7)) is not available anymore, and needs to be communicated in some form by another mean.
- Secondly because no time markers exist, it is not possible to count the number of full code periods, completed with the fractional part, between the TLM and the time of reception $t^{Rec}_{rx,i}$ to deduce the time offsets, $\delta_i$. As a consequence, the relative time offsets between the different received signals, $\delta_i$, cannot be calculated any more.
- Finally due to the offset $\Delta T$, the position and clock offsets of the satellites, calculated with models for the Clock and Ephemeris Data provided by the network can differ with several hundreds of meters or even kilometres for large $\Delta T$ values. As an example, considering a maximal range rate of 800 m/s for the GPS orbit (resp. 900 m/s for Galileo orbit) yields 1.6 km (resp. 1.8 km), (see [Ref 2]). The mathematical formalism which can express those magnitudes for the pseudo-range error is described hereafter in this section. Such an error of the satellite position at time of transmission will undeniably propagate into the position and yield to a same order of magnitude for the user device position error, if no mitigation is taken.

In [Ref 2], it is shown how pseudo-ranges and especially pseudo-ranges residuals are calculated in the specific case of A-GNSS. In absence of TLM information the pseudo-range residuals are given by the following equation:

$$\delta\rho_i = \rho_i^{meas} - \rho_i^{pred} \qquad \text{(eq. 10)}$$

Herein:

- $\rho^{meas}_i$ represents the measured pseudo-range which in the case of A-GNSS reduces to the fractional part of a primary code, according to [Ref 2]: "the measured pseudo-ranges will be sub-millisecond values (that is, between 0 and almost 300 km) because the receiver will have measured only the C/A code-phase offset and not yet have detected the data bit edges or decoded the HOW."
- $\rho^{pred}_i$ represents the predicted pseudo-range. This one is constructed as follows:

$$\rho_i^{pred}\left(t_{ToT,i}^{GNSS,est}\right) = \left|X^{sati}\left(t_{Tot,i}^{GNSS,est}\right) - X^{UD}\left(t_{ToT,i}^{GNSS,est}\right)\right| - \Delta b^{Sat}\left(t_{ToT,i}^{GNSS,est}\right) - \Delta b^{Pred} \qquad \text{(eq. 11)}$$

Herein:

- $X^{UD}(t^{GNSS,est}_{ToT,i})$ represents the coarse position of the user device available to the user (potentially provided by a network to the user device), again at the estimated time of transmission $t^{GNSS,est}_{ToT,i}$
- $\Delta b^{Sat}(t^{GNSS,est}_{ToT,i})$ represents the satellite clock bias offset again calculated at the estimated time of transmission $t^{GNSS,est}_{ToT,i}$ and is provided by a network to the user device.
- $\Delta b^{Pred}$ represents a coarse estimation of the receiver clock bias.
- $X^{sat}(t^{GNSS,est}_{ToT,i})$ represents the position of the satellite i (provided by a network to the user device) at the estimated time of transmission $t^{GNSS,est}_{ToT,i}$. It is already outlined that $t^{GNSS,est}_{ToT,i}$ might differ from the actual time of transmission $t^{GNSS}_{ToT,i}$ as a consequence of time synchronization error, $\Delta T$, of the receiver w.r.t. GNSS time scale.

This error $\Delta T$ can lead to few kilometres of error in the satellite position which is now demonstrated. In [Ref 2], it is shown that the synchronization error $\Delta T$ creates an additional error in the residual pseudo-range, (eq. 10), when compared to the ideal case when $\Delta T=0$. This additional pseudo-range error is proportional to radial velocity, or pseudo-range rate, $v^1$ as expressed by the following equation.

$$\rho_i^{pred}\left(t_{ToT,i}^{GNSS,est}\right) - \rho_i^{pred}\left(t_{ToT,i}^{GNSS}\right) = -v^i \cdot \Delta T \qquad \text{(eq. 12)}$$

The right part of FIG. 4 shows that this additional contribution to the pseudo-range is not identical for all line of sights. Contrarily to a receiver clock bias, which is common to all pseudo-ranges, this non-common contribution will lead to a position error which can reach several hundreds of kilometres, for a second-level synchronization error.

In order to cope with this situation it is proposed to introduce another variable, $\Delta T$, in the extended state vector beside the user position and clock offset: $\delta\underline{X}^{ext}=[\delta\underline{X}, \delta\Delta b]=[\delta x_{est}, \delta y_{est}, \delta z_{est}, \delta\Delta b, \Delta T]$. The objective is then to estimate the synchronization between receiver time, potentially synchronised to a network time or another local time scale, and the GNSS time scale. Different algorithms exist to solve this extended state vector, such as [Ref 2] and [Ref 5]. To estimate the 5 unknowns as part of the extended state vector $\delta\underline{X}^{ext}$, these algorithms propose to include a $5^{th}$ pseudo-range in order to produce a determined system of equations. This$5^{th}$ pseudo-range derived from a $5^{th}$ Line of Sight is also illustrated on FIG. 4 (compared to FIG. 3 showing only four pseudo-ranges).

The following presents the background-art for position methods based on a snapshot of the navigation signal, also called "snapshot positioning". Snapshot positioning is firstly introduced in an A-GNSS context. A-GNSS positioning does not only apply for receivers which continuously track satellite navigation signals. Another important sub-category of A-GNSS application covers the so-called snapshot positioning. Here the receiver "punctures" only a portion of the received signal, also called "signal snapshot", whose duration can comprise few milliseconds to few seconds (e.g. 1 or 2 seconds). Several designations exist for this kind of position applications, with "Snapshot positioning", "Instant positioning" or "Single Shot positioning". The short duration of the snapshot signal implicates that it is not possible to retrieve and demodulate neither the satellite Clock and Ephemeris Data (CED), nor the TLM word. As for A-GNSS, the corresponding CED information can be provided by the terrestrial communication network or any other communication channel.

It is noted that if the CED information, that have been retrieved from the satellite navigation signal in the past (e.g. several minutes before or even hours), are still valid or applicable, it is also possible to apply them to the pseudo-range derived from the snapshot. In that case, the snapshot positioning is no more assisted but standalone.

For both A-GNSS and standalone snapshot positioning cases, the main issue is therefore related to the absence of time synchronization information from the TLM word which is not part of the signal snapshot. In order to solve this issue, solutions such as the "millisecond integer ambiguity", mainly encountered in the literature dedicated to A-GNSS/A-GPS are proposed. "Millisecond Integer Ambiguity" is related to the fact that the measured pseudo-range, $\rho^{meas}i$, is not an absolute pseudo-range as in the conventional standalone positioning, but only a fraction of the code period (in case of the GPS C/A one code period is 1 ms), while the integer number of code period is not part of the measured pseudo-range. This absence of absolute reference yields to multiple solutions, sub-optima, of the system of equations, among which only one is the correct optimum. Different solutions exist to solve the corresponding millisecond ambiguity, which is close from the integer ambiguity issue met for carrier-positioning. For example, in [Ref 5] another application of the "Lambda method" is proposed. It is finally noted that the "Millisecond Integer Ambiguity" method and the methods based on the $5^{th}$ unknown previously presented also share some commonalities in the sense that they are based on the exploitation of more than 1 (at least 5) different Lines-of-sight in order to ensure pseudo-range ambiguity resolution.

To conclude, for A-GNSS positioning and snapshot positioning the following main degradation factors can be identified, when compared to conventional standalone positioning:

- The impact of the synchronization error, $\Delta T$, can yield to several hundreds of meters or few kilometres of satellite position error. This motivates to introduce a new variable, i.e. a $5^{th}$ unknown, to be estimated $\Delta T$, beside the user position and clock offset, in order to "remove" this additional degradation.
- The introduction of a $5^{th}$ variable asks for a $5^{th}$ pseudo-range, i.e. Line of Sight which can impact the availability and accuracy performances, especially in urban environment where satellite visible is poorer. The "Millisecond Ambiguity" (closely related to methods exploiting the $5^{th}$ unknown) which requires additional mitigation techniques, to solve the correct absolute optimum.

Hence, a typical use case of such radio navigation system is in case of a Global Navigation satellite system that the satellite clock and orbit correction models applied to the estimated Satellite-to-User Device pseudo-range are provided to a radio receiver via the terrestrial communication network as in an A-GNSS context. As explained before, one of the main issues identified for a seamless synergy between the processing of the radio signals and the aforementioned network information is that the corresponding models are applicable at a time epoch "$t^{Rx}$", referenced w.r.t. the second time scale, i.e. the receiver time scale (potentially synchronised with a terrestrial network time scale) which can differ with several seconds w.r.t. the actual time epoch "$t^{gnss}$" referenced w.r.t. the first time scale, i.e. the GNSS time scale. It was previously shown that the corresponding deviation can then have significant, if not detrimental, impact onto the positioning solution, derived with wrongly corrected pseudo-ranges. Therefore, there is a strong demand to solve the time synchronization between the first time scale, i.e. the GNSS time scale and the second time scale, i.e. the user device time scale, with the objective to compute pseudo-range based on the information provided by the communication network (e.g. CED), in a consistent way with the receiver-satellite range observations, and this with the shortest duration of the signal snapshot in order to support applications where the power consumption of the receiver has to be as low as possible. Furthermore, this property has to be achieved for long symbol duration in order to support high sensitivity applications.

The problem of such navigation systems and related radio receivers hence is that radio receivers applying snapshot positioning being subject to a second time scale, show a large synchronization error with respect to the first time scale such as the GNSS time scale.

Another shortcoming of the current radio signals e.g. GNSS signals is the ability to achieve this synchronization with the shortest portion of the radio signals to reduce the number of operations, again with the aim to lower the power consumption of the radio receiver; but maintaining a long symbol time to not lose sensitivity.

PELLICCIONI GIOVANNI ET AL: "DE BRUIJN SEQUENCES AS SPREADING CODES IN EXTREME DOPPLER CONDITIONS: ANALYSIS AND RESULTS", further discloses Spread spectrum techniques, originally conceived to counteract the effects of noise and interference, have enabled the development of advanced mobile, multiple user, and satellite-based solutions, that are nowadays among the most prevalent and widespread communication technologies and further provides a preliminary performance analysis of Direct Sequence Spread Spectrum signals, obtained through the use of innovative binary spreading sequences, the De Bruijn ones, in a scenario of large Doppler shift, and relative changing rate, as a result of the possibly high varying velocity of an aircraft, and worst-case condition of missing frequency offset estimation capability onboard. The results show that the use of binary De Bruijn sequences may improve signal recovery at the receiver, even in the presence of large distortions due to uncompensated Doppler effects. US 2016/161614 A1 discloses a pseudorange determinator for providing a pseudorange information representing an estimate of a distance between a transmitter and a receiver on the basis of a modulated signal having a sequence of symbols, wherein a primary code sequence is modulated in accordance with a secondary code sequence is configured to step-wisely correlate a portion of a received signal having at least two symbols with at least two reference sequences, a first reference sequence representing at least two subsequent symbols having same phases and a second reference sequence representing at least two subsequent symbols having different phases, to step-wisely acquire, in dependence on a result of the correlations, a portion of the secondary code sequence. The pseudorange determinator is configured to provide the pseudorange information on the basis of an acquisition of a meaningful portion of the secondary code sequence.

WALLNER STEFAN ET AL: "NOVEL CONCEPTS ON GNSS SIGNAL DESIGN SERVING EMERGING GNSS USER CATEGORIES: QUASI-PILOT SIGNAL" discloses possible concepts identified in the frame of Galileo Evolution activities referred to as Quasi-Pilot (QP) signal that are designed to also comply with the needs of IoT devices wherein the main driver for the design of a QP signal is the reduction of the acquisition complexity, enabling a rapid and robust time ambiguity resolution together with the possibility of enabling a long coherent integration to achieve sufficient sensitivity in challenging environment if needed. In addition a QP signal design should enable a hand-over to existing legacy signals for the user to exploit also the high accuracy capabilities.

DISCLOSURE OF THE INVENTION

An object of embodiments of the present invention is to provide a method for time ambiguity resolution device in a radio navigation system, a related system, radio transmitter and radio receiver of such a radio navigation system of the above known type but wherein the aforementioned shortcoming or drawbacks of the known solutions are alleviated or overcome. Particularly, it is an object to provide with such method, system and related radio receiver applying snapshot positioning, when being subject to a second time scale overcoming a synchronization error with respect to the first time scale.

Indeed this objective is achieved by first generating, by said radio transmitter an overlay sequence comprising a set of symbols per time ambiguity interval where said set of symbols having a predetermined length said overlay sequence satisfying a condition of single occurrence of a subset of symbols within said set of symbols of said time ambiguity interval, each said time ambiguity interval comprising an implicit time marker and subsequently transmitting said radio signal, by said radio transmitter to said radio receiver, said radio signal comprising said overlay sequence modulated onto a carrier of said radio signal and at receipt of the said radio signal by said radio receiver, capturing a snapshot of said radio signal by said radio receiver where said snapshot comprising a subset of N symbols of said set of symbols of said overlay sequence within the time ambiguity interval of said radio signal and subsequently the snapshot is processed by said radio receiver to retrieve the values of the N symbols of said overlay sequence and to determine a relative position of said implicit time marker of said radio signal expressed in the first time scale based on the position of said subset of symbols included in said snapshot within said set of symbols of said time ambiguity interval and subsequently the receiver determines the time ambiguity between the first time scale and the second time scale by evaluating the delay between said implicit time marker obtained from the processing of the said snapshot and the implicit time marker within the overlay sequence generated based on the second time scale and wherein said overlay sequence consists of a M-ary sequence which is based on M-ary De Bruijn sequence. The generic process for the proposed method is illustrated on FIG. 5.

An overlay sequence based on a M-ary sequences means that the overlay sequence can comprise either a De Bruijn Sequence, or a truncated De Bruijn sequence, or an integrated De Bruijn sequence, or a combination of two or more De Bruijn sequences and/or Truncated sequences and/or Integrated De Bruijn sequences that is modulated onto a carrier of said radio signal.

In case the overlay sequence comprises a combination of V De Bruijn sequences and/or Truncated sequences and/or Integrated De Bruijn sequences, then the predetermined number of symbols, L, corresponds to the symbol periodicity, expressed in unit of symbols of the aggregate overlay sequence obtained through the said combination of V constitutive sequences. If the V constitutive sequences comprise binary symbols, the aggregated overlay sequence obtained per combination comprises M-ary symbols where $M=2\times V$. Furthermore, the number of symbols N of the said subset of symbols of said aggregate overlay sequence and comprised in the snapshot is such that it fulfils the Single Occurrence property SO(L,N), and also ensures the maximisation of the ratio L/N. Those definitions of the parameters L and N apply when the symbol duration, $T_s$, expressed in unit of time, is identical for the said V different constitutive sequences that are combined to form the aggregate overlay sequence. In case the corresponding symbol durations would differ among the said V different constitutive sequences that are combined to form the aggregate overlay sequence, then the definition of the periodicity of the aggregated overlay sequence can be extended when defining the symbol duration of the aggregate overlay sequence as the largest common divisor of the symbol durations of the V constitutive sequences. The periodicity L, of the aggregated overlay sequence shall then be expressed in symbols whose duration $T_s$ has just been defined. With this extended definition of the aggregate overlay sequence L applicable when the symbol duration differ among the different constitutive sequences, the snapshot duration will again comprise N symbols of the aggregate overlay sequence, fulfilling the SO(L,N) property on a one side, and ensuring the maximisation of the ratio L/N on the other side.

Moreover, applying an overlay sequence based on a M-ary De Bruijn sequence guarantees an even more advantageous single occurrence characteristic of a subset within the overlay sequence as it is further recognized that a fast time provision or synchronization, based on the shortest duration of signal snapshot leads to a lower power consumption of the user device for the signal snapshot processing. Therefore on additional design constraint is that the ratio between the overlay sequence and the snapshot duration which is proportional to L/N has to be as large as possible. This property ensures the most efficient snapshot length for a given Time Ambiguity Interval. In order to reach this further objective the overlay sequence modulated onto said radio signal is based on a De Bruijn overlay sequence.

In the following it is considered that the acquisition of the primary codes has already been achieved, and that the Embodiments of the present invention are independent from the type of acquisition scheme. Furthermore, the processing steps of the present invention assume that Code delay and Doppler offset obtained from the acquisition step are known with an accuracy sufficient to not degrade performance of those further processing steps.

The radio receiver may be implemented by any kind of radio receiver; is not limited to receivers that retrieves the binary values for the N symbols by implementing a Phase Locked Loop (PLL) but may also retrieve the values by exploiting the relative phase changes (i.e., by implementing a Frequency Locked Loop—FLL). The exact detailed implementation of both PLL and FLL techniques and any other type of demodulation technique used to retrieve the corresponding overlay sequence of M-ary symbols is assumed to be known for the skilled person.

The required duration of the signal snapshot comprising N symbols needed to retrieve the value of the N overlay symbols will exceed the exact duration of the N symbols, i.e. N times the symbol duration, by a small fraction of the whole snapshot duration, comprising one time-guard located on each side of the signal snapshot. The combined duration of those time guards depends on the exact symbol retrieval process, and other configuration parameters such as the Signal-to-Noise Power Spectral Density Ratio (C/No), and the duration of this additional snapshot portion is usually much smaller than the exact duration for the N symbols. Therefore, in the following the signal snapshot duration will be abusively identified to the duration for the N symbols, but the signal snapshot duration shall be interpreted as the sum of the duration for the N symbols and the additional duration for both time guards. Some numerical examples providing concrete orders of magnitudes for the corresponding snapshot and time guard duration will be provided later in the section presenting the modes for carrying out the invention.

In this way, the correct position of the implicit time marker in the time ambiguity interval, relative to the snapshot position, can be determined based on the single information contained in the snapshot of the radio signal, where the snapshot comprises a subset of N symbols of the overlay sequence. Based on the information derived from the radio signal, i.e. a subset of N symbols, the position of the snapshot relative to the time ambiguity interval can be determined. Based on the position of the snapshot within the time ambiguity interval, the position of the implicit time marker can be deduced which information may be used for synchronization between said first and said second time scale.

It is further to be noted that the position of the implicit time marker is also known in a relative time frame of the received signal. The overlay sequence comprises a set of L symbols per time ambiguity interval where each said time ambiguity interval comprises an implicit time marker. The position of the implicit time marker within the time ambiguity interval is known (per convention) and may be for example the first symbol of the sequence.

Hence the derivation of the implicit time marker, based on the information contained in a short snapshot of this received signal enables to perform a time transfer to synchronize the second time scale of the user device to the first time scale, i.e. the absolute GNSS time scale of the radio transmitter.

The set of symbols of the overlay sequence consists of a predetermined number L of symbols where a snapshot of the signal consists of a number of symbols N where N is smaller than L. L can also be understood as the periodicity, expressed in unit of overlay sequence symbol, of the overlay sequence.

The derivation and processing of the implicit time-marker information represents an alternative to the existing solutions such as the "$5^{th}$ Unknown" or the "millisecond integer ambiguity" techniques evoked earlier in an A-GNSS/A-GPS context. When compared to the "$5^{th}$ Unknown", it enables to avoid "sacrificing" one Line-of-sight and thus improves availability, as the required information is a native part of each signal.

Such time marker indicates the time of transmission of the signal and may be implemented differently in different kind of systems. In a global positioning system (GPS) the (explicit) time marker comprises a TLM word that explicitly codes the Transmit Time, while in embodiments of the proposed solution the time marker word is implicit, since it corresponds per convention to the beginning of the overlay sequence ($1^{st}$ symbol). It is however noted that the convention for the position of the implicit time marker can be defined at another place within the sequence, for example the last symbol, as long as this convention is known by both transmitter and receiver sides.

Furthermore, in case of (legacy) Global Navigation satellite system, the TLM word is an absolute time reference ("time scale") of the GNSS: it provides the complete date within the week: $3^{rd}$ day, $7^{th}$ hour, 36',40" . . . since the last Saturday midnight (Saturday 24:00 is the reference time of the TLM each week-)+The Week Number, while in embodiments of the proposed solution the processing of the subset of symbols will acquaint about the relative position w.r.t. the beginning of the sequence, represented by the implicit time marker. Therefore only a relative time within time ambiguity interval having duration equal to the overlay sequence duration is provided. Nevertheless, some embodiments propose extending the duration of the time ambiguity interval to values much beyond the minute or even the hours either with an appropriate choice of the parameters N and L when considering an overlay sequence based on a single De Bruijn sequence, or by considering an overlay sequence based on the combining of several De Bruijn sequences.

In the former disclosure, it is considered that the first time scale is shared within a Global Navigation Satellite System, transmitting signals to a device embedding a GNSS receiver and which is synchronized to its second time scale. Alternative applications can however also be identified, where the first time scale is shared by a space-based communication network, or by a terrestrial communication network or system transmitting signal via a base station or beacons, or where the first time scale is shared by another connected device, for example in a "machine-to-machine" communication link, such as Vehicle-to-Vehicle (V2V), Vehicle to Everything (V2X), or Device-to-Device (D2D). In that later case, the second "Slaved" device will synchronize to the first "Master" device thanks to the proposed method.

Such radio navigation system may comprise a plurality of transmitters having a first time scale meaning that such transmitter of the plurality of transmitters deals with a time scale that is global over this plurality of transmitters. For sake of easing the understanding it is considered that the transmitters are perfectly synchronized to the global time scale or that models, such as a clock correction models, enable to estimate with sufficient accuracy the time scales of the plurality of transmitters w.r.t. the global time scale. In the case of GNSS, satellite clock correction models enable to align each local time scale of the satellites to the global time scale, i.e. the GNSS time scale. Hence this first, global, time scale is different and remote from the second time scale dealt with by the radio receiver that communicates with other systems where the second time scale is applied.

It is further recognized that a fast time provision or synchronization, based on the shortest duration of signal snapshot leads to lower power consumption of the user device and required for the processing of the signal snapshot. Therefore on additional design constraint is that the ratio between the overlay sequence and the snapshot duration which is proportional to L/N has to be as large as possible. This property ensures the most efficient snapshot length for a given Time Ambiguity Interval. In order to reach this further objective the overlay sequence modulated onto said radio signal is based on a De Bruijn overlay sequence

[Ref 6]*: "Generalizing the classic Greeding and Nicklace Constructions for De Bruijn and Universal Cycles"*. Joe Sawada, Aaron Williams and Dennis Wong.

[Ref 7]*: "A problem in arrangements"*. M. H. Martin. *Bulletin of the American Mathematical Society,* 40:859-864, 1934.

The object is to offer sufficient information within the snapshot which enables to position the snapshot w.r.t. the implicit time marker within the time ambiguity interval. For this purpose, a particular type of overlay sequences, called "De Bruijn" sequences is applied. Such "De Bruijn" sequences guarantee the single occurrence of any sub-sequence of length N within the overlay sequence of length L (including on the boarders). This property, satisfied by the "De Bruijn" sequences is called Single Occurrence of N within L symbols or the SO(N, L) Property. Such "De Bruijn" sequences may, but does not essentially comprise binary symbols. Alternatively, other M-ary sequences may be applied for implementing a De Bruijn sequence. For example, when considering a quaternary alphabet containing the symbols 0, 1, 2 and 3, then a '003' and '213' represent two examples of quaternary sequences of length 3. The definition of a De Bruijn M-ary sequence can be found in [Ref 6], "Let T(n; k) be the set of k-ary strings of length n. For example, T(2; 3)={11; 12; 13; 21; 22; 23; 31; 32; 33}. A De Bruijn sequence for T(n; k) is a sequence of length $k^n$ that contains each string in T(n; k) exactly once as a substring when the sequence is viewed circularly". Denoting by B(k, N) a De Bruijn sequence of length $k^N$, the number of distinct De Bruijn sequences B(k,N) is equal to k^(k^(N−1)−N). A particular case of De Bruijn sequence comprises binary symbols, in which case the "De Bruijn" sequence is called binary "De Bruijn" sequence. Binary "De Bruijn" sequences, are such that L=2^N, and that the number of "De Bruijn" binary sequences satisfying the SO(N,L) property equals 2^(2^(N−1)−N) (see [Ref 6]).

Furthermore, "De Bruijn" sequences also satisfy the cyclic property which guarantees that even sub-sequences of length N which are built by concatenating the k (k<N) last symbols of the sequence with the first [N-k]symbols, do appear only once within the full "De Bruijn" sequence. One important property of the "De Bruijn" sequence is the large (L/N)=(2^N/N) ratio which represents a strong advantage for snapshot positioning. Indeed, it means that for a small number N of symbols (i.e. short snapshot duration), the overlay sequence length (i.e. the time ambiguity interval) can be large. Some examples of De Bruijn sequences for different values of the length L are given in the table shown in FIG. 7 for illustration.

Different methods enable to generate De Bruijn sequences. The purpose of the invention is not to perform a detailed review of all references describing the way to generate such "De Bruijn" sequence, but rather to make use of such "De Bruijn" sequence, and especially to generate a large pool of candidate "De Bruijn" sequence among the k^(k^(N−1)−N) existing k-ary B(k,N) "De Bruijn" sequences, out-of-which specific "De Bruijn" sequences offering particular properties advantageous for the Time Ambiguity Resolution will be selected. As an example, an siting [Ref 6], "Martin showed that a de Bruijn sequence for T(n; k) can be constructed by a simple greedy algorithm in 1934 [Ref 7]. The algorithm starts with sequence $k^{n-1}$ (where exponentiation denotes repetition) and then repeatedly applies the following rule: Append the smallest symbol in {1; 2; . . . ; k} so that substrings of length n in the resulting linear sequence are distinct.".

As a consequence of the SO(N,L) property satisfied by the "De Bruijn" sequences, the position of this unique sequence of symbols within an interval of the radio signal such as a GNSS signal or alternatively, any kind of Terrestrial signal can be determined unambiguously and based on the position of this unique sequence, the (relative) distance between the position of the unique sequence of N symbols included in the snapshot and the position of the implicit time marker can be determined accurately. Furthermore, the SO(N,L) property achieved by the "De Bruijn" offers the most optimised ratio between snapshot duration and Time Ambiguity Interval and therefore the most efficient in term of power consumption for the user device.

A further relevant embodiment of the present invention is that the Sequence generation means of the radio transmitter further is configured to generate a plurality of overlay sequences which are different from each other, said overlay sequences may be modulated each on a different primary code or chip stream which is multiplexed on the same carrier signal.

The advantage of this further embodiment is to allow extending the Time Ambiguity Interval by a join processing at the receiver side of the plurality of the overlay sequences.

In the special case where said plurality of overlay sequences at least consists of a first non-truncated M-ary de Bruijn overlay sequence and at least one second truncated M-ary De Bruijn overlay sequence, it is guaranteed that thanks to the difference of overlay sequence lengths, the corresponding snapshot does not occur more than once within an "implicit" aggregate overlay sequence having a length obtained by combining the lengths of the non-truncated and the subsequent truncated sequences. This aggregate overlay sequence length corresponds then to an extended ambiguity period.

Each of the plurality of overlay sequences can be modulated on a dedicated signal component following the same approach as the modulation of a single overlay sequence on its dedicated signal component.

Still a further embodiment of the present invention is that said subset of symbols included in said snapshot is extended with an additional (adjacent or a non-adjacent) subset of symbols of said overlay sequence where said additional subset comprising $N_{Ext}$ symbols, said extended subset of symbols comprising $P=N+N_{Ext}$ symbols.

In other words, the subset of symbols included in said snapshot is an extended subset of symbols comprising said subset of symbols of said set of said symbols of said time ambiguity interval comprising N symbols and additionally a second subset of symbols comprising $N_{Ext}$ symbols which can be adjacent to the first subset of symbols of N symbols or can be distant with Q symbols w.r.t. the subset of symbols of N symbols where the processing means (23) is configured to calculate a Hamming distance between said extended subset of symbols included in said snapshot and each of L possible sub-sequences of said overlay sequence comprising $P=N+N_{Ext}$ symbols (being the same length as said extended subset of symbols included in said snapshot) within the overlay sequence and further detect an error in said extended subset of symbols if the minimum value over all L Hamming distances calculated between said extended subset of symbols included in said snapshot, and each sub-sequence of said overlay sequence comprising $P=N+N_{Ext}$ symbols, is non-zero or is zero and occurs more than once, and finally the processing means (23), further is configured to determine said relative position of said implicit time marker of said radio signal based on said extended subset of symbols included in said snapshot, if said minimum value over all Hamming distances calculated between said extended subset of symbols included in said snapshot, and each sub-sequence of said overlay sequence comprising $P=N+N_{Ext}$ symbols, is zero and occurs once.

The position of the extended subset of symbols which enables to resolve time ambiguity corresponds to the position of the sub-sequence of said overlay sequence comprising $P=N+N_{Ext}$ symbols yielding to a zero Hamming distance with the extended subset of symbols.

It is further outlined that in case the minimum value over all L Hamming distances calculated between said extended subset of symbols included in said snapshot, and each sub-sequence of said overlay sequence comprising $P=N+N_{Ext}$ symbols, is zero and occurs once, then it can be guaranteed that the extended subset symbols included in said snapshot does not contains less (or equal) than $N_{err,max}$ demodulation errors with a 100% confidence level.

Moreover, the predetermined minimum value, $N_{err,max}$, is deduced from an iterative process for the selection of the Overlay De-Bruijn Sequence supporting the error detection of at most $N_{err,max}$ errors and which ensures that any extended sub-set of P symbols within the Overlay De-Bruijn sequence and contaminated by up to $N_{err}$ errors, $N_{err} \leq N_{err,max}$, located randomly within the P symbols, does not occur only once within the Overlay De-Bruijn Sequence, free of errors.

Still a further embodiment of the present invention is that said processing means (23) further is configured to correct an error if the minimal a value over all Hamming distances calculated between said extended subset of symbols included in said snapshot, and each sub-sequence of said overlay sequence comprising $P=N+N_{Ext}$ symbols, does not exceed a second predetermined minimum value, $\lfloor N_{err,max}/2 \rfloor$, depending on the selected Overlay Sequence, in which case the receiver will select the sub-sequence of said overlay sequence comprising $P=N+N_{Ext}$ symbols yielding to the minimal Hamming distance, and correct up to $\lfloor N_{err,max}/2 \rfloor$symbols which differ between the said sub-sequence of said overlay sequence comprising $P=N+N_{Ext}$ symbols and the said extended subset of symbols included in said snapshot. In this embodiment $\lfloor x \rfloor$ refers the lower integer part of the value x.

A still further embodiment of the present invention is that said reception means of the Radio receiver RX1 further is configured to receive a first radio signal from a first radio transmitter and at least a second radio signal from a second radio transmitter, said first radio signal comprising an overlay sequence with length of L symbols and at least said second radio signal having a length of L1 symbols, where said first and said at least said second overlay sequences are different; and the reception means, subsequently combines said overlay sequence of said first radio signal and said overlay sequence of at least said second radio signal in an aggregate overlay sequence. The snapshot capture means captures a snapshot of said aggregate overlay sequence of said first radio signal and at least said second radio signal, said snapshot comprising a subset of symbols of said aggregate overlay sequence.

Subsequently, the processing means is able to determine a relative position of said implicit time marker of said radio signal based on the position of said subset of symbols of said aggregate overlay sequence included in said snapshot comprising N symbols where after said processing means further is able to resolve said time ambiguity between said first time scale and said second time scale by evaluating said delay between said implicit time marker expressed in said first time scale and based on said processing of said snapshot and said implicit time marker within said aggregate overlay sequence generated based on said second time scale.

The advantage of this further embodiment is to allow extending the Time Ambiguity Interval by a join processing at the receiver side of the plurality of the overlay sequences.

In case overlay sequences with different lengths are transmitted by the first and second radio transmitters, it is guaranteed that the corresponding snapshot does not occur more than once within an "implicit" aggregate overlay sequence having a length obtained by combining the lengths of the non-truncated and the subsequent truncated sequences. This aggregate overlay sequence length corresponds then to an extended ambiguity period.

Another relevant embodiment of the present invention is that said sequence generation means of the Radio transmitter (Tx) further is configured to generate a truncated transition sequence, based on an original sequence consisting of an original de Bruijn sequence having a length of L symbols by first removing N symbols comprising "0" from said original sequence and subsequently removing a single symbol comprising "1" from said original sequence yielding to a truncated sequence, and optionally removing additional K symbols from this said truncated sequence, resulting in a truncated transition sequence of length L-N−1-K and generate a first integrated sequence indicating phase transitions of said truncated transition sequence and as second integrated sequence indicating phase transitions of an inverted truncated transition sequence where the first integrated sequence is in anti-phase of said second integrated sequence subsequently generate a concatenated integrated sequence by concatenating said first and said second integrated sequence where the concatenated integrated sequence is configured for modulation onto a carrier of said radio signal.

Still another relevant embodiment of the present invention is that said snapshot capture means) is configured to take a snapshot of said radio signal, said snapshot comprising a subset of symbols of said overlay sequence consisting of a concatenated integrated sequence generated by a radio transmitter (Tx) according to claim 8, wherein said snapshot comprising N+1 symbols and in that said processing means further is configured to determine N transitions from said subset of symbols of said overlay sequence included in said snapshot and subsequently determine said position of said subset of symbols included in said snapshot relative to said implicit time marker of said radio signal, based on said N transitions from said a subset of symbols included in said snapshot in an entry of a repository (25), said repository (25) comprising per entry a plurality of symbols of said snapshot and a relative position of said plurality of symbols of said snapshot relative to said time marker in said time ambiguity interval of said radio signal.

A further relevant embodiment relates to the radio receiver for resolution of time ambiguity wherein the processing means (23) of the radio receiver further is configured to determine said relative position of said implicit time marker expressed in the first time scale in said radio signal, by looking up said subset of symbols included in said snapshot in an entry of a repository, said repository comprising per entry a plurality of symbols of said snapshot and a relative position of said plurality of symbols of said snapshot relative to said implicit time marker in said time ambiguity interval of said radio signal.

The repository may act as a look-up table which relates the subset of N symbols of the sequence to its relative position within the complete sequence of L symbols and therefore to the implicit time marker, where the N symbols are input in the repository while the relative position is output as a result.

In other words, based on the subset of N symbols of the overlay sequence that has been retrieved from the snapshot content either with a PLL, or—a FLL or any other type of demodulation technique aiming at estimating the symbol values, this subset of N symbol values is used to retrieve an entry in the repository wherein the subset of N symbols according to the snapshot can be found, and where the repository also contains information on the relative position of these N symbols included in the snapshot within the time ambiguity interval or equivalently the relative position of the N symbols included in the snapshot with respect to the implicit time marker whose position within the overlay sequence is known per convention.

Such repository may comprise L subsets of N symbols and enables to determine the position of the snapshot of N symbols within the complete sequence of L symbols, thus yielding to a L×N look-up table.

Another relevant embodiment relates to the radio receiver for resolution of the time ambiguity wherein this radio receiver further generate a snapshot sequence from the radio signal containing the subset of N symbols of said set of L symbols corresponding to said radio signal transmitted by said transmitter and said snapshot receiver further by means of the processing means is configured for determining said relative position of said implicit time marker expressed in the first time scale in said radio signal, by applying a partial auto-correlation between the snapshot sequence and the whole set of L symbols in order to estimate the position of the subset of N symbols within the whole set of L symbols which enables determining the relative position of the N symbols included in the snapshot sequence within the time ambiguity interval. Here the term of partial auto-correlation function is employed because only a subset of N symbols is multiplied and summed with the whole overlay sequence of L symbols as shown in FIG. 8, while the remaining part is completed with zeros, i.e. by applying zero-padding. The offset between the snapshot sequence and the overlay sequence corresponding to the maximal value of the auto-correlation enables to determine the position of said subset of N symbols included in said snapshot sequence within said set of L symbols of the overlay sequence of said time ambiguity interval, or equivalently to determine the relative position of the N symbols included in the snapshot with respect to the implicit time marker whose position within the overlay sequence is known per convention.

Two methods can be proposed to generate the snapshot sequence.

The first one that can be categorized as part of the general soft-decoding techniques generates a snapshot sequence incorporating samples derived from the said signal snapshot and obtained after having wiped-off both Doppler offset and Code delay estimated from the acquisition process, i.e. without an intermediate step aiming at retrieving the values of N symbols containing in the said signal snapshot. More precisely, this first method consists in concatenating the samples derived from the said signal snapshot comprising the sub-set of N binary symbols as well as the additive received noise onto the signal samples, and after the wipe-off of the code delay and carrier Doppler, with another subset of "Zeros samples", obtained with zero-padding to complete the snapshot sequence to a length equal to the overlay sequence L multiplied by the number of samples per symbol duration. This snapshot sequence is then correlated with a spread overlay sequence based on the overlay sequence corresponding to said snapshot sequence and whose length equals the overlay sequence length, L, multiplied by the number of samples per symbol duration. The term spread is employed since each symbol of the spread overlay sequence, is repeated as many times as the number of samples within one symbol duration. The type of samples and the number of samples per symbol is configurable, and can correspond directly to the RF samples or to the post-correlation samples, where this first correlation operation is carried-out with the primary codes, during signal acquisition process. The type of samples therefore depends on the receiver implementation, but the radio receiver needs in all cases to remove the Doppler offset and the code delay. Hence both snapshot sequence and spread overlay sequence have the same length and can therefore be processed in the auto-correlation operation.

The second method consists in concatenating the sub-set of N binary symbols retrieved from the said signal snapshot by using a PLL, or—an FLL or any other type of demodulation technique aiming at estimating the symbol values, and another subset of L-N "Zeros", obtained with zero-padding to complete the snapshot sequence of length L. Due to this intermediate step of the symbol value retrieval in the snapshot sequence generation, this second method can be categorized in the general hard-decoding techniques. This snapshot sequence of Length L is then correlated with the overlay sequence of Length L corresponding to said snapshot sequence.

It is advantageous to apply this partial auto-correlation solution, rather than a repository one (i.e. look up table) if the number of L symbols within the overlay sequence becomes too large, in order to avoid applying a too large look-up table (repository) using excessive storage space memory and avoiding too large access times in case of a too large look-up table maintained by such repository.

For example, considering N=7 and L=2ˆ7=128 the memory demand is smaller to generate, considering the second option, a single snapshot sequence comprising a snapshot of N=7 symbols completed with 128−7=121 symbols set to 0, rather than to save a 128×7 look-up table.

Alternative applications can however also be identified, where the first time scale is shared by a space-based communication network, or by a terrestrial communication network or system transmitting signal via a base stations or beacons, or where the first time scale is shared by another connected device, for example in a "machine-to-machine" communication link, such as Vehicle-to-Vehicle (V2V), Vehicle to Everything (V2X), or Device-to-Device (D2D). In that later case, the second "Slaved" device will synchronize to the first "Master" device thanks to proposed method.

The radio receiver may be implemented by any kind of radio receiver; is not limited to receivers that implement a Phase Locked Loop (PLL) to retrieve the symbol values, but may also retrieve the symbol values by exploiting the relative phase changes (i.e., by implementing a Frequency Locked Loop—FLL), or by implementing any other type of demodulation technique aiming at estimating the M-ary symbol values.

Still another alternative embodiment of the present invention is that said radio receiver (RX1) implements a phase locked loop to retrieve the phase of the radio signal.

Still another alternative embodiment of the present invention is that said radio receiver (RX1) implements a frequency locked loop to retrieve the phase changes of the radio signal.

BRIEF DESCRIPTION OF THE DRAWINGS

The invention will be further elucidated by means of the following description and the appended figures.

FIG. 7 represents a table comprising examples of "De Bruijn" Sequences as Overlay Binary Sequences

FIG. 12 shows a table which presents the relationship between the Time Ambiguity Interval as function of the snapshot and overlay symbol duration for different values of the De Bruijn sequence length, L, and the number of overlay symbols, N, in the snapshot.

FIG. 14 represents the achieved Time Ambiguity Interval when processing two constitutive overlay sequences with different lengths and transmitted by two different components from the same satellite, the constitutive second overlay sequence being truncated of K symbols w.r.t. the first one, and as function of the number of symbols contained in the snapshot.

MODES FOR CARRYING OUT THE INVENTION

Figure 1:
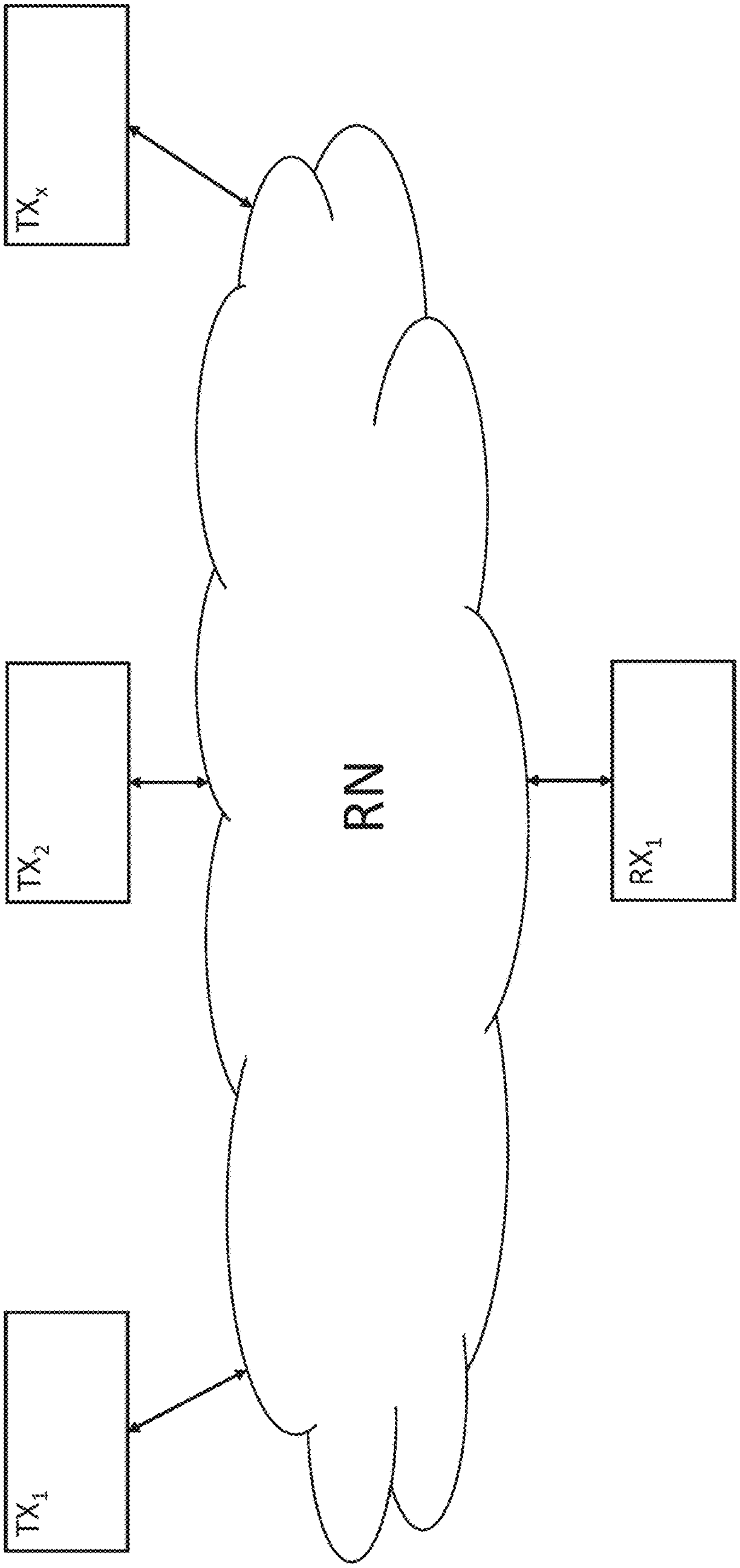
FIG. 1 represents a system for resolving time ambiguity in a radio-navigation system comprising a plurality of radio transmitters and a radio transmitter and a radio receiver.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

In the following paragraphs, referring to the drawing in FIG. 1, an implementation of the system for resolving time ambiguity in a radio navigation system between a radio transmitter and a radio receiver according to an embodiment of the present invention is described. In a further paragraph, all connections between mentioned elements are defined.

Figure 2:
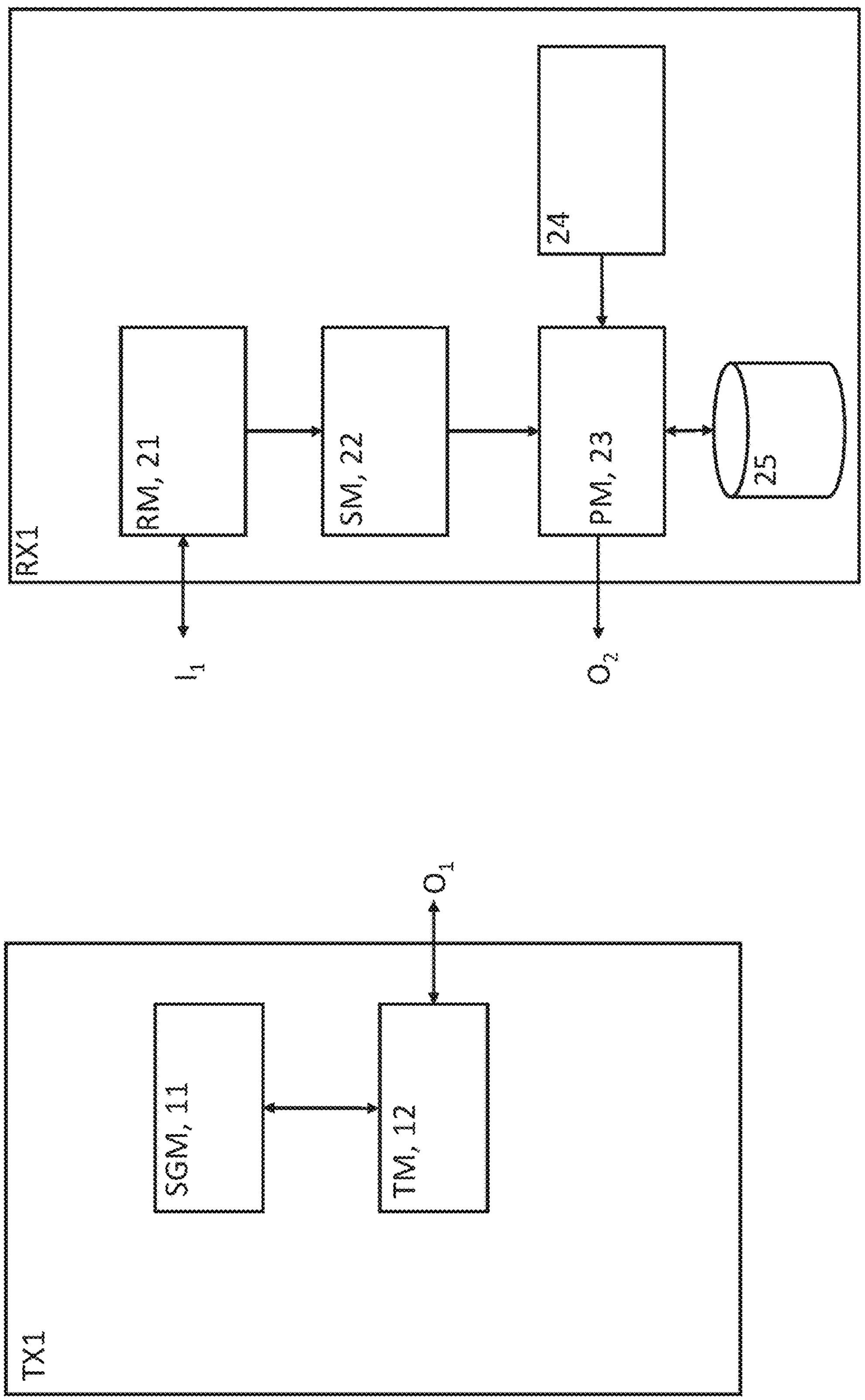
FIG. 2 represents the functional elements of the radio transmitter TX1 and a radio receiver RX1 according to embodiments of the present invention.
Figure 3:
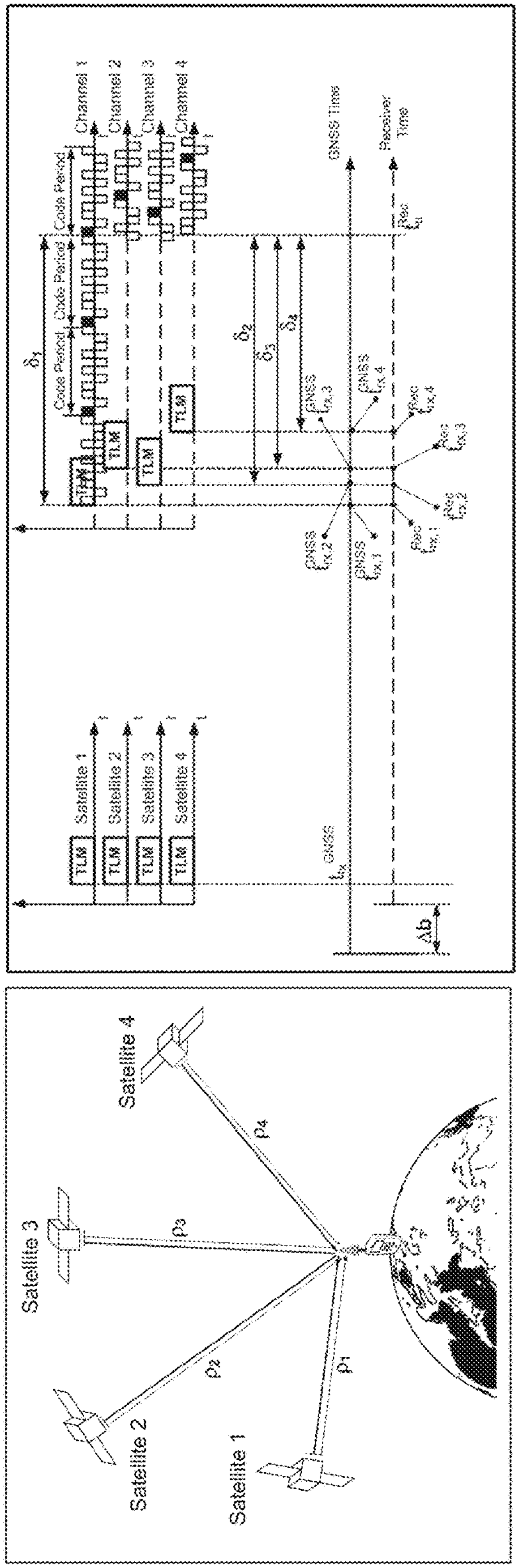
FIG. 3 represents the method to refer pseudo-ranges corresponding to four satellites based on the "common reception" to compute the GNSS receiver position.
Figure 4:
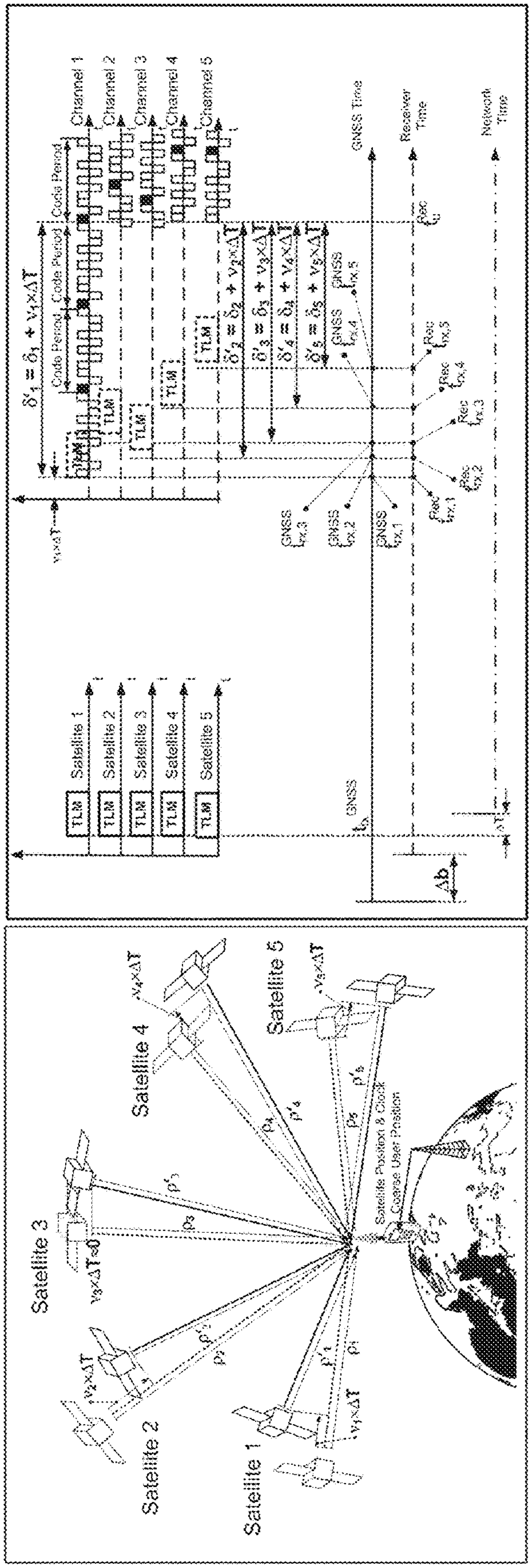
FIG. 4 illustrates and justifies the impact of a synchronization error onto the pseudo-range estimation and on the final position accuracy, and also presents a mitigation technique based on the exploitation of a $5^{th}$ Line-of-Sight to resolve synchronization error.

Subsequently all relevant functional means of a radio transmitter of the plurality of radio transmitters $TX_1 \ldots TX_x$, and the radio receiver according to an embodiment of the present invention as presented in FIG. 2 are described followed by a description of all interconnections of these functional means.

In the succeeding paragraph the actual implementation of a system for resolving time ambiguity in a radio navigation system between a radio transmitter and a radio receiver according to an embodiment of the present invention is described.

A radio navigation system comprising a plurality of radio transmitters ($TX_1 \ldots TX_x$), each radio transmitter being configured to transmit a radio signal, amongst other for navigation and synchronization purposes, towards at least one radio receiver $RX_1$ of said radio navigation system over by means of the radio signal.

Such radio transmitter may be a GNSS transmitter being a Satellite transmitting Radio Navigation Signals, or a Satellite part of a satellite communication network, or a Pseudo-Lite, or a transmitting equipment implemented in terrestrial communication networks, such as a Base Transceiver Station (BTS), a Fixed or Mobile radio Transmitter in case of a wireless communication network, or a device implemented in a V2V or V2X communication network.

Such radio receiver may be a GNSS receiver being implemented by any kind of radio receiver which is not limited to receivers that retrieve the binary values by implementing a Phase Locked Loop (PLL) but may also retrieve binary values by exploiting the relative phase changes (i.e., by implementing a Frequency Locked Loop—FLL), or by implementing any other type of demodulation technique aiming at estimating M-ary symbol values.

Such a radio receiver may be a GNSS receiver being incorporated in a user device such as a navigation device or a personal mobile device like a smartphone, being a device comprising a processor with coupled memory and interfacing means like a display and a keyboard.

Such a mobile computing device is configured to install a multiplicity of different kinds of applications where the execution of each such application is meant for performing a different kind of task, such as navigation.

The radio navigation system according to embodiments of the present invention may be satellite radio navigation system such as the Global Navigation satellite system GNSS or a single positioning beacon such as a Pseudo-Lite or a network of positioning beacons or be a terrestrial system such as wireless communication network requesting synchronizations to the UserTerminal.

Alternative embodiments of such a system according to the present invention may be applications, where the first time scale is shared by a terrestrial communication network or system transmitting signal via base transceiver stations or beacons, or where the first time scale is shared by another connected device, for example in a "machine-to-machine" communication link, such as Vehicle-to-Vehicle (V2V), Vehicle to Everything (V2X), or Device-to-Device (D2D). In that later case, the second "Slaved" device will synchronize to the first "Master" device thanks to the proposed method.

A first essential element of the radio navigation system is a radio transmitter $TX_1$ of said plurality of radio transmitters $TX_1 \ldots TX_x$ which radio transmitter is configured to transmit a radio signal to said radio receiver over a radio network amongst other for navigation and synchronization purposes. This radio transmitter $TX_1$ may comprise a transmitting means 12 that is configured to transmit a radio signal to said radio receiver over the radio network RN. The transmitted radio signal comprises an overlay sequence, such as a De Bruijn Sequence, or such as a truncated De Bruijn sequence, or such as an integrated De Bruijn sequence, or such as a combination of two or more De Bruijn sequences and/or Truncated sequences and/or Integrated De Bruijn sequences that is modulated onto a carrier of said radio signal.

Such carrier signal may for example apply a waveform to modulate a primary code with a Binary Phase Shift Keying (BPSK) as for the GPS C/A signal, or a Binary Offset Carrier (BOC) as for the Galileo E1-B/-C.

Figure 6:
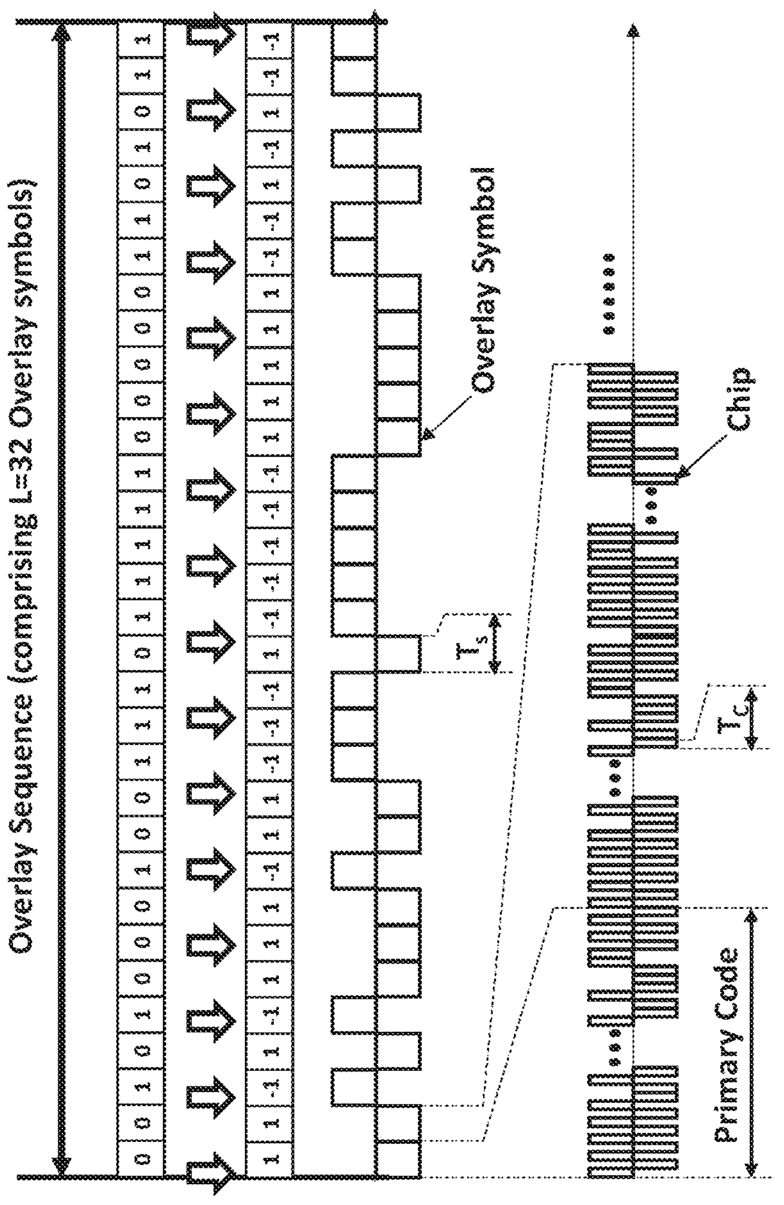
FIG. 6 represents a signal structure comprising an overlay sequence modulated onto primary codes

FIG. 6 represents a typical GNSS signal structure comprising the proposed Overlay Sequence. On the top part of the figure an example of binary overlay sequence comprising 32 overlay symbols is shown. Here logic levels [0, 1] are applied to represent the corresponding symbol. This overlay sequence can then be expressed with signal levels [1, -1] corresponding to the logic levels, as shown below. Then each symbol of this overlay sequence is modulated, or spread with a primary code, comprising chips. It is noted that in the case of a Galileo signal structure, the secondary code plays the role of the overlay sequence. Finally the overlay symbol duration, $T_s$, and the chip duration, Tc are also indicated.

Not shown on FIG. 6 is the type of waveform modulated to each chip. This one can for example be a Binary Phase Shift Keying (BPSK) as for the GPS C/A signal, or a Binary Offset Carrier (BOC) as for the Galileo E1-B/-C. The use of overlay sequence for synchronisation does not depend on the type of waveform modulation.

Figure 10:
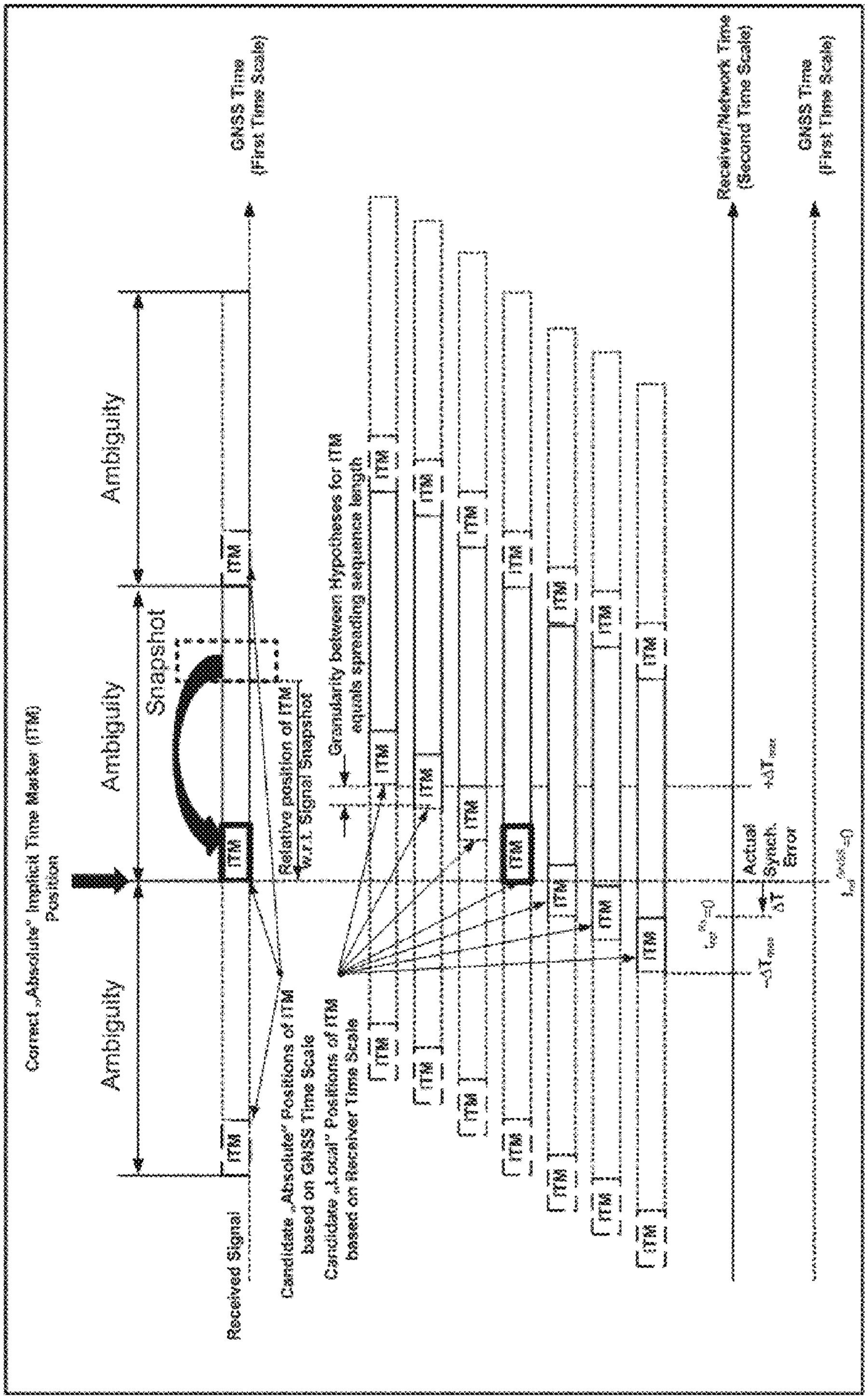
FIG. 10 represents the method based on an implicit time marker for snapshot positioning to solve the synchronization between a first time scale, as the one of the GNSS, and a second time scale, as the one of the receiver potentially synchronised to the network

FIG. 10 introduces elements which will be useful for the understanding of the proposed invention. In the FIG. 10, one example of value for the synchronization error, $\Delta T$, is illustrated. It is then considered that the GNSS satellite transmits signals comprising Implicit Time Markers, ITM.

Implicit Time Markers differs from Explicit Time Markers in the sense that they do not encode the time of transmission in the navigation message. However, implicit and explicit Time markers both aim at providing information about the Time of Transmission. The Telemetry Word (TOW and HOW) encoded in the GPS navigation message is one example of Explicit Time Marker. Implicit Time Markers make rather use of an overlay sequence, i.e. a repeating binary sequence which can be modulated onto the primary codes, which provides indirectly time information on the transmission of the message. Those overlay sequences being periodical, the ITM will also repeat at different positions within the whole signal transmitted by the GNSS satellite. Nevertheless, the position of the ITM within each overlay sequence can be defined unambiguously per convention. Depending on the synchronization error, $\Delta T$, a local position of an ITM within an overlay sequence that would be generated by the receiver in its receiver time scale, also called second time scale, can be identified and belongs to a span $\pm\Delta T_{max}$ referred into the GNSS time scale (e.g. GPST for GPS and GST for Galileo), also called first time scale. It is noted that each receiver (potentially synchronized to a different network) would generate a different local ITM position. Only one local position is highlighted with a bold and black frame and represents the correct position which would be obtained if the receiver would be perfectly synchronized to the GNSS time scale.

The user device receives and processes a signal snapshot delimited with a bold and dashed frame. From the processing of the signal snapshot it is possible to determine the relative position of an ITM of the radio signal expressed in the first time scale based on the position of a subset of symbols included in snapshot within the overlay sequence.

Figure 11:
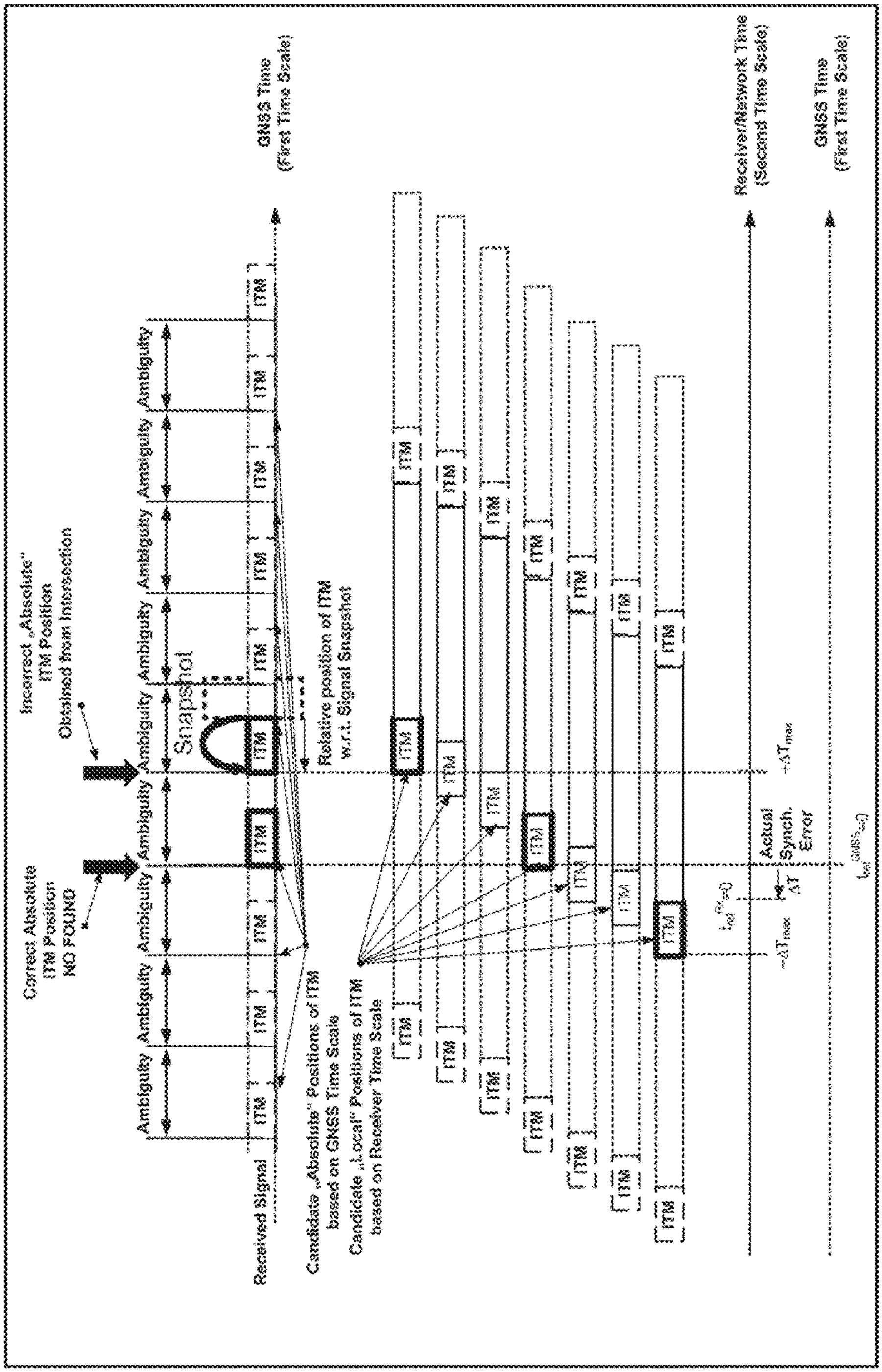
FIG. 11 represents the deficiency of a method based on an implicit time marker for snapshot positioning to solve the synchronization between a first time scale, as the one of the GNSS, and a second time scale, as the one of the receiver potentially synchronised to network, when the Time Ambiguity Interval is shorter than the synchronization between the first and second time scale

It is also remarked that since the receiver has already acquired the signal and is in a tracking mode, it is synchronized to the received signal at primary code period granularity assuming that the overlay symbol period is bound to an integer multiple of primary code periods. Therefore any position of the ITM is expressed in the receiver time scale at a granularity of the symbol duration. The difference between the relative position of the ITM position expressed in the receiver time scale with respect to the position of the ITM derived from the signal snapshot enables to determine and resolve the synchronization error $\Delta T$. With this alternative approach based on the transmission of GNSS signals comprising ITM, it is possible to avoid "sacrificing" one Line-of-sight from which a fifth pseudo-range can be derived, as for the former approaches proposed for the A-GNSS. This, in turn, enables to improve the availability of the position service. Because the GNSS signal is transmitted continuously, the implicit time markers are repeated and transmitted periodically. Therefore a time ambiguity still persists, as depicted in the upper part of the FIG. 10. The distance between repeated ITMs is defined as the Time Ambiguity Interval (TAI). Now the objective is to increase as much as possible the TAI value, beyond the maximal span of the synchronization error, $2\times\Delta T_{max}$. For the GPS C/A signal the TAI is expressed in millisecond (1 millisecond when considering only the spreading code sequence, 20 milliseconds when considering the symbol edges). The TAI shall be expressed in seconds and shall actually exceed the $2\times\Delta T_{max}$ span for unambiguous time synchronization. In order to understand the design constraints which guarantees unambiguous time synchronization, FIG. 11 represents the situation when the time ambiguity interval is shorter than the synchronization error span. For the same snapshot position, the "relative" ITM derived from the received signal will be located at another position than the "absolute" ITM, which yields to an error of synchronization. This illustrates why it is mandatory that the time ambiguity interval needs to be larger than the synchronization error span.

This overlay sequence comprises a set of L symbols per time ambiguity interval where each said time ambiguity interval comprises an implicit time marker. The transmitting means may be a GNSS transmitter or be a positioning beacon transmitter such as a Pseudo-lite or a satellite in communication network, or a vehicle connected to the network in a V2V/V2X architecture, or a Fixed or Mobile radio Transmitter in case of a wireless communication network having a first time scale.

Such overlay sequences may, but does not essentially comprise binary symbols. Alternatively, other non-binary sequences, i.e. any kind of M-ary symbol may be applied for implementing an overlay sequence.

Furthermore, the overlay sequence may, but does not essentially comprise real symbols. Alternatively, other complex symbols may be applied for implementing an overlay sequence.

The radio transmitter $TX_1$ further comprises a signal processing means 11 that is configured to generate the meant suitable radio navigation signal where this signal comprises an overlay sequence satisfying a condition of single occurrence of a subset of N symbols within said plurality of L symbols of said time ambiguity interval.

Such signal processing means 11 may comprise a microprocessor for amongst others processing the signal to be transmitted and the processing means further may comprise a memory device, coupled to said microprocessor, for storing electronic information such as computer instructions, results of the signal processing including final and intermediate results and further information.

The signal processing means 11 may be configured to generate an overlay sequence, consisting of a De Bruijn sequence, or a truncated De Bruijn sequence, or an integrated De Bruijn sequence, or a combination of two or more De Bruijn sequences and/or Truncated sequences and/or Integrated De Bruijn sequences that is modulated onto a carrier of said radio signal.

The radio transmitter $TX_1$ further comprises a transmitting means 12 that is configured to transmit the radio navigation signal generated by the signal processing means 11.

It is to be noted that each of the radio transmitters $TX_1$ . . . $TX_X$ has the same functional structure as radio transmitter $TX_1$.

The radio receiver $RX_1$ is configured to resolve time ambiguity between a radio transmitter having a first time scale and the radio receiver RX1 having a second time scale based on the radio signal received at the radio receiver $RX_1$ which radio signal is transmitted by a radio transmitter of a plurality of radio transmitters.

The radio receiver RX1 first comprises a signal reception means 21 that is configured to receive said radio signal transmitted by said radio transmitter $TX_1$ being a GNSS radio signal. The radio receiver RX1 may be any kind of device embedding a GNSS receiver and which is synchronized to its second time scale where the second time scale may be based on a local clock or the clock of a communication network the device is connected to.

The radio receiver $RX_1$ may be implemented by any kind of radio receiver; is not limited to receivers that retrieve binary values by implementing a Phase Locked Loop (PLL) but may also retrieve the binary values by exploiting the relative phase changes (i.e., by implementing a Frequency Locked Loop—FLL), or by implementing any other type of demodulation technique aiming at estimating the M-ary symbol values.

The radio receiver $RX_1$ further comprises a snapshot capture means 22 that is configured to take a snapshot of said radio signal received from the radio transmitter TX1 and a signal processing means 23 that is configured to determine a relative position of said implicit time marker expressed in the first time scale in said radio signal based on the position of said subset of N symbols included in said snapshot within said set of L symbols of the overlay sequence of said time ambiguity interval.

The processing means 23 of the radio receiver $RX_1$ further is configured to determine said relative position of said implicit time marker in said radio signal, by looking up said subset of symbols of said snapshot in an entry of a repository, said repository comprising per entry a plurality of retrieved N symbols of said snapshot and a relative position of said plurality of N symbols of said snapshot relative to said implicit time marker in said time ambiguity interval of said radio signal. The radio receiver additionally or alternatively may comprise a snapshot sequence generating means 24 that is configured to generate a snapshot sequence corresponding to said radio signal transmitted by said radio transmitter. In a first option, the said snapshot sequence can be generated from the snapshot signal including noise of said radio signal and wiping-off both Doppler offset and Code delay estimated from the acquisition process and finally completed with zero samples. Alternatively, in a second option the said snapshot sequence can be generated with the N retrieved symbols included in said snapshot of said radio signal and is also completed with zeros. Furthermore, the processing means 23 of the radio receiver $RX_1$ is configured to determine said relative position of said implicit time marker expressed in the first time scale in said radio signal, by partially auto-correlating said snapshot sequence with a spread overlay sequence corresponding to said snapshot sequence and whose length equals the overlay sequence, L, multiplied by the number of samples per symbol duration when the signal snapshot is generated according to the first option, or by partially auto-correlating said snapshot sequence with an overlay sequence of length L corresponding to said snapshot sequence when the signal snapshot is generated according to the second option.

The snapshot capturing means 22, the processing means 23, the snapshot sequence generating means 24 and the repository 25 further may comprise hardware, software or any combination thereof such as a microprocessor with a coupled electronic memory for storing instructions, results and intermediate results of the processing of the received radio signal. This may be a local processor with coupled memory for performing all functions or be dedicated to each of the functions mentioned.

The sequence generating means 11 of the radio transmitter $TX_1$ is coupled with an output-terminal to an input-terminal of the transmitting means 12 that in turn has an output-terminal that is at the same time an output-terminal O1 of the radio transmitter $TX_1$.

The radio receiver RX1 has an input-terminal 11 that is at the same time an input-terminal of the reception means 21 that in its turn is coupled with an output-terminal to an input-terminal of the snapshot capturing means 22 being coupled in turn with an output-terminal to an input-terminal of the processing means 23. The snapshot sequence generating means 24 is coupled with an output-terminal to an input-terminal of the processing means 23.

In order to explain an embodiment of the present invention it is assumed that at least one Radio transmitter $TX_1$ that is configured to resolve time ambiguity between the radio transmitter $TX_1$ having a first time scale and a radio receiver RX1 having a second time scale, the radio transmitter $TX_1$ first, by means of the signal generating means 11, generates an overlay sequence that satisfies a condition of single occurrence of a subset of N symbols within said plurality of L symbols of the entire time ambiguity interval. This overlay sequence is characterized in that it comprises a set of L symbols per time ambiguity interval and in that each said time ambiguity interval comprises an implicit time marker. The length of such overlay sequence is of a predetermined length L The resolution of the time ambiguity can then be either used internally to the said device, for example to estimate the device position and time based on ranging signals whose time ambiguity has been solved, or used externally to the said device in order to display the timing, for example for the Timing Receiver devices, yielding an output O2.

Subsequently, such radio signal is generated by modulating the generated overlay sequence onto a carrier of a radio signal which generated radio signal subsequently is broadcasted towards at least one radio receiver $RX_1$ over the coupling radio network RN by means of the transmitting means 12 where this broadcasted radio signal comprises the generated overlay sequence that is subsequently modulated onto a carrier of said radio signal.

Alternatively, the overlay sequence can also be modulated onto a primary code comprising chips which are modulated onto the carrier of said radio signal.

The overlay sequence comprises a set of symbols per time ambiguity interval where each said time ambiguity interval comprises an implicit time marker. The position of the implicit time marker within the time ambiguity interval is known (per convention) and may be for example the first symbol of the sequence.

Figure 5:
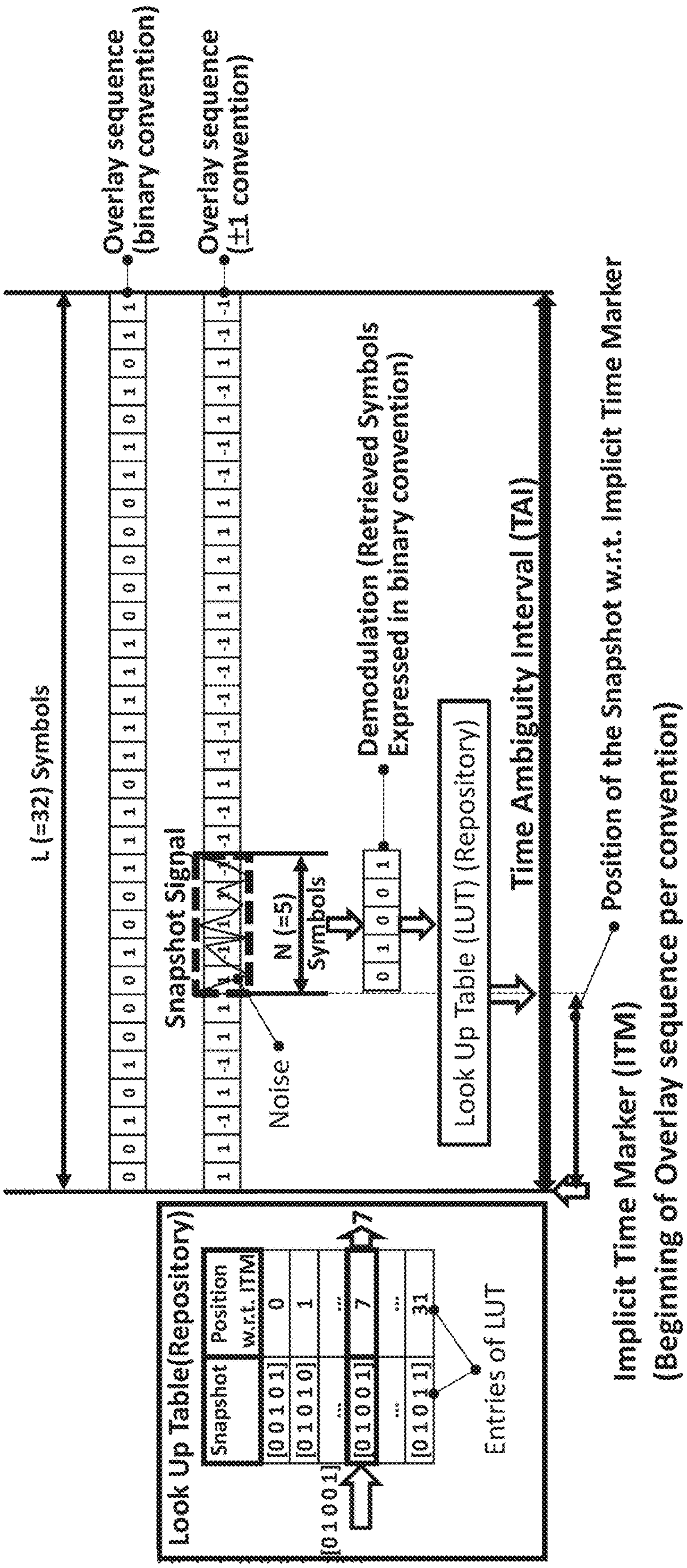
FIG. 5 represents the concept to retrieve the position of a signal snapshot of the transmitted overlay sequence w.r.t. an implicit time marker located at the beginning of the overlay sequence per convention, and based on a look-up table (or repository).

Subsequently, the Radio receiver $RX_1$ receives, by means of the reception means 21 the transmitted radio signal comprising the generated overlay sequence that is modulated onto a carrier of said radio signal. This overlay sequence is characterized in that it comprises a set of L symbols per time ambiguity interval and each said time ambiguity interval comprises an implicit time marker. The length of such overlay sequence is of a predetermined length L. The snapshot capture means 22 takes a snapshot of said overlay sequence retrieved from the received radio signal. At receipt of the radio signal, the received signal snapshot is demodulated to retrieve a subset of N symbols within the overlay sequence that is modulated onto a carrier signal, from the received radio signal. The snapshot of the overlay sequence included in the received radio signal comprises a predetermined amount of N symbols being smaller than the amount of L symbols included in the overlay sequence as shown in FIG. 5.

Further, the processing means 23 determines a relative position of said implicit time marker expressed in the first time scale of said radio signal based on the position of said subset of symbols included in said snapshot within said set of symbols of said time ambiguity interval. The snapshot captures N, for instance N=5, symbols from the overlay sequence comprising L symbols where L for example is 32 symbols. As a characteristic of the overlay sequence is the property to ensure that there is only one occurrence of any sub-sequence of length N, within the sequence of length L (including cyclic property) based on a subset of N symbols, the position of this mentioned subset within this set of L symbols of said time ambiguity interval of the corresponding overlay sequence can be determined due to this property.

An option to determine this position is that the Processing means 23, determines the relative position of said implicit time marker in said radio signal, by looking up said subset of e.g. N=5 symbols of said snapshot in an entry of a repository 25. This repository 25 may contain a table or database that comprises per entry of the table or database the plurality of N subsequent symbols included in the snapshot together with a relative position of the symbols of said snapshot relative to said implicit time marker in said time ambiguity interval of said radio signal.

Based on the retrieved symbol combination "01001" as included in the snapshot (see FIG. 5) it is possible to retrieve the relative position of said implicit time marker expressed in the first time scale of said radio signal based on the position of said subset of symbols included in said snapshot within said set of symbols of said time ambiguity interval, and therefore to resolve the time ambiguity.

The table or database of repository 25 may contain per entry of the table or database the plurality of N subsequent symbols included in the snapshot together with information on the relative position of these symbols included in the snapshot within the time ambiguity interval.

In another relevant alternative embodiment, the Radio receiver $RX_1$, by means of a snapshot sequence generating means 24 generates a snapshot sequence that corresponds to said radio signal that is transmitted by said radio transmitter $TX_1$, where in a first option the said radio receiver $RX_1$ generates the said snapshot sequence from samples derived from the snapshot signal and including noise of said radio signal after having wiped-off both Doppler offset and Code delay estimated from the acquisition process and by completing with "zero" samples, or where in a second option the said radio receiver $RX_1$ generates the said snapshot sequence by concatenating the subset of N symbols retrieved symbols included in said snapshot of said radio signal, and another subset of L-N "zeros", obtained with zero-padding to complete the snapshot sequence of length L.

Figure 8:
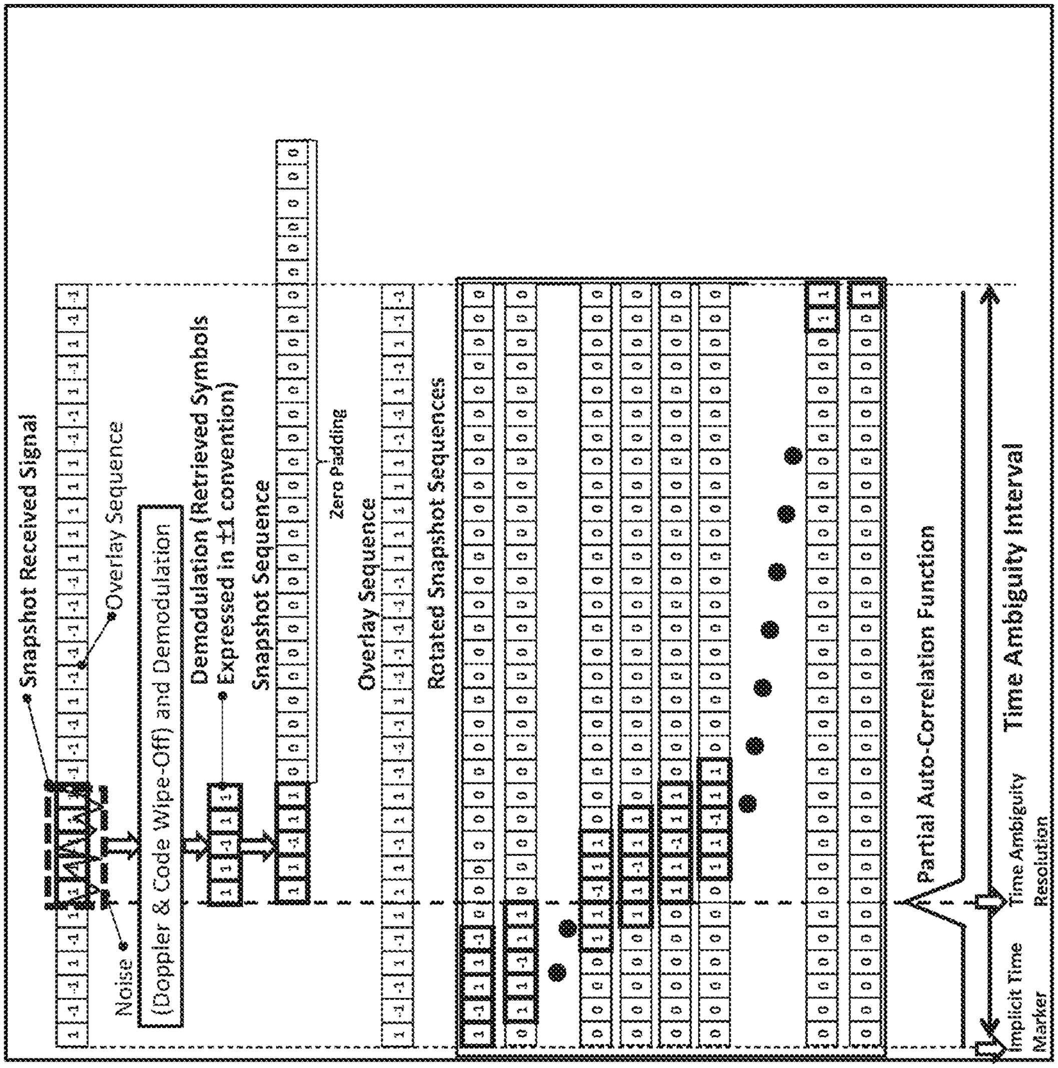
FIG. 8 represents a so-called hard decoding method based on the partial auto-correlation between of a zero padded sub-set of N=5 retrieved symbols from the signal snapshot and with the overlay sequence in order to resolve time ambiguity.
Figure 9:
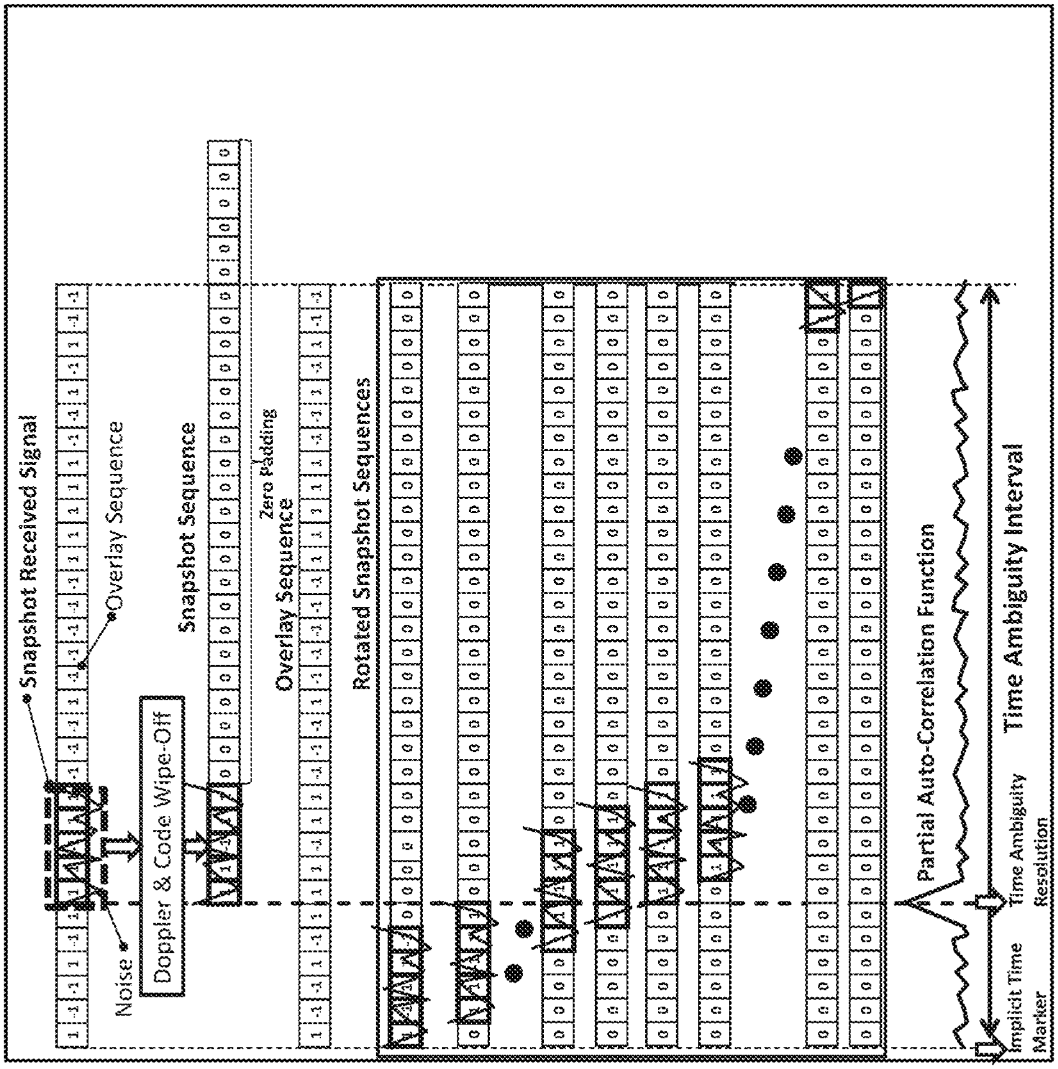
FIG. 9 represents a so-called soft decoding method based on the partial auto-correlation of a zero padded signal snapshot sequence with the overlay sequence in order to resolve time ambiguity.

Subsequently, the processing means 23 of the radio receiver $RX_1$ determines said relative position of said time marker in said radio signal, by (partially) auto-correlating the said generated snapshot sequence, with the complete overlay sequence containing a number of samples corresponding to the number of samples included in the snapshot sequence, as is shown in FIG. 8 when considering the second option for the snapshot sequence generation based on retrieved symbols, or shown in FIG. 9 when considering the first option for the snapshot sequence generation based on samples derived from snapshot signal, in order to estimate the position of the subset of N symbols included in the snapshot within the whole set of L symbols which enables the time ambiguity resolution.

It is advantageous to apply this partial auto-correlation if the number of symbols within the overlay sequence is too large (e.g. if N=7, and L=2^N=128 symbols), and then it is preferable to determine the relative position of the snapshot of N symbols relative to the implicit time marker (beginning of the overlay sequence) by using a partial auto-correlation of the N=7 retrieved symbols within the overlay symbol stream of 128 symbols, completed with 128−7=121 symbols set to 0. This solution was introduced in case N is large to avoid a too large look up table (repository) using excessive storage space memory and avoiding too large look-up times in case of a too large table maintained by such repository.

A first approach to generate the snapshot sequence, for the partial-autocorrelation process, consists to complete, i.e. zero padded, with L-N "0", the sub-sequence of N retrieved symbols, for example with a PLL or a FLL implementation. It is outlined that the performance for the retrieval of the symbols from the snapshot, will significantly improve if the code delay and carrier Doppler Offset obtained from the acquisition step are firstly wiped-off from the snapshot signal before applying the retrieval, demodulation step. For this first option, one zero per symbol is applied. This snapshot sequence of L symbols is then correlated to the complete overlay sequence of L symbols. The position of the sub-sequence yielding to the largest partial auto-correlation is then used to locate the snapshot sub-sequence w.r.t. the beginning of the overlay sequence. The principle for this first approach is illustrated in FIG. 8, in the special case when N=5. Also shown are the partial auto-correlations values taken at the boarder (when k=1, 2, 3 and 4).

A second approach to generate the snapshot sequence consists to take directly the pre-processed samples from snapshot signal, i.e. without symbol retrieval, demodulation, and to complete with padding the corresponding samples again with zeros. The pre-processing step consists in wiping off (i.e. by "de-rotating") the Doppler estimated from the acquisition step. Furthermore, different options can be proposed for the type of samples to be considered for the signal snapshot. A first option considers the raw "I/Q samples", once de-rotated with Doppler applied, which yields to a snapshot sequence comprising a large amount of samples, since measured at an effective sampling frequency equal to the sample rate, and which is not prone to support processing for low power consumption devices. Another option considers the post-correlation samples (correlation taking place at acquisition stage), and also de-rotated with Doppler, in which case the number of samples becomes much smaller, since the effective sampling frequency is reduced to the primary code rate. It is noted that for this second option, the number of zeros to be padded per symbol has to account for the effective sampling frequency. This second approach is especially suited when the overlay sequence is modulated onto the primary codes modulated onto the radio signal. The principle for this second approach is illustrated in FIG. 9.

Similar implementations to the ones used for GNSS signal acquisition can be proposed to determine the corresponding peak for the partial auto-correlation. One possible implementation relies on the usage of a serial correlation between the self-generated snapshot and padded sequence and the overlay sequence. Here each symbol position is tested consecutively. Another possible implementation relies on the use of a FFT, profiting in that way on the cyclo-periodicity property of the overlay sequence. The snapshot sub-sequence of N symbols is firstly zero-padded to generate the snapshot sequence to reach a length of L as explained beforehand. Then the following expression for the partial Auto-Correlation $ACF_p$ is applied:

$$ACF_p = IFFT\left(FFT\left(Seq_{Overlay}\right) .* conj(FFT(Seq_{N,0}))\right) \quad \text{(eq. 13)}$$

Herein:

FFT and IFFT represent respectively the Fast Fourier Transform and the Inverse Fast Fourier Transform.

Conj designates the conjugate operation $Seq_{Overlay}$ represents the binary overlay sequence of length L $Seq_{N,0}$ represents the zero padded snapshot sequence.

A relevant embodiment relates to the method wherein the overlay sequence modulated onto said radio signal consists of a De Bruijn overlay sequence. Such overlay sequence consisting of a De Bruijn sequence or a "De Bruijn" overlay sequence guarantees the single occurrence of any sub-sequence of length N within the overlay sequence of length L (including on the boarders). This property, satisfied by the "De Bruijn" sequences is called Single Occurrence of N within L symbols or the SO(N, L) property. As a consequence of the SO(N,L) property satisfied by the "De Bruijn" sequences, the position of this unique sequence of symbols within a time ambiguity interval of the radio signal such as a GNSS signal or alternatively, a signal transmitted by a satellite within a communication network, or any kind of Terrestrial radio signal such as a radio signal transmitted by a Pseudo-Lite, or a radio signal transmitted by transmitting equipment of a terrestrial communication networks, such as a Base Transceiver Station (BTS), a Fixed or Mobile radio Transmitter in case of a wireless communication network, or a radio signal transmitted by a device implemented in a V2V or V2X communication network, can be determined unambiguously and based on the position of this unique sequence, the (relative) distance between the unique sequence of symbols included in the snapshot and the position of the implicit time marker can be determined accurately.

Furthermore, the Overlay Sequence can be a De Bruijn Sequence, or a truncated De Bruijn sequence, or an integrated De Bruijn sequence, or a combination of two or more De Bruijn sequences and/or Truncated sequences and/or Integrated De Bruijn sequences that is modulated onto a carrier of said radio signal.

Such "De Bruijn" overlay sequences may, but does not essentially comprise binary symbols. Alternatively, other non-binary sequences, i.e. M-ary sequences may be applied for implementing a De Bruijn sequence.

Furthermore, the overlay sequence may, but does not essentially comprise real symbols. Alternatively, other complex symbols may be applied for implementing an overlay sequence.

Furthermore, "De Bruijn" sequences also satisfy the cyclic property which guarantees that even sub-sequences of length N which are built by concatenating the k (k<N) last symbols of the sequence with the first [N-k]symbols, do appear only once within the full "De Bruijn" sequence. One important property of the "De Bruijn" sequence is the large $(L/N)=(2^N/N)$ ratio which represents a strong advantage for snapshot positioning. Indeed, it means that for a small number N of symbols (i.e. short snapshot duration), the overlay sequence length (i.e. the Time Ambiguity Interval) can be large.

In the Table presented on FIG. 7, some examples of De Bruijn sequences for different lengths L are given for illustration.

Hence, in an advantageous embodiment of the present invention the at least one radio receiver $RX_1$ is configured to resolve time ambiguity between the radio transmitter $TX_1$ having a first time scale and a radio receiver $RX_1$ having a second time scale, the radio transmitter $RX_1$ first, by means of the signal processing means 11, generating an overlay sequence based on a "De Bruijn" sequence that satisfies a condition of single occurrence of a subset of symbols within said plurality of symbols of the entire time ambiguity interval. This overlay sequence, based on a "De Bruijn" sequence, is characterized in that it comprises a set of L symbols per time ambiguity interval and each said time ambiguity interval comprises an implicit time marker. The length of such overlay sequence is of a predetermined length L.

It is now proposed to describe the method for the design, dimensioning and selection of the "De Bruijn" sequences, but also to highlight the potential performance obtained with the application of the "De Bruijn" sequences. Some configuration examples for different values of N and L (with L=2^N), of the overlay symbol duration ($T_s$) and of the snapshot duration ($T_{Snp}=N\times T_s$) are also proposed for illustration on FIG. 12. The corresponding working points are provided in the table shown on FIG. 12. Such working points have been selected with the main constraint to have a signal snapshot duration shorter than 500 ms, which is prone to support the processing for low power consumption devices.

The table of FIG. 12 shows that it is possible to ensure that the Time Ambiguity Interval (TAI) is larger than typical synchronization error of the receiver (±2s) with a snapshot duration of 384 ms.

It is important to mention that the Snapshot Duration ($T_{Snp}$) presented in the table of FIG. 12 did not account for the two signal processing time-guards of duration $T_{Grd}$, preceding and following the N overlay symbols. Those time-guards are indeed needed to estimate the polarity (in case of PLL processing) or the change of polarity (in case of FLL processing) of the corresponding De Bruijn sub-sequence. $T_{Grd}$ depends essentially on the received Signal-to-Noise Power Spectral Density Ratio (C/No), and varying between 30 and 40 dB-Hz for typical GNSS applications, and the decoding technique (PLL or FLL based). Typical order of magnitude for $T_{Grd}$ varies from few milliseconds to 10 or 20 milliseconds.

From the former exemplary configurations, the following relationships between the main requirements and design parameters can be deduced:

$$T_{Snp} = N \times Ts + 2 \times T_{Grd} \quad \text{(eq. 14)}$$

$$TAI = \pm((L \times Ts)/2) = \pm((2^\wedge N \times T_s)/2) \quad \text{(eq. 15)}$$

Note that in the former equation, the division with a factor 2 originates from expressing the TAI in a "one-sided" way (e.g. ±0.16s). If the TAI would be expressed as a "span" (e.g. 0.32s) then this factor 2 division would vanish.

As a consequence, if the Time Ambiguity Interval (TAI), symbol duration ($T_s$) and the processing time-guard duration ($T_{Grd}$) are specified as requirement, then it is possible to simply deduce the length of the De Bruijn Sequence, L, and therefore the number of De Bruijn symbols in the snapshot according to:

$$L = 2^\wedge(\lceil \log_2(TAI/T_S) \rceil) = 2^\wedge N \quad \text{(eq. 16)}$$

Note that in the former equation the De Bruijn Sequence length, directly related to the TAI, is now expressed as a span (e.g. 0.32s) and not as one sided (e.g. ±0,16s). The mathematical operator $\lceil x \rceil$ designates the ceiling function (least integer greater than or equal to x). As an example if TAI=0.31s, and $T_s$=40 ms then $L_{optim}=2^\wedge(\lceil \log_2(0.31/(0,04) \rceil=8)$ and $N_{optim}=3$. Assuming that the time-guards have duration $T_{Grd}$=4 ms, then the snapshot time becomes 128 ms.

Another design scenario considers that the Time Ambiguity Interval (TAI), the symbol duration ($T_s$) and the processing time-guard duration ($T_{Grd}$) are given, and that is necessary to deduce the De-Bruijn sequence length, L, and the number of symbols in the snapshot, N. In that case, and re-using (eq. 14) and (eq. 15), it yields a system of two equations for two unknown, $T_s$ and N:

$$N \times T_s = T_{Snp} - 2 \times T_{Grd} \quad \text{(eq. 17)}$$

$$2^\wedge N \times T_s = L \times T_s = TAI \quad \text{(eq. 18)}$$

This system can be reduced to a single equation for the unknown, N:

$$N \times TAI - 2^\wedge N \times (T_{Snp} - 2 \times T_{Grd}) = 0 \quad \text{(eq. 19)}$$

If the solution for the number of symbols per snapshot, $N_{optim}$, exists, then the optimal symbol duration $T_{s,optim}$ can be simply deduced from (eq. 14).

Once the main principle for the application of the "De Bruijn" sequence described, it is proposed to present additional uses cases offering higher performances, and based on the combination of several "De Bruijn" sequences.

In a further alternative and advantageous embodiment of the present invention, each GNSS signal that is transmitted by the same satellite comprises two (or more) signal components modulated each with a different constitutive "De Bruijn" sequence, yielding to two (or more) constitutive "De Bruijn" sequences transmitted by the same satellite. The corresponding constitutive "De Bruijn" sequences, when combined then form an aggregated overlay sequence. In the following, V represents the number of constitutive "De Bruijn" sequence transmitted by the satellite.

Hereafter, the special case when two signal components (V=2) modulated each with a constitutive "De Bruijn" sequence, yielding to two constitutive "De Bruijn" sequences transmitted by the same satellite will be considered for illustration. One possible implementation consists in modulating those sequences on two different primary code streams, and therefore two different signal components, which can be in quadrature or in-phase.

Figures 13A, 13B:
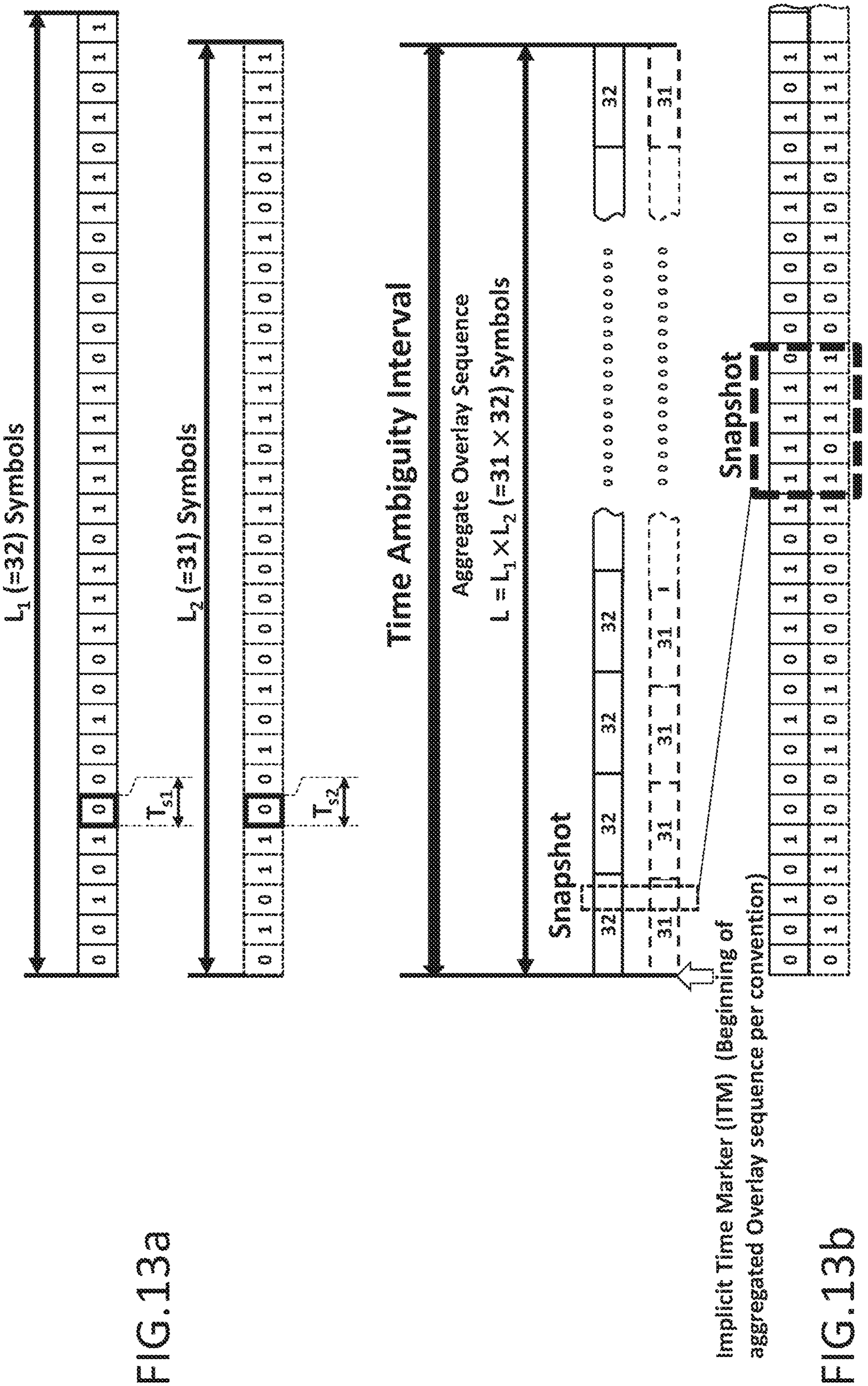
FIG. 13 represents the concept application of a plurality of "De Bruijn" sequences transmitted by the same source, e.g. satellite, in order to improve the Time Ambiguity Interval. Here the case when the two "De Bruijn" sequences is presented, and when the second "De Bruijn" sequence is obtained from the first one per truncation of a single symbol.

In a sub-case of this embodiment, it is considered that the first constitutive sequence is a non-truncated "De Bruijn" of length $L_1$, also called fundamental "De Bruijn" sequence, while the second constitutive sequence is a truncated "De Bruijn" sequence of length $L_2=L_1-1$. This latest is obtained by removing one bit, for example the last one, from a fundamental "De Bruijn" sequence of length $L_1$. In the proposed example depicted on FIG. 13 $L_1=32$ symbols, and L2=32−1=31 symbols. For this example, both sequences have symbols with same duration ($T_s=T_{s1}=T_{s2}$). Both sequences are shown on the upper part, FIG. 13*a*. In FIG. 13*b* the GNSS signal is represented over a long time period and shows the two overlay sequence streams, the first one obtained by concatenating the first constitutive overlay sequence with length 32 symbols, and the second one obtained by concatenating the second constitutive overlay sequence with length 31 symbols. For this example, it is also considered that the edges of the corresponding symbols are transmitted synchronously. At reception the un-truncated and truncated "De Bruijn" constitutive sequences can be combined, per "juxtaposition", into a so called aggregated overlay sequence, which can be viewed as a sequence comprising complex symbols (considering the symbols modulated onto the In− and Quadrature signals components), or alternatively as a quaternary sequence, whose quaternary symbols have the same duration, $T_s$, and can be related to the combined binary symbols of the un-truncated and truncated constitutive "De Bruijn" sequences, as follows: the quaternary symbols "0" stands for "0 0", "1" for "0 1", "2" stands for "1 1" and "3" stands for "10". In this notation the first binary symbol, "a" of the pair "a b" originates per convention from the first (un-truncated) constitutive De Bruijn sequence, and the second binary symbol "b" originates per convention from the second (truncated) constitutive De Bruijn sequence. For the proposed example depicted on FIG. 13*b* it is again considered that a snapshot of signal with duration $N \times T_s$ and comprising N=5 binary symbols of each sequence, and therefore comprising 5 quaternary symbols of the aggregated overlay sequence, is processed by the user device. Due to the difference of constitutive overlay sequence lengths, it is guaranteed that the corresponding snapshot does not occur more than once within the said aggregate overlay sequence of length $L=L_1\times L_2=992$ symbols. This aggregate overlay sequence length corresponds to the periodicity expressed in unit of quaternary symbols of the aggregated overlay sequence. The period of the aggregate overlay sequence, once expressed in seconds, then equals $L\times T_s$. This period then corresponds to an extended TAI. As an example if the overlay symbol duration is $T_{s1}=T_52=44$ ms, the TAI becomes 992×44 ms=43.648s. Furthermore, the position of an implicit time marker for this aggregate overlay sequence can again be defined per convention at the position in the aggregate overlay sequence where the first symbol of the first sequence and the first symbol of the second sequence coincide and are in phase. This implicit time marker will again serve at estimating the relative position of the snapshot in the second time scale. The determination of the relative position of said implicit time marker of said radio signal based on the position of said subset of symbols included in said snapshot of said aggregate overlay sequence can be based on looking-up into a repository, or by computing a partial auto-correlation function, as for the case when transmitting and processing a single De Bruijn based sequence.

Based on the proposed exemplary configurations, the following design scenario can be proposed. First, one considers that the extended TAI is obtained by the single occurrence within a snapshot of the combination of N symbols as part of a fundamental constitutive De Bruijn sequence of length L modulated on a first signal component, and N symbols as part of a second constitutive De Bruijn sequence, of length $L_2=L_1$-K, obtained from the fundamental one by truncating K symbols and modulated on a second signal component. Furthermore, one considers that the same symbol duration $T_s$ for both sequences applies. Based on those design considerations, the (extended) TAI fulfils the following set of equations:

$$N \times T_s = T_{Snp} - 2 \times T_{Grd} \quad \text{(eq. 20)}$$

$$TAI = \pm(L_1 \times (L_1 - K)T_s)/2 = \pm(2^\wedge N \times (2^\wedge N - K) \times T_s) \quad \text{(eq. 21)}$$

Contrarily to the design based on a single De Bruijn sequence, and yielding to equations (eq. 14) and (eq. 15), two others degrees of freedom are introduced. The first one corresponds to the number of truncated symbols from the fundamental De Bruijn sequence, K, varying between 1 and ($L_1$1). The second one corresponds to the position of the truncated symbols within the fundamental "De Bruijn", considering the constraint that the K truncated symbols are adjacent, to preserve the properties of the fundamental "De Bruijn", once truncated. Several solutions for $L_1$ (which leads to N), K and the truncated symbol positions can be found, following similar mathematical derivations as the ones described in the single De Bruijn design case. One optimal solution ($L_{1,optim}$, $K_{optim}$ as well as the optimal truncated symbol positions) is the one favouring the smallest, N, in order to reduce the snapshot duration.

The table shown on FIG. 14 computes the extended TAI when considering a symbol duration $T_s$ of 40 ms. The raw indicates the number of truncated symbols, K, and the column indicates the fundamental De Bruijn sequence length, $L_1$ (which is derived from N as $L_1$=2^N). Each cell gives the TAI based on equation (eq. 21). For this example, the positions for the K symbols that are truncated are located at the end of the fundamental "De Bruijn" sequence.

Assuming for this example a minimal required TAI of 5.12 seconds, then the table of FIG. 14 shows that two configurations could satisfy this TAI, with ($L_1$=16, K=8) or ($L_1$=32, K=28). The first one ($L_{1,optim}$=16, $K_{optim}$=8) shall then be selected to guarantee the smallest snapshot duration, depending of N equal to 4×40 ms=160 ms (without time guards).

In the case when the symbol duration $T_s$ is not provided for the design of the optimal configuration, a parametrical analyses shall be conducted to determine the parameters $L_{1,optim}$ (so $N_{optim}$), $K_{optim}$, the truncated symbol positions and $T_{s,optim}$ which fulfil the TAI with the constraint for the smallest snapshot duration (considering also the time-guards). In that case different tables, similar to the table shown on FIG. 14, shall be generated for different candidate values of the symbol duration, $T_s$. The combination of ($L_1$, K, $T_s$ and truncated symbol positions) yielding to the smallest snapshot duration shall then be retained for the ($L_{1,optim}$, $K_{optim}$, $T_{s,optim}$) optimal one.

The principle described on FIG. 13*a* and FIG. 13*b* used a fundamental De Bruijn sequence of the length $L_1$=32 symbols, which is truncated with one symbol to form the second overlay and shorter sequence. This principle can be extended for other values of the length $L_1$, for the fundamental De Bruijn sequence, for example $L_1$=64, 128, . . . Furthermore, the principle can be generalized with the following sub-cases of the embodiment:

- The combination of two constitutive "De Bruijn" sequences built each with two different fundamental De Bruijn sequences having the same length. The first sequence is then based on the first fundamental De Bruijn sequence without truncation, while the second one is based on another fundamental De Bruijn sequence with a truncation of K symbols.
- The combination of two "De Bruijn" sequences built each with fundamental sequences with different lengths. For example, one could consider that the first sequence is built with a fundamental "De Bruijn" sequence of length $L_1$=32, while the second sequence is generated by truncating K symbols from a fundamental "De Bruijn" sequence of length $2^4$=16, yielding to a length $L_2$=16-K.
- In case when the second sequence is obtained with truncation from the first sequence, the number of truncated symbols, K, can vary between 1 and ($L_1$-1). Nevertheless attention must be paid to guarantee that the lengths of both sequences, after possible truncation, are not multiple of each other, to effectively guarantee an extended TAI. For example, considering two fundamental sequences of length $L_1$=$L_2$=32 symbols, if 16 symbols would be truncated from the second fundamental sequence of length $L_2$=32, then the aggregated overlay sequence, obtained by combination of the first fundamental constitutive sequence of length $L_1$=32, and the second truncated sequence of length $L_2$=32−16=16 symbols, would show a periodicity of L=32 symbols, which has the same TAI as the first fundamental constitutive sequence. It is noted, that the case when the lengths of the constitutive sequences is identical or multiple of each other, is considered later in another sub-case of the embodiment covering the processing of combined constitutive sequences transmitted by the same satellite, and proposed to offer other advantageous performance.
- Instead of transmitting two sequences, the GNSS transmitter can transmit three or more overlay sequences. V represents the number of transmitted constitutive overlay sequences, "De Bruijn" based. By doing so, it is possible to even more extend the TAI, as the length of the aggregate overlay sequence ($L=L_1 \times L_2 \times L_v \ldots \times L_v$).
- The symbol duration for the two or more overlay sequences (V in total), as "De Bruijn" based sequence, may differ: $T_{s1}$ (≠ or =) $T_{s2}$ (≠ or =) $T_{sv}$ . . . (≠ or =) $T_{sV}$. In this particular case, the symbol duration of the aggregate overlay sequence equals the largest common divisor (lcd) of the different symbol durations of the fundamental and constitutive overlay sequences: $T_s$=lcd($T_{s1}$, $T_{s2}$, $T_{sv}$, . . . ,$T_{sV}$). Furthermore, the following steps are applied to obtain the aggregate overlay sequence. Firstly, a so-called interpolated constitutive sequences is obtained by repeating $R_v$ times each symbol of each constitutive sequence, where $R_v$ represents the ratio between the symbol duration of the constitutive sequence $T_{sV}$ and the symbol duration of the aggregate overlay sequence, $T_s$: $R_v=T_{sv}/T_s$. Secondly, each interpolated constitutive sequence is concatenated with itself, in a similar way to the case illustrated on FIG. 13*b*, to yield a stream of concatenated interpolated constitutive sequence. Thirdly, the aggregate overlay sequence is obtained by combining the said streams of concatenated interpolated constitutive sequences. Considering the case of binary constitutive sequences, then the symbols of the aggregate overlay sequence are M-ary symbols, where M=2×V. The length L of the aggregated overlay sequence then represents the periodicity expressed in M-ary symbols of the aggregate overlay sequence. Finally, the snapshot duration shall comprise a subset comprising N M-ary symbols, fulfilling the SO(L,N) property on a one side, and ensuring the maximisation of the ratio L/N on the other side. It is now proposed to illustrate the procedure to obtain the interpolated constitutive sequences, based on an example considering two constitutive sequences with different symbol durations. The first fundamental "De Bruijn" sequence comprises $L_1$=4 symbols (for N=2) with a symbol duration $T_1$=20 ms, and equals [1, 1, 0, 0], while the second fundamental "De Bruijn" sequence comprises $L_2$=4−1=3 symbols (i.e. N=2, and K=1 symbol is truncated) with a symbol duration $T_2$=15 ms and equals [0, 1, 1]. For this example, the symbol duration for the aggregated overlay sequence equals 5 ms, since 5=lgcd(15,20). Furthermore, the first interpolated constitutive sequence is obtained by repeating 20/5=4 times each of the four symbol of the corresponding first constitutive sequence, yielding the sequence [1 1 1 1, 1 1 1 1, 0 0 0 0, 0 0 0 0]. Similarly, the second interpolated constitutive sequence is obtained by repeating 15/5=3 times each of the three symbols of the corresponding second constitutive sequence, yielding the sequence [0 0 0, 1 1 1, 1 1 1]. Both former interpolated constitutive sequences are then concatenated to form streams of concatenated interpolated constitutive sequences, as shown on FIG. 13*a*, and the aggregated overlay sequence is obtained by combining those streams of concatenated interpolated constitutive sequences.

In another sub-case of the corresponding embodiment, it is proposed to transmit two or more constitutive De Bruijn sequences having the same length L, and symbol duration $T_s$, by the same satellite. Again, V represents the number of transmitted constitutive overlay sequences, "De Bruijn" based. The advantage of this scheme is to improve the latency of the time ambiguity resolution, thanks to an improvement of the retrieval performance of the symbols comprised in the signal snapshot, but not to improve the Time Ambiguity Interval. Each constitutive De Bruijn sequence is then modulated onto a different signal component. As an illustrative example, two constitutive De Bruijn sequences of Length $L_1=L_2=L=2^\wedge$and with the same symbol duration $T_{s1}=T_{s2}=T_s$ are considered. Furthermore, those constitutive De Bruijn sequences are selected in such a way that the intervals comprising few transitions (consecutive symbols [0 1] and [10] constitute a transition, while consecutive symbols [0 0] and [1 1] do not) of the first constitutive De Bruijn sequence correspond to intervals comprising more transitions of the second constitutive De Bruijn sequence. By applying this selection and design rule, for a given snapshot duration of $N\times T_s$ and comprising 2N symbols (N symbols from the first De Bruijn Sequence and N symbols from the second De Bruijn sequence), the average number of transitions per snapshot duration becomes larger which will enable to retrieve the corresponding 2N symbols, either by applying the soft or the hard decoding techniques formerly presented with better performance. The direct consequence is an improvement of the retrieval performance for the corresponding 2N symbols when compared to the case of the transmission of a single De Bruijn sequence with the same aggregated power, i.e. the transmitted power allotted for the signal component modulated with a single De Bruijn sequence equals the aggregated power allotted to both signal components modulated with both De Bruijn sequences. In addition, for a snapshot applied to the combined signal comprising two constitutive overlay sequences and with a duration which is half the one applied to a signal comprising a single overlay sequence, the same number of symbols is obtained (N). Therefore at higher signal-to-noise ratios, which permit error-free demodulation, the latency is reduced with a factor 2. In this alternative scheme, the position of an implicit time marker can again be defined per convention at the position of the first symbol of the first constitutive sequence which is identical to the position of the first symbol of the second constitutive sequence since both constitutive sequences have the same length, L, and symbol duration $T_s$. This implicit time marker is used again to find the synchronisation error between the first and second time scale. It is remarked that the case where two binary De Bruijn sequences are modulated, can be assimilated to the case when a single quaternary De Bruijn sequence is modulated onto a single signal component. Therefore, the modelling and formulation considering an aggregate overlay sequence, introduced formerly in the case when the constitutive sequences have different lengths, can be re-used in the current case when the constitutive sequences have same length. The said aggregated overlay sequence is again obtained per combination of both constitutive overlay, "De Bruijn" based, sequences. The proposed method can be extended to more than two constitutive De Bruijn sequences (up to V constitutive sequences), or to the case when the symbol durations of both constitutive De Bruijn sequence differs ($T_{s1}$ #$T_{s2}$) but are inversely proportional to the respective sequence lengths ($L_1/L_2=T_{s2}/T_{s1}$) yielding to the same sequence periods, once expressed in unit of seconds $L_1\times T_1=L_2\times T_2$.

In a further embodiment, advantage is taken of the large ensemble of candidate De Bruijn sequences (equal to $2^\wedge(2^\wedge(N-1)-N)$ for binary sequences) in order to introduce new features such as the possibility to detect and correct errors in the retrieval process (i.e. demodulation), of the overlay symbols. Even though the objective of the use of De Bruijn sequence is to minimise the L/N ratio, alternative processing approaches can be envisaged by exploiting a longer snapshot, comprising more than the minimal number of N symbols as part of sub-set within the whole overlay sequence of length L, being equal to $2^\wedge$in the special case of a binary De Bruijn sequence. Specifically, instead of processing N overlay symbols, the radio receiver processes the $P=N+N_{Ext}$ overlay symbols, comprised in a longer snapshot, in order to increase the robustness of the synchronisation. Extending the snapshot duration with $N_{Ext}$ additional symbols enables firstly to improve the synchronization performances for the retrieval of the P symbol values, by increasing probabilistically the number of transitions, which will support the time synchronization. In addition, to improve demodulation performance, the $N_{Ext}$ additional symbols can also be exploited to detect errors in the demodulated symbols, for example because the signal was received at a low (C/No). The following example is proposed to illustrate the principle to exploit the property yielding to the detection of errors. Considering an extended subset comprising $P=N+N_{Ext}$ overlay symbols, and considering that $N_{err}$ of those P symbols are corrupted with $N_{err}>1$, then the new resulting and corrupted subset comprising $P=N+N_{Ext}$ overlay symbols can no more appear, per construction, at the same position of the uncorrupted subset of $P=N+N_{Ext}$ overlay symbols (i.e. free of demodulation errors). However, this extended subset might still appear in the uncorrupted stream of the overlay symbols at other positions. Here different cases have to be distinguished:

The first one considers that the corresponding corrupted subset of P overlay symbols does not occur at all within the uncorrupted stream of overlay symbols. In that case the receiver will not rely on this snapshot for the synchronization, since per design, the uncorrupted sub-set shall occur once, following the SO(N,L), so SO(P,L) property.

The second case considers that the corresponding corrupted subset comprising P overlay symbols occurs twice or more in the uncorrupted stream of overlay symbols. Because, per design, any sub-set of N or more (i.e. P) symbols shall occur once, following the SO(N, L), so SO(P,L) property, the receiver will also not trust the corresponding snapshot to provide synchronization.

The final case considers that the corresponding corrupted subset comprising P overlay symbols occurs once. This situation yields to an ambiguity, since the receiver might interpret the sequence as un-corrupted while it is not.

Two examples are now proposed to illustrate the situation when a specific Overlay (i.e. De Bruijn) sequence cannot or can support the detection of e.g. 8 errors in the retrieved sub-set of N symbols.

Figure 15:
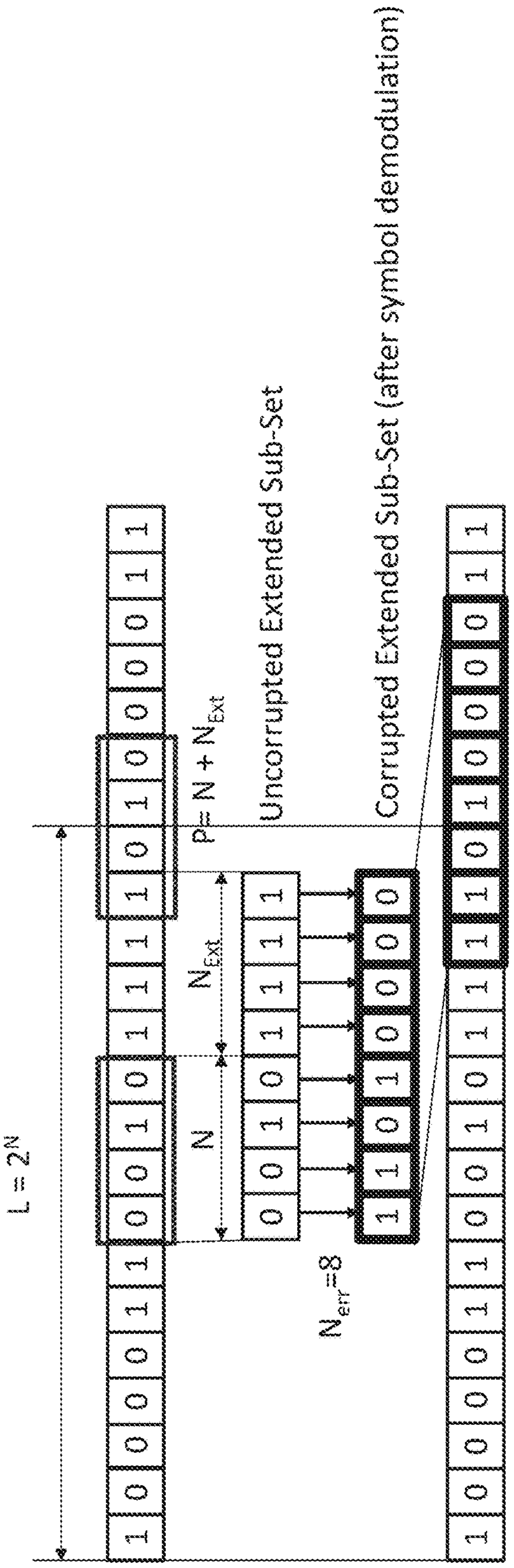
FIG. 15 represents the case when a sequence of P=8 retrieved symbols from a signal snapshot and corrupted by demodulation error (here $N_{err}$=8 corrupted symbols) appears at another location within the overlay sequence.

FIG. 15 illustrates the situation when the Overlay Sequence cannot help detecting the 8 erroneous and retrieved symbols. First an overlay sequence comprising L=16 symbols (for N=4), is considered: [1 0 0 0 0 1 1 0 0 1 0 1 1 1 1 0]. Then a longer snapshot with a length P=8 symbols is received and processed. Furthermore, one considers that under extreme demodulation conditions, i.e. low or very low (C/No), all $N_{err}$=8 symbols have been erroneously demodulated. This situation yields to a complete inversion of the demodulated subset (assuming a PLL based demodulation enabling retrieval of symbol polarity). FIG. 15 shows that the corresponding erroneous sub-set of retrieved symbols [1 10 10 0 0 0] can be found at another position within the whole Overlay sequence (also concatenated with the following Overlay sequence). This example shows that one single occurrence of the erroneous subset can yield to an ambiguity in the time retrieval, since yielding to an incorrect position ($14^{th}$ symbol) w.r.t. the implicit time marker, compared to the actual and true subset position ($8^{th}$ symbol) w.r.t. implicit time marker, set per convention at leading symbol of the Overlay sequence. This specific overlay sequence, [1 0 0 0 0 1 1 0 0 1 0 1 1 1 1 0], is therefore not prone to detect 8 errors.

Figure 16:
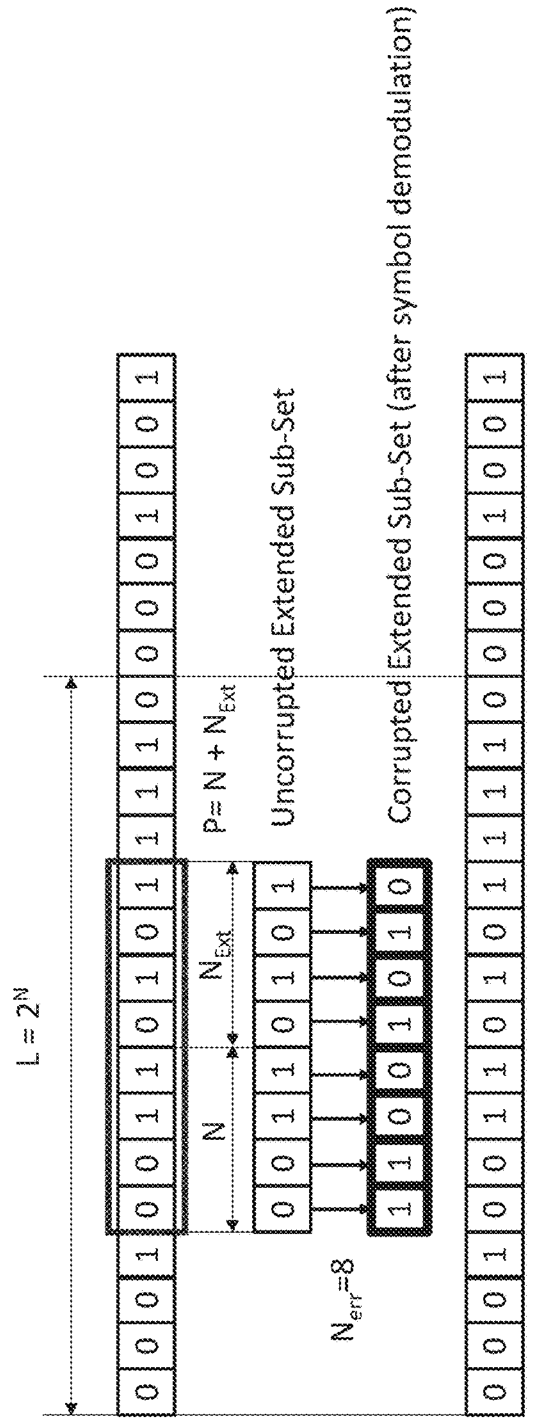
FIG. 16 represents the case when a sequence of P=8 retrieved symbols from a signal snapshot and corrupted by demodulation error (here $N_{err}$=8 corrupted symbols) does not appear at any other location within the overlay sequence.

The FIG. 16 shows another example of specific Overlay (i.e. De Bruijn) sequence which now can support the detection of 8 errors in a given extended subset and provides a pictorial view of the processing logic at the radio receiver. In this example, the Overlay sequence equals [0 0 0 1 0 0 1 1 0 1 0 1 1 1 1 0], and comprises again L=16 symbols, corresponding to N=4. Furthermore, one considers an extended subset of length P=8, with $N_{Ext}$=4 is retrieved from the $4^{th}$ symbol position from the beginning of the Overlay sequence, [0 0 110 10 1]. Assuming again $N_{err}$=8 erroneous symbols in the retrieved sub-set of 8 symbols [110 0 10 10], it can be shown that this erroneous sub-set of 8 symbols cannot be found at any other place within the (concatenated) Overlay sequence. Therefore, the receiver is now in measure to not accept the corresponding sub-set of erroneous symbols to resolve time ambiguity.

The distinction of the three cases, formerly presented, enables to understand that the necessary condition for a De Bruijn sequence to offer demodulation error detection, is that any extended sub-set comprising P symbols, and corrupted by up to $N_{err,max}$ erroneous symbols at any position, $N_{err,max}$ varying between 1 and P, shall either never occur or if it occurs then more than once within the uncorrupted stream of overlay symbols. If both conditions are fulfilled it means that an extended subset of the corresponding De Bruijn sequence, if corrupted with up to $N_{err,max}$ erroneous symbols will never appear or appear more than once in the stream which will enable to decide rejecting the synchronization obtained with the longer snapshot comprising the P symbols. Hence, the radio receiver discards the demodulated extended subset. The receiver can then try extracting a longer snapshot comprising P symbols transmitted by another satellite contained in the same signal snapshot, by considering that the receiver can simultaneously receive different signals transmitted by different satellites, as in the case of GNSS navigation systems. Alternatively, the receiver can further extend the signal snapshot duration, comprising P* symbols, with P*>P by including N*Ext additional symbols to N, with $N^*_{Ext}$>$N_{Ext}$. Alternatively the receiver can take another longer snapshot comprising P overlay symbols transmitted by the same satellite to try resolving the time ambiguity with the same satellite. Therefore, a radio receiver can demodulate P symbols instead of the minimum N symbols with the capability of detecting up to $N_{err,max}$. Such processing logic combined with the properties of the said subset of De Bruijn sequences, provides error detection capabilities on the time synchronisation of up to $N_{err,max}$ demodulation errors in the sequence.

In order to support the detection of $N_{err,max}$ an iterative selection process for the De Bruijn overlay sequence is conducted. In a first step, the design parameters are defined. This corresponds to the overlay sequence L and therefore the minimal (i.e. un-extended) snapshot duration comprising N symbols. The number of additional symbols, $N_{Ext}$, adjacent to the N symbols, is also set to define an extended subset comprising P=N+$N_{Ext}$ symbols which are included into the said longer signal snapshot. At maximum $N_{ext}$=L-N, considering the extreme case with an extended subset with the same length as the overlay sequence. Finally, the maximal number of detectable errors $N_{err,max,test}$ to be applied to the extended subset comprising P symbols is initialised to the value L (extreme case where the snapshot has the same length P as the overlay sequence, L, and all P symbols are erroneous). In a second step, candidate binary De Bruijn overlay sequences out of a pool comprising 2^(2^(N−1)−N candidate De Bruijn Overlay sequences are tested successfully. For each candidate De Bruijn overlay sequence, an extended subset comprising P symbols is selected (also considering cyclo-periodicity property). L such extended subsets comprising P symbols can thus be selected out of the complete De Bruijn overlay sequence. Up to $N_{err,max,test}$ errors (1, or 2, or, . . . , $N_{err,max,test}$ or errors) are applied within the corresponding extended subset, and the error application consists to replace the 0 (resp. 1) symbols of the initial binary De Bruijn overlay sequence with 1 (resp. 0) symbols selected at those up to $N_{err,max,test}$ specific positions to yield an erroneous extended subset comprising P symbols. All possible position combinations for those up to $N_{err,max,test}$ errors out of the P possible are systematically considered. Then, if it is shown that the corresponding erroneous extended subset can be found only once in the initial De Bruijn overlay sequence then the candidate De Bruijn Sequence is rejected, else if the corresponding erroneous extended subset cannot be found, or can be found but more than once, then another erroneous extended subset is generated to pursue the process for this candidate De Bruijn overlay sequence. This process is repeated for all possible up to $N_{err,max,test}$ positions out of P for each selected extended subset within the De Bruijn Overlay sequence, and for all L possible extended subsets comprising P symbols within the De Bruijn Overlay sequence. If it is shown after this selection process that any extended subset comprising P symbols within the De Bruijn overlay sequence and contaminated with up to $N_{err,max,test}$ errors taken at any position within the P symbols never occurs once within the original De Bruijn Overlay sequence, then the corresponding De Bruijn Overlay sequence is selected to support the detection of up to $N_{err,max,test}$ errors, in which case $N_{err,max}$ equals $N_{err,max}$,test. Else, $N_{err,max,test}$ is decremented of one. This process is followed for the candidate De Bruijn Overlay sequence, up to one finds a $N_{err,max,test}$ value which satisfies the former conditions, in which case $N_{err,max}$ equals $N_{err,max,test}$. If $N_{err,max,test}$ reduces to 0 (i.e. the conditions have never been fulfilled even when only one error is applied to the extended overlay sequence), then another De Bruijn Overlay sequence out of the pool is selected as candidate. This process continues up to successful completion of the conditions by at least one candidate De Bruijn Overlay sequence among all candidate De Bruijn Overlay sequences of length L.

[Ref 8]: Robinson, Derek J. S. (2003). "*An Introduction to Abstract Algebra*". Walter de Gruyter. pp. 255-257

On top of the error detection capability, the selection of specific De Bruijn sequences, as Overlay sequence, shall also permit the radio receiver to correct a specific amount of errors. The extended subset of P symbols can be considered as a codeword within a specific set. Such set is composed of all possible sub-sequences of P symbols starting from all the different L positions in the overlay sequence. With this assumption, it is possible to apply the notions of the coding theory to the demodulated sequence. The coding theory specifies that if the radio receiver can detect a set of up to $N_{err,max}$ errors in a demodulated codeword, then the minimal Hamming distance between any two codewords equals ($N_{err,max}$+1) and then it is able to correct up to $$\left\lfloor \frac{N_{err,max}}{2} \right\rfloor$$

errors [Ref 8]. The radio receiver can apply a minimum distance decoding approach to the processed sequence with errors. Specifically, the radio receiver scrutinizes all the L possible sub-sequences of P symbols within the whole overlay sequence. Then it finds the sub-sequence of P symbols among this set that has the minimum Hamming distance with respect to the demodulated extended subset of P symbols. Per definition, the Hamming distance between two codewords of equal length is equal to the number of positions at which the corresponding symbols are different. If the number of errors does not exceed $$\left\lfloor \frac{N_{err,max}}{2} \right\rfloor,$$

the radio receiver is able to choose the correct sub-sequence of P symbols, correcting the wrong symbols and achieving the synchronisation regardless the demodulation errors. If it appears that the Hamming distance is 0 for one sub-sequence of P symbols out of the L possible, it means that there is no error, and the position of the extended subset corresponds to the position of the sub-sequence of P symbols for which the Hamming distance with the extended sub-set of P symbols is 0. Based on the extended subset position it is then possible to resolve time ambiguity, following the same procedure as the one described in case the snapshot duration comprise N symbols.

Figures 17A, 17B:
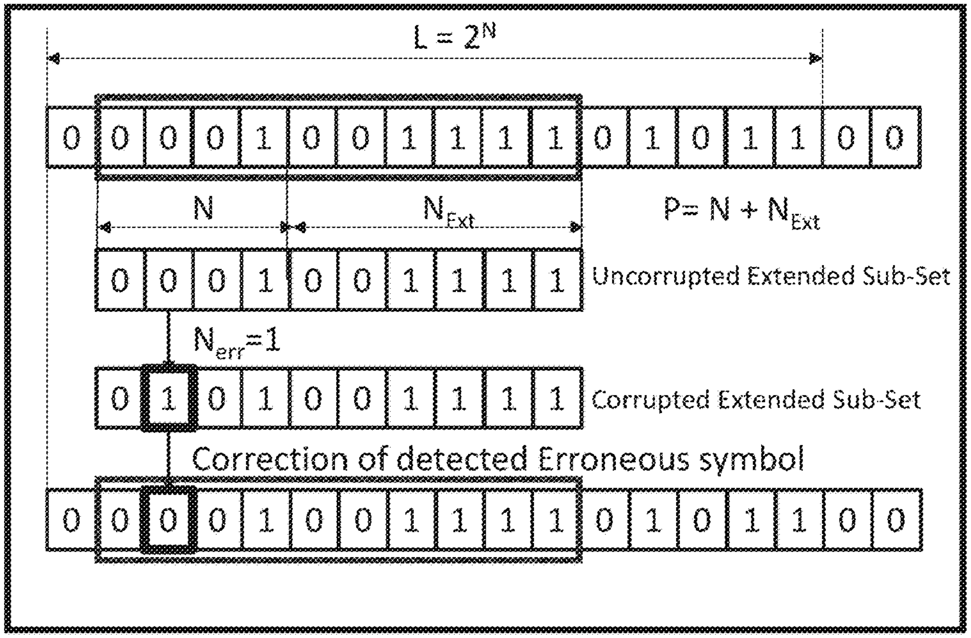
FIG. 17 represents the case when an extended subset of P=10 retrieved symbols from a signal snapshot and corrupted by 1 demodulation error does not appear at any other location within the overlay sequence, and can be corrected by evaluation the Hamming distance between this corrupted subset of length P=10, and any sub-set sequence of the original overlay sequence.

FIG. 17*a* and FIG. 17*b* illustrate the principle to detect and correct erroneously retrieved symbols within the extended sub-set of P symbols. On FIG. 17*a*, an overlay sequence [0 0 0 0 1 0 0 1 1 1 1 0 1 0 1 1] is considered. It is shown that this specific De Bruijn Sequence can detect up to $N_{err,max}$=3 erroneously retrieved symbols for any extended sub-set of P=10 symbols. In other words, any snapshot comprising P=10 symbols taken at any position within the Overlay sequence, and contaminated with 1, 2 or 3 demodulation errors, will be detected since the corresponding erroneous extended sub-set of symbols will never appear at any position within the Overlay sequence. Based on this overlay sequence one considers a specific snapshot measured from the $2^{nd}$ position within the Overlay Sequence, and this snapshot contains $N_{err}$=1 erroneous symbol: [0 1 0 1 0 0 1 1 1 1]. The Erroneous symbol is located at the second position within this snapshot (the "error free" snapshot being [0 0 0 1 0 0 1 1 1 1]). Then FIG. 17*b* represents a table providing the Hamming distance calculated between the erroneous sub-set and any sub-sequence of 10 symbols among the 16 possible within the overlay sequence. For the proposed example, the Hamming distance varies between 1 and 10. The correct position of the extended subset within the Overlay sequence then corresponds to the index of the sub-sequence within the error-free Overlay (i.e. De Bruijn) sequence showing the smallest Hamming distance, i.e. 1, calculated with the extended sub-set comprising 10 symbols. This index equals to 2, which is effectively confirmed from FIG. 17*b*. Hence it is possible to correct the corresponding extended subset and to retrieve the relative distance of the (corrected) subset w.r.t. implicit Time Marker in order to resolve Time Ambiguity. It is highlighted that this example applies because the maximal number of detectable errors for the propose De Bruijn Sequence equals $N_{err,max}$=3, and therefore up to $$\left\lfloor \frac{3}{2} \right\rfloor = 1 \text{ symbols}$$

can be corrected.

The error detection and correction De Bruijn processing penalizes the latency in retrieving the synchronization by requiring a longer signal snapshot duration comprising P symbols in place of N symbols, but this new feature increases the synchronization trustworthiness. It has to be outlined that the De Bruijn sequences that are selected from the large pool of existing De Bruijn Sequences with length L in order to support such detection and correction of demodulation errors, still fulfil the SO(N,L) property per definition, and therefore it is still possible to consider a minimal signal snapshot comprising "only" N symbols to support TAI resolution, without detection and correction of demodulation errors. The use of longer snapshot length for supporting error detection and correction is an implementation choice of the radio receiver, in accordance with its specific use case. Given the expected demodulation error, such error detection processing for De Bruijn sequence can be dimensioned providing a measure on the reliability of the synchronisation of the radio receiver with the transmitted overlay sequence.

It is noted that the proposed embodiment based on the exploitation of an extended subset of length P=N+$N_{Ext}$ is not restricted to the case when the first (sub-set) part comprising N symbols and the second (sub-set) part comprising $N_{Ext}$ symbols are adjacent, but can also apply to the case when both (sub-set) parts are disjoint, or spaced by Q symbols. A similar method for the selection of De Bruijn sequences ensuring error detection and correction to the method applied for a continuous extended sub-set can be followed when considering an extended sub-set split into two (sub-set) parts, in which case an additional optimisation parameter, with the "inter-part spacing" Q, is considered for this optimal selection. It is however noted that having a disjoint snapshot will however penalize the latency in the time ambiguity resolution, after the steps of error detection and correction, and also forces the radio receiver to be active during a longer duration corresponding to an even more extended snapshot covering the complete period spanning over both (sub-set) parts of the extended sub-set.

Figure 18B:
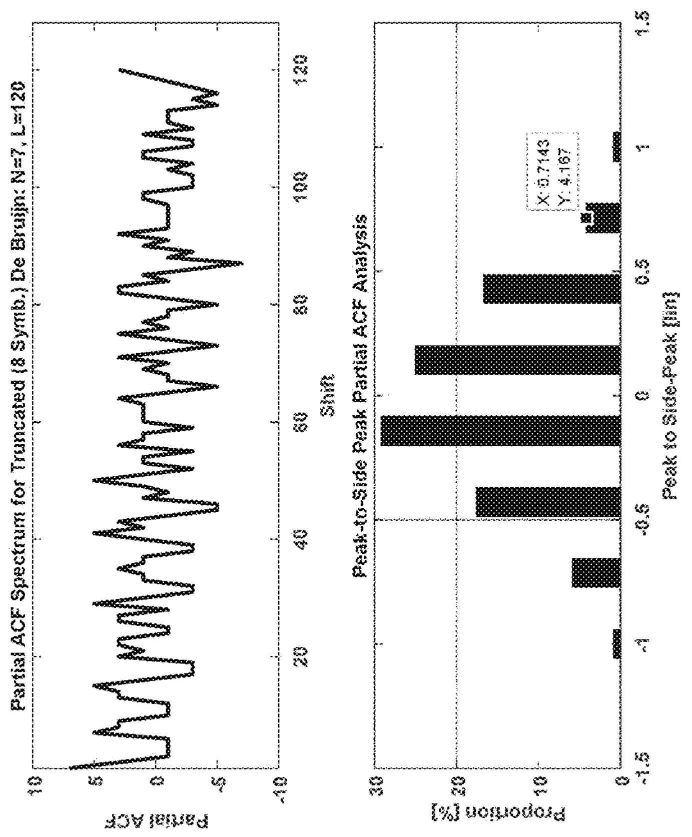
FIG. 18 presents the values obtained by correlating a snapshot comprising the first N=7 symbols of an overlay sequence with any sub-set sequence of N=7 symbols within the overlay sequence, when this overlay sequence has not been truncated (length L=128) or has been truncated with 8 symbols (length L=120).
Figure 18A:
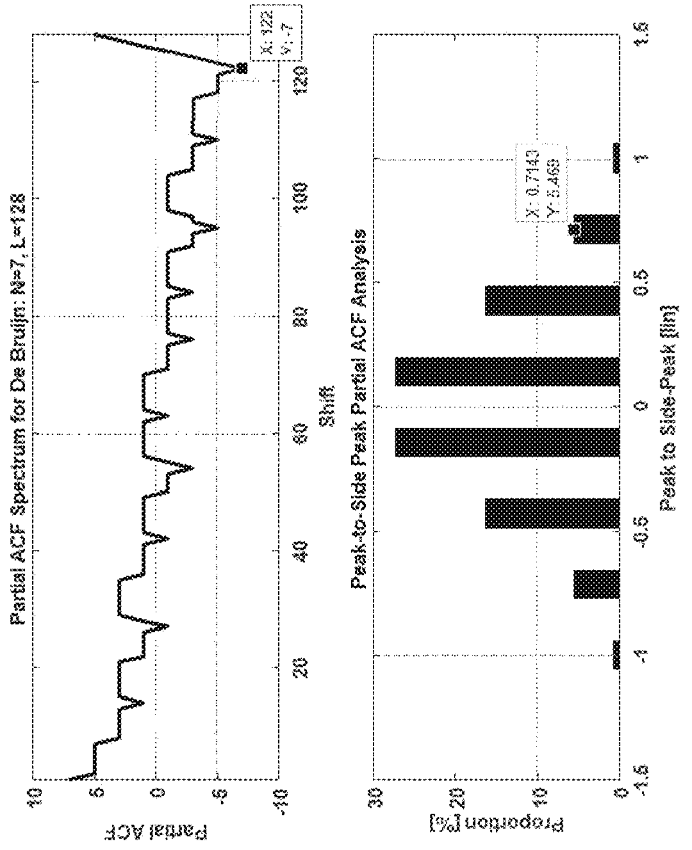

A further embodiment is now proposed to reduce the error rates in the time ambiguity resolution due to wrongly estimated positions of the signal snapshot relative to the implicit time marker by modulating a truncated De Bruijn sequence, derived from a primitive De Bruijn sequence, onto a carrier of said radio signal. In order to illustrate this principle, the upper part of FIG. 18*a* represents the partial auto-correlation values obtained between a snapshot sequence comprising a first sub-set formed with the N=7 first symbols of a primitive De-Bruijn sequence of length L=27=128 symbols (sub-set that has been padded with 121 "0"), and with any second sub-set of N=7 symbols within the primitive De Bruijn sequence (second sub-set also zero padded). The first symbol of this second sub-set starts at index 1 and ends at index 128 of the primitive De Bruijn sequence, yielding to 128 possible second sub-sets and therefore partial auto-correlation values. The whole of the 128 possible partial auto-correlation values, which can be called partial noise-free auto-correlation, varies between −7 and 7. The value 7 is reached when the snapshot sequence is correlated with the second sub-set comprising the 7 symbols starting at index 1 and zero padded. The lower part of FIG. 18*a* represents the distribution of the corresponding partial noise-free auto-correlation values. It can be observed that this distribution is symmetrical for the positive and negative partial noise-free auto-correlation values. Further, it is shown that the corresponding distribution of partial auto-correlation values is the same for any primitive De Bruijn sequence for a given length L, as an intrinsic property of the De Bruijn generation. The occurrence of the partial noise-free auto-correlation value as function of the offset will vary for each primitive De Bruijn sequence, but their distribution will be the same. It can be further observed that the second largest partial noise-free auto-correlation peak value of 5 is taken about 5% over the 128 partial correlation values. The second largest partial noise-free auto-correlation value is called first side peak partial noise-free auto-correlation value.

It is now considered that the soft-decoding method formerly described is used to retrieve the position of the snapshot w.r.t. the implicit time marker, meaning that the said snapshot signal after removal of Doppler offset and buried into noise is firstly zero padded before being correlated with the whole primitive overlay De Bruijn sequence. If the received signal is buried into a large noise level, i.e. the signal processing is performed at a low (C/No), then it might happen that the noisy partial auto-correlation, obtained with a signal snapshot for which the partial noise-free auto-correlation equals 5, exceeds the noisy auto-correlation obtained with a signal snapshot for which the noise-free auto-correlation equals 7. In this case, a misleading information regarding the actual position of the signal snapshot w.r.t. implicit time marker will yield to an incorrect time ambiguity resolution. In order to avoid such a situation, one solution consists in truncating the primitive overlay sequence, by removing U symbols, in such a way that the number of large partial noise-free auto-correlation values (5 and −5 in the proposed example) reduces. On example is shown on the upper part of FIG. 18*b* showing the 120 different partial noise-free auto-correlation values obtained for the case of a truncated De Bruijn sequence comprising 120 symbols, after having applied a truncation of U=8 symbols. In this example, the truncation is obtained by removing the last 8 symbols of the original De Bruijn sequence. In that case, it is shown on the lower part of FIG. 18*b* that the occurrence for the partial noise-free auto-correlation with a value of +5 (i.e. the first side-peak partial noise-free auto-correlation value), reduces to 4% instead of 5% without truncation. Using such a truncated De Bruijn Sequence as overlay sequence would then permit to reduce the number of mis-leading or ambiguity positions of the snapshot signal in presence of noise. It is shown that by further truncating the De Bruijn sequence it is possible to reduce the number of side-peak values, which enables to improve noise-robustness of time resolution performance. The drawback of this method is that the effective length of the Overlay sequence reduces, which impact the Time Ambiguity Interval. In the proposed example, the last U=8 symbols of the primitive De Bruijn sequence have been suppressed to deduce the truncated De Bruijn sequence used as overlay sequence. It is however possible to truncate U consecutive symbols at any place within the primitive De Bruijn sequence to generate the truncated De Bruijn sequence. Furthermore, U can vary between 0 (i.e. no truncation) and (L-N) (maximal meaningful truncation value for a snapshot comprising N symbols).

In a further alternative and advantageous embodiment of the present invention, as is presented in FIG. 19, different sequences are transmitted by the different transmitters such as satellites of a Global Navigation Satellite System. This alternative scheme, also based on the combined processing of different "De Bruijn" sequences is proposed to improve Time Ambiguity Resolution performances, such as the latency, and uses similar elements to a former embodiment described previously. In this former embodiment the same overlay sequences (possibly having different lengths, and modulated on different signal components) were transmitted by each of the different satellites of a GNSS. It is now proposed to consider the advantage that could be obtained by transmitting different sequences for different satellites or groups of satellites obtained from a clustering of the constellation.

Figure 19A:
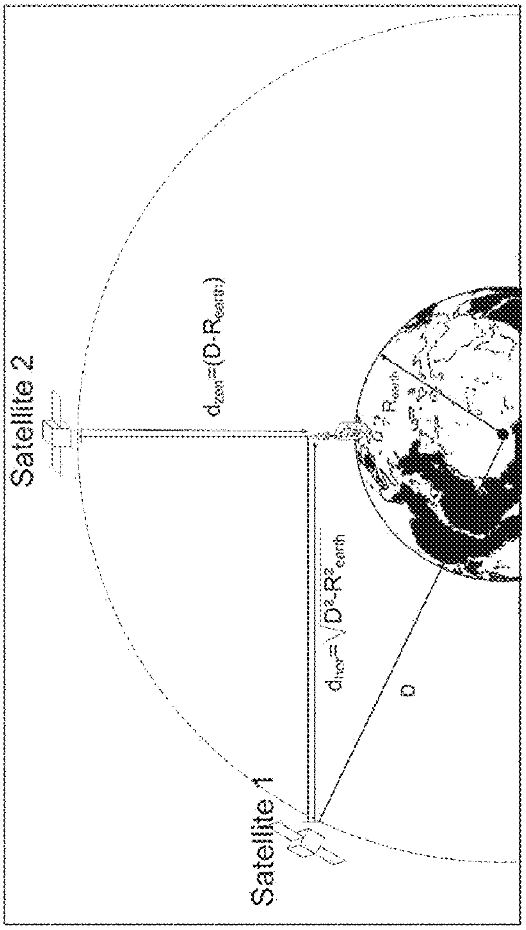
FIG. 19 represents the satellite-to-user device geometry which enables to deduce the minimal duration of the overlay symbol in order to offer time synchronization with different overlay sequences transmitted by different satellites.

FIG. 19*a* represents two extreme satellite positions w.r.t. the user device. The first one applies when the satellite is at horizon (00 elevation), while the second one corresponds to the case when the satellite is exactly at Zenith of the user device (900 elevation). In the same figure, the Earth Radius, $R_{earth}$ (=6378.137 km) and the satellite Semi-Major Axis (SMA), D, are also represented. It can be shown that the distance to horizontal satellite is then given by dhor=$(D^2-R^2_{earth})$^(½). For a GPS constellation with a SMA of 26559.70 km, dhor=25782.49 km or equivalently 85.9 ms. For a GALILEO constellation with a SMA of 29601.3 km, dhor=28905.99 km or equivalently 96.3 ms. Similarly, it can be shown that the distance to the zenithal satellite is then given by dzen=$(D-R_{earth})$. For a GPS constellation with a SMA of 26559.70 km, dzen=20181.56 km or equivalently 67.2 ms. For a GALILEO constellation with a SMA of 29601.3 km, dzen=23223.16 km or equivalently 77.4 ms. From this FIG. 19*a*, the difference between overlay sequence edges transmitted by two satellites is then in the order of 20 ms (85.9 ms-67.2 ms for GPS, and 96.3 ms-77.4 ms for Galileo).

Figure 19B:
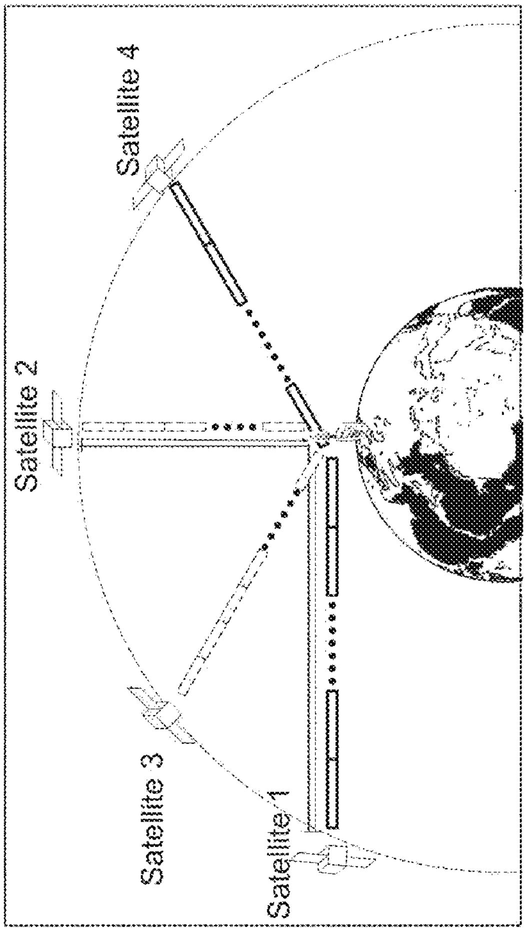

In FIG. 19*b* the case when the constellation is split into two groups of satellites is considered. The satellites transmitting a sequence of length $L_1$=32 symbols symbolised with plane lines (re-using conventions of FIGS. 13*a* and 13*b*), and the satellites transmitting a sequence of length $L_2$=31 symbols symbolised with dashed lines (re-using conventions of FIGS. 13*a* and 13*b*). The allotment of the satellites shall be done to ensure a relatively uniform reception of overlay sequence transmitted by the satellites of the first and second group. Such a repartition could for example be achieved by alternating one satellite every two belonging to each group, within each orbital plane of the constellation. Here the properties of the sequences used in the illustration of FIG. 19*a* and FIG. 19*b* are applied again, to ease understanding. Assuming then that a common overlay symbol duration is applied for both sequences, and is larger than the maximal difference of propagation time, 20 ms. Then when considering a snapshot of N (N=5 in the example) plus an additional fraction of an overlay sequence to account for the difference of propagation, it is possible to measure N symbols from the first sequence and N symbols from the second sequence. Then it is possible to apply the same principle to the one presented in the former scheme to derive an extended TAI. Assuming that the additional condition regarding the symbol duration w.r.t. maximal difference of propagation applies, then the mathematical derivations for the design of the parameters (L, snapshot time, . . . ) can be reapplied in the current alternative embodiment when different De Bruijn Sequences are transmitted by different satellites. The main difference resides in the fact that the edges of the overlay sequences are no more received synchronously, since transmitted from different satellite positions.

The corresponding alternative scheme can be extended again by considering different sequence lengths, number of truncated symbols, or symbol durations, similarly to variants presented in the former scheme applied when different overlay sequences are transmitted by the same satellite. Furthermore, it is possible to split the constellation in 3 or more sub-groups each allocated with a different sequence length. An even further extension of the scheme can be proposed. In this new scheme, two overlay sequences are transmitted by the constellation. One is transmitted by the first half of the constellation satellites and use a short overly symbol duration, $T_{s1}$ in the order of few tens of milliseconds (50 ms≤$T_{s1}$≤100 ms) while the other is transmitted by the second half of the constellation satellites and use a longer symbol duration, $T_{s2}$ in the order of few hundreds of milliseconds (100 ms≤$T_{s2}$≤1000 ms). For those connected devices, a short snapshot is just necessary to ensure estimation of the synchronization error, as already explained in the generic use case of the current invention. For non-connected devices, then a snapshot of longer duration (e.g. 1 to 2 seconds) would be necessary to extend the Time Ambiguity Resolution, and provide absolute time, by processing and combining both types of overlay sequences.

A further declination of the former embodiment considers the case when different overlay sequences of the same length are transmitted by different satellites. The advantage of this scheme is to improve the latency of the time ambiguity resolution, thanks to an improvement of the retrieval performance of the symbols comprised in the signal snapshot, but not the improvement of the Time Ambiguity Interval. The same rationales to the ones presented in a former scheme where the same satellite transmits two or more overlay sequences of the same length are applicable here too. Nevertheless, the additional constraint regarding the symbol duration based on the maximal difference of propagation time between any two satellites needs to be accounted here.

A further alternative scheme is now proposed in order to facilitate the demodulation of the overlay sequence, such as a De Bruijn, for receiver types which cannot access to the absolute phase of the signal, and rather to relative phase transitions. In the above description, the “De Bruijn” sequence is modulated on the phase of a GNSS signal. This is now described in more details.

For the receiver to determine any subsequence N in L symbols unambiguously, it is required to know the absolute phase of that signal. If the receiver is not able to resolve this 180° phase ambiguity (i.e., to determine the difference between what is interpreted as a zero or a one), every subsequence N may also be interpreted as its inverted representative, called N*. In any “De Bruijn” sequence, the inverted subsequence, N*, with length L also exists, but at a different position within the overlay sequence to the one of the subsequence N. To unambiguously demodulate the binary state of a single symbol from a phase modulated GNSS signal, the receiver must resolve the phase (i.e., track the signal in a phase locked loop (PLL)). However PLL processing imposes some implementation constraints (such as closed loop processing), and yield to performance penalties (such as an additional delay due to the Pull-In transition between acquisition and tracking modi for the retrieval of the symbol) which are not compatible to snapshot and low power consumption devices.

Alternative GNSS signal processing, tracking, techniques such as the Frequency Locked Loop (FLL) have been identified to be more prone to support the aforementioned Low Power/Snapshot receiver terminal. Indeed, FLL are known to have simpler implementation, offer less sensitive tracking, and do not show as big delays as PLL during pull-in. The main reason is that, in a typical GNSS signal processing flow, FLL processing starts directly after acquisition step only resolving the residual frequency, to ensure bit-synchronisation and PLL loop closure which resolves the remaining phase ambiguity, and then follows the PLL tracking for carrier tracking and unambiguous data demodulation. Furthermore, FLL can still operate in harsher environment (e.g. higher Noise and Interference levels) than PLL. The main drawback is that FLL can only help determining the relative phase change (i.e., detect that the signal phase has changed between two binary symbols, −1 to +1 and +1 to −1).

As a summary, the PLL signal tracking mode is less robust than FLL and requires a pull-in phase before initial loop closure which can create typical delays in the order of tens to hundreds of milliseconds and in consequence may not be applicable in snapshot receiver processing.

It is thus of interest to exploit the “De Bruijn” sequence not only on the overlay symbols to support the ability to retrieve GNSS System Time for “PLL tracking receivers”, but also on the phase transitions to support ability to retrieve GNSS System Time for “snapshot” or FLL based receiver operation. Here, the relative phase changes will be encoded by a sequence with the uniqueness property. In the following, the term “Transition Sequence” will designate the De-Bruijn sequence modulated in phase transitions (i.e., transition [1] or no transition [0]). The term “Integrated Sequence” will designate the overlay symbol sequence leading to the “Transition Sequence”, after an operation of binary integration. The skilled reader will understand that in order to code one phase transition of the “Transition Sequence”, two overlay symbols of the “Integrated Sequence” are required: The two successive and identical binary symbols [0,0] or [1,1] of the Integrated Sequence yields a [0] binary state of the “Transition Sequence” (i.e., no transition), and the two successive and different binary symbols [0,1] or [0,1] of the “Integrated Sequence” yields a [1] binary state of the “Transition Sequence” (i.e., a change in two consecutive overlay symbols equals a phase-transition). The redundancy between [0,0] and [1,1](or between [0,1] and [1,0]) to code a [0](or a [1]) originates from the anti-phase relation between the overlay symbols (i.e, 180 degrees phase ambiguity) as introduced above. The "Integrated Sequence" will then serve as overlay sequence to be phase-modulated onto the GNSS signal. It follows that the "Integrated Sequence" of a De Bruijn "Transition Sequence" must itself inherit a SO(N+1,L) property in order to allow the modulation of a sequence with SO(N,L). Further it can be noted that two "Integrated Sequences" exist with an anti-phased relationship, where both can generate the same De Bruijn "Transition Sequence" independently.

When receiving a De Bruijn "Transition Sequence", this requires an increased observation period of N'=N+1 symbols in order to demodulate N phase states (i.e., transition or no transition). However, even when using a N+1 symbol observation period to decode N phase states, the case where no transitions occur also exists (N+1 consecutive overlay symbols with same binary state), and results in no phase changes (N zeros). This particular case however prevents any reference point to resolve the synchronization error (no transition available for "bit-synchronization"), and design mitigations need to be found to avoid this situation. The first and most straight forward mitigating solution consists to increase the observation period to N+2 symbols but will result in the penalization of the minimum required observation period (N+2) and the TAI gain (L/N ratio). This degradation is especially obvious and critical for shorter sequences. An alternative mitigating solution consists in removing the special sub-sequence of "N zeros (or all zeros)" from the original De Bruijn Sequence, yielding to the "Truncated Transition Sequence". To maintain the SO property, the mechanism introduced in FIG. 20 needs to be applied to generate the "Truncated Transition Sequence" sequence based on a De Bruijn "Original Sequence".

[Ref 9]: "Combinatorial generation", Ruskey Frank, University of Victoria, Victoria, BC, Canada. 2003 Oct. 1

Figure 20:
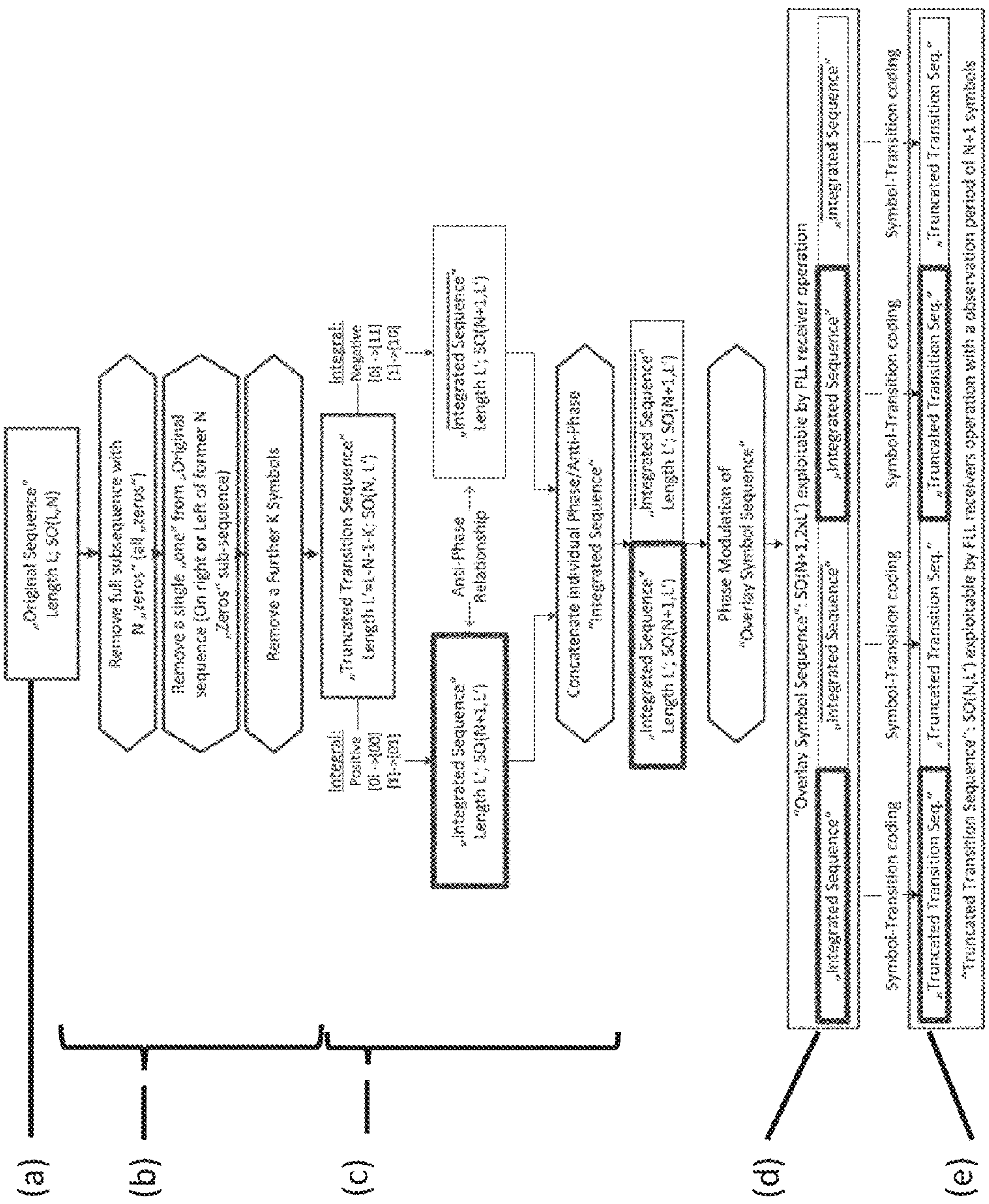
FIG. 20 presents a flow chart describing the method and steps used to determine the overlay sequence to be modulated on a signal that shall be processed with a receiver implementing a FLL, and based on a truncated transition sequence, yielding to an integrated De Bruijn sequence modulated on the signal carrier.

FIG. 20 describes the method used to generate an "Integrated sequence" fulfilling the SO(N+1,L) property based on an "Original Sequence". Here, boxes correspond to sequences, while diamond box correspond to a process.

The "Original Sequence" (FIG. 20(*a*)) with the all zeros/ones states at the beginning/end of the sequence can be generated with the algorithm described in [Ref 9]. This algorithm can ensure the following features:

1) N zeros (all zeros) are surrounded by N ones (all ones) on one side, and a sequence starting with a joint 1 followed by N−2 zeros on the other side
2) Sub-sequences with N−1 zeros and N-1 ones do not exist The algorithm in [Ref 9] naturally inherits those features based on the "De Bruijn" graph initialisation with the all zero state. However, as introduced in [Ref 6], the same sequence can in general be found as one out of 2^(2^(N−1)−N) existing "De Bruijn" sequences for each N (L=2^N).

Those features ensure that a truncated sequence with SO properties can be generated (FIG. 20(*b*)): After removing the all N zeros case a truncated sequence exists with the length (2^N)−N. In this truncated sequence, the all N ones subsequence joints inevitably another one as per feature (a). In the truncated sequence this results at that stage in the only violation of the SO property, as N+1 ones follow each other. This case can be corrected by purging a single one, located on the left or right side of the sequence of the N zeros already purged, from this subsequence, where the SO properties of the original sub-sequences remain valid as ensured by feature (b). After this first step of truncation of N+1 symbols out of the Original Sequence in order to derive a truncated sequence, it is possible to apply a second step of truncation of K further symbols from this truncated sequence in order to derive the Truncated Transition Sequence. It is noted that this second truncation step of K symbols is optional. A "Truncated Transition Sequence" results with the length L'=L-N−1-K and a SO(N,L') property. FLL based receivers can thus resolve their time ambiguity in an interval of L' symbols by observing N+1 symbols.

Following [Ref 9] the "Original Sequence" with the features as outlined above, always has 2^(N−1) ones. With the application of the truncation procedure of the invention, the remaining number of transitions of the "Truncated Transition Sequence" can be made always odd, also thanks to the additional number of truncated symbols, K. The corresponding individual "Truncated Transition Sequences" are then concatenated and integrated, resulting in consecutive individual "Integrated Sequences" to be phase-modulated onto the GNSS signal. An odd number of transitions yields to an anti-phasing of every second overlay "Integrated Sequence" (FIG. 20(*c*)). Thus every second individual "Integrated Sequence" with L' symbols is phase-shifted by 180 degrees w.r.t. the preceding one, which forms an unique concatenated "Overlay Symbol Sequence" of 2×L' symbols. This allows coding the L' symbols long "Truncated Transition Sequence" in a cyclic and infinite manner using 2×L' overlay symbols (FIG. 20(*d*)). As each of the two representations of the "Integrated Sequence" (i.e., positive and negative phasing), have the SO(N+1,L') property, and every subsequence of N+1 symbols of the positive "Integrated Sequence" reflects the inverted value at the corresponding subsequence of N+1 symbols of the negative "Integrated Sequence", the resulting concatenated "Overlay Symbol Sequence" (formed by L' positive "Integrated Sequence" symbols and L' negative "Integrated Sequence" symbols), is unique and fulfils the property SO(N+1,2×L'). A receiver which can resolves the phase ambiguity (i.e., with a PLL) can thus double the TAI w.r.t. the FLL operation, by identifying any N+1 symbol subsequence in the 2×L' long "Overlay Symbol Sequence" (FIG. 20(*e*)).

The former procedure used to derive a truncated transition sequence based on an original De Bruijn sequence was based on a specific category of Original De Bruijn Sequence generated according to the algorithm presented in [Ref 9], and which fulfils the properties (a) and (b). More specifically, they show a sub-set of N "0" followed or proceeded by N "1". It is however possible to apply a similar procedure to other original De Bruijn sequences where the sub-sets of N "0" and N "1" are not adjacent. In that case, the procedure consists in purging the sub-set of N "0" from the original sequence, and a single "1" on a one side of this sub-set of N "0", to obtain a truncated sequence of length L-N−1. In addition, and as an option it is possible to truncate K additional symbols to generate the truncated transition sequence.

It is contemplated that some of the steps discussed herein as software methods may be implemented within hardware, for example, as circuitry that cooperates with the processor to perform various method steps. Portions of the present invention may be implemented as a computer program product wherein computer instructions, when processed by a computer, adapt the operation of the computer such that the methods and/or techniques of the present invention are invoked or otherwise provided. Instructions for invoking the inventive methods may be stored in fixed or removable media, transmitted via a data stream in a broadcast or other signal bearing medium, and/or stored within a working memory within a computing device operating according to the instructions.

Although various embodiments which incorporate the teachings of the present invention have been shown and described in detail herein, those skilled in the art can readily devise many other varied embodiments that still incorporate these teachings.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architectu7re of the contents of the functional blocks hence is not given.

While the principles of the invention have been described above in connection with specific apparatus, it is to be clearly understood that this description is made only by way of example and not as a limitation on the scope of the invention, as defined in the appended claims.

The invention claimed is:

1. A radio receiver (RX1) configured to resolve time ambiguity in a radio navigation satellite system between a radio transmitter (TX1) of said radio navigation satellite system having a first time scale and said radio receiver of said radio navigation satellite system having a second time scale, said radio transmitter (TX1) being configured to transmit a radio signal to said radio receiver (RX1), said radio signal comprising an overlay sequence satisfying a condition of single occurrence of a subset of symbols, modulated onto a primary code, said primary code being modulated on a carrier of said radio signal, said overlay sequence comprising a set of symbols per time ambiguity interval, said set of symbols having a predetermined length (L), wherein L is a positive integer, each said time ambiguity interval comprising an implicit time marker, wherein the implicit time marker corresponds to a predetermined position within the overlay sequence known by convention, said radio receiver (RX1) further comprises:

a receiver, configured to receive said radio signal; and a snapshot capture processor, configured to take a snapshot of said radio signal, said snapshot comprising a subset of symbols of said overlay sequence, characterized in that said radio receiver further comprises:

a local processor configured to determine a relative position of said implicit time marker of said radio signal based on the position of said subset of symbols of said overlay sequence included in said snapshot comprising N symbols wherein N is a positive integer and wherein a ratio of L/N being large as possible; and in that said local processor further is configured to resolve said time ambiguity between said first time scale and said second time scale by evaluating a delay between said implicit time marker expressed in the first time scale and based on said processing of said snapshot and said implicit time marker within said overlay sequence generated based on said second time scale.

2. The radio receiver (RX1) according to claim 1, characterized in that said subset of symbols included in said snapshot is extended with an additional subset of symbols of said overlay sequence, said additional subset having a length of $N_{Ext}$ symbols, said extended subset of symbols comprising $P=N+N_{Ext}$ symbols; and in that said local processor further is configured to calculate a Hamming distance between said extended subset of symbols included in said snapshot and each sub-sequence of said overlay sequence having a length of $P=N+N_{Ext}$ symbols; and in that said local processor further is configured to detect an error in said extended subset of symbols if the minimum value over all Hamming distances calculated between said extended subset of symbols included in said snapshot, and each sub-sequence of said overlay sequence comprising $P=N+N_{Ext}$ symbols, is non-zero, or is zero and occurs more than once; and in that said local processor, further is configured to determine said relative position of said implicit time marker of said radio signal based on said extended subset of symbols included in said snapshot, if said minimum value over all Hamming distances calculated between said extended subset of symbols included in said snapshot, and each sub-sequence of said overlay sequence comprising $P=N+N_{Ext}$ symbols, is zero and occurs once.

3. The radio receiver (RX1) according to claim 2 characterized in that said local processor further is configured to correct an error if the minimum value over all Hamming distances calculated between said extended subset of symbols included in said snapshot, and each sub-sequence of said overlay sequence comprising $P=N+N_{Ext}$ symbols, does not exceed a further predetermined minimum value, $\lfloor N_{err,max}/2 \rfloor$, depending on the selected Overlay Sequence, by selecting the sub-sequence of said overlay sequence comprising $P=N+N_{Ext}$ symbols yielding to a minimum Hamming distance, and correcting up to $\lfloor N_{err,max}/2 \rfloor$ symbols which differ between said sub-sequence of said overlay sequence comprising $P=N+N_{Ext}$ symbols and the said extended subset of symbols included in said snapshot.

4. The radio receiver (RX1) according to claim 1, characterized in that:

said receiver, further is configured to receive a first radio signal from a first radio transmitter and at least a second radio signal from a second radio transmitter, said first radio signal and at least said second radio signal comprising an overlay sequence, where said first and said at least said second overlay sequences are different; and in that:

said receiver, further is configured to combine said overlay sequence of said first radio signal and said overlay sequence of at least said second radio signal in an aggregate overlay sequence; and said snapshot capture processor, is configured to take a snapshot of said aggregate overlay sequence of said first radio signal and at least said second radio signal, said snapshot comprising a subset of symbols of said aggregate overlay sequence, characterized in that said radio receiver ($RX_1$) further comprises:

a local processor configured to determine a relative position of said implicit time marker of said radio signal based on the position of said subset of symbols of said aggregate overlay sequence included in said snapshot comprising N symbols; and said local processor further is configured to resolve said time ambiguity between said first time scale and said second time scale by evaluating said delay between said implicit time marker expressed in said first time scale and based on said processing of said snapshot and said implicit time marker within said aggregate overlay sequence generated based on said second time scale.

5. The radio receiver (Rx1) according to claim 1 characterized in that said snapshot capture processor is configured to capture a snapshot of said radio signal, said snapshot comprising a subset of symbols of said overlay sequence consisting of a concatenated integrated sequence generated by a radio transmitter (Tx), wherein said snapshot comprising a number of symbols equal to N+1; and in that said local processor further is configured to:

determine N transitions from said subset of symbols of said overlay sequence included in said snapshot; and determine said position of said subset of symbols included in said snapshot relative to said implicit time marker of said radio signal, based on said N transitions from said subset of symbols included in said snapshot, wherein the radio transmitter (Tx) is configured to resolve time ambiguity in a radio navigation satellite system between said radio transmitter (TX1) of said radio navigation satellite system having a first time scale and a radio receiver (RX1) of said radio navigation satellite system having a second time scale, said radio transmitter (TX1) being configured to transmit a radio signal to said radio receiver (RX1), said radio transmitter ($TX_1$) comprising:

a sequence generating processor, configured to generate an overlay sequence comprising a set of symbols per time ambiguity interval, said set of symbols having a predetermined length L, said overlay sequence satisfying a condition of single occurrence of a subset of symbols within said set of symbols of said time ambiguity interval, each said time ambiguity interval comprising an implicit time marker; and a transmitter, configured to transmit a radio signal to said radio receiver (RX1), said radio signal comprising said overlay sequence modulated onto a primary code, said primary code being modulated on a carrier of said radio signal, said overlay sequence comprising a set of symbols per time ambiguity interval, said set of symbols having a predetermined length L, each said time ambiguity interval comprising an implicit time marker, wherein said overlay sequence consists of a M-ary sequence which is based on a M-ary De Bruijn sequence, wherein M is a positive integer greater than one.

6. The radio receiver (RX1) according to claim 1, characterized in that said local processor further is configured to determine said relative position of said implicit time marker of said radio signal based on the position of said subset of symbols included in said snapshot within said set of symbols of said time ambiguity interval, by looking up said subset of symbols included in said snapshot in an entry of a repository, said repository comprising per entry a plurality of symbols of said snapshot and a relative position of said plurality of symbols of said snapshot relative to said time marker in said time ambiguity interval of said radio signal.

7. The radio receiver (RX1) according to claim 1, characterized in that said radio receiver ($RX_1$) further comprises:

a snapshot sequence generating processor, configured to generate a snapshot sequence corresponding to said snapshot of said overlay sequence modulated onto said radio signal transmitted by said transmitter ($TX_1$) based on the retrieved symbols; and in that said local processor is configured to determine said relative position of said time marker in said radio signal, by partially auto-correlating said snapshot sequence with an overlay sequence corresponding to said snapshot sequence.

8. The radio receiver (RX1) according to claim 1, characterized in that said radio receiver (RX1) further comprises:

a snapshot sequence generating processor, configured to generate a snapshot sequence corresponding to said snapshot of said overlay sequence modulated onto said radio signal transmitted by said transmitter ($TX_1$) based on samples derived from the snapshot signal; and in that said local processor is configured to determine said relative position of said time marker in said radio signal, by partially auto-correlating said snapshot sequence with an overlay sequence corresponding to said snapshot sequence.

9. The radio receiver (RX1) according to claim 1, characterized in that said radio receiver (RX1) implements a phase locked loop to retrieve the phase of the radio signal.

10. The radio receiver (RX1) according to claim 1, characterized in that said radio receiver (RX1) implements a frequency locked loop to retrieve the phase changes of the radio signal.

11. A method for resolving time ambiguity in a radio navigation satellite system between a radio transmitter ($TX_1$) of a plurality of transmitters of said radio navigation satellite system having a first time scale and a radio receiver ($RX_1$) of a plurality of radio receivers of said radio navigation satellite system having a second time scale, said radio transmitter (TX1) being coupled to said radio receiver ($RX_1$), said radio transmitter transmitting a radio signal to said radio receiver ($RX_1$), characterized in that said method comprising the steps of:

generating, by said radio transmitter ($TX_1$), an overlay sequence comprising a set of symbols per time ambiguity interval, said set of symbols having a predetermined length L, wherein L is a positive integer, said overlay sequence satisfying a condition of single occurrence of a subset of symbols within said set of symbols of said time ambiguity interval, each said time ambiguity interval comprising an implicit time marker, wherein the implicit time marker corresponds to a predetermined position within the overlay sequence known by convention; and transmitting said radio signal, by said radio transmitter ($TX_1$), to said radio receiver ($RX_1$), said radio signal comprising said overlay sequence modulated onto a primary code, said primary code being modulated on a carrier of said radio signal; and receiving said radio signal by said radio receiver ($RX_1$); and capturing a snapshot of said radio signal by said radio receiver ($RX_1$), said snapshot comprising a subset of symbols of said overlay sequence comprising N symbols wherein N is a positive integer and wherein a ratio of L/N being large as possible; and processing said snapshot, by said radio receiver ($RX_1$), to determine a relative position of said implicit time marker of said radio signal based on the position of said subset of symbols included in said snapshot within said set of symbols of said time ambiguity interval; and resolving said time ambiguity between said first time scale and said second time scale by evaluating a delay between said implicit time marker expressed in said first time scale and based on said processing of said snapshot and said implicit time marker within said overlay sequence generated based on the second time scale wherein said overlay sequence consists of a M-ary sequence which is based on M-ary De Bruijn sequence, wherein M is a positive integer greater than one.

12. A radio transmitter ($TX_1$) configured to resolve time ambiguity in a radio navigation satellite system between said radio transmitter (TX1) of said radio navigation satellite system having a first time scale and a radio receiver (RX1)

of said radio navigation satellite system having a second time scale, said radio transmitter (TX1) being configured to transmit a radio signal to said radio receiver (RX1), characterized in that said radio transmitter (TX1) comprising:

a sequence generating processor, configured to generate an overlay sequence comprising a set of symbols per time ambiguity interval, said set of symbols having a predetermined length L, wherein L is a positive integer, said overlay sequence satisfying a condition of single occurrence of a subset of symbols within said set of symbols of said time ambiguity interval, each said time ambiguity interval comprising an implicit time marker, wherein the implicit time marker corresponds to a predetermined position within the overlay sequence known by convention; and a transmitter, configured to transmit a radio signal to said radio receiver (RX1), said radio signal comprising said overlay sequence modulated onto a primary code, said primary code being modulated on a carrier of said radio signal, said overlay sequence comprising a set of symbols per time ambiguity interval, said set of symbols having a predetermined length L, wherein L is a positive integer, each said time ambiguity interval comprising an implicit time marker, wherein said overlay sequence consists of a M-ary sequence which is based on a M-ary De Bruijn sequence, wherein M is a positive integer greater than one.

13. The radio transmitter (TX1) according to claim 12, characterized in that said sequence generating processor, further is configured to generate a plurality of overlay sequences, which are different from each other.

14. The radio transmitter ($T_x$) according to claim 12, characterized in that said sequence generation processor further is configured to:

generate a truncated transition sequence, based on an original sequence consisting of an original de Bruijn sequence having a length of L symbols by first removing N symbols comprising “0” from said original sequence and subsequently removing a single symbol comprising “1” from said original sequence yielding to a truncated sequence, and optionally removing additional K symbols, from this said truncated sequence, resulting in a truncated transition sequence of length L-N−1-K, wherein K is a positive integer; and generate a first integrated sequence indicating phase transitions of said truncated transition sequence and as second integrated sequence indicating phase transitions of an inverted truncated transition sequence, said first integrated sequence being in anti-phase of said second integrated sequence; and generate a concatenated integrated sequence by concatenating said first and said second integrated sequence; and in that said concatenated integrated sequence is configured for modulation onto a primary code, said primary code being modulated on a carrier of said radio signal.

15. A radio navigation system for resolving time ambiguity in a radio navigation satellite system between a radio transmitter (TX1) of a plurality of radio transmitters of said radio navigation satellite system having a first time scale and a radio receiver (RX1) of a plurality of radio receivers of said radio navigation satellite system having a second time scale, said transmitter is coupled to said at least one radio receiver (RX1) of said plurality of radio receivers, said radio transmitter (TX1) being configured to transmit a radio signal to said radio receiver (RX1), characterized in that said system comprises:

a radio transmitter (TX1) according to claim 12; and in that said system further comprises:

a radio receiver (RX1) configured to resolve time ambiguity in a radio navigation satellite system between a radio transmitter (TX1) of said radio navigation satellite system having a first time scale and said radio receiver of said radio navigation satellite system having a second time scale, said radio transmitter (TX1) being configured to transmit a radio signal to said radio receiver (RX1), said radio signal comprising an overlay sequence satisfying a condition of single occurrence of a subset of symbols, modulated onto a primary code, said primary code being modulated on a carrier of said radio signal, said overlay sequence comprising a set of symbols per time ambiguity interval, said set of symbols having a predetermined length (L), wherein L is a positive integer, each said time ambiguity interval comprising an implicit time marker, wherein the implicit time marker corresponds to a predetermined position within the overlay sequence known by convention, said radio receiver (RX1) further comprises:

a receiver, configured to receive said radio signal; and a snapshot capture processor, configured to take a snapshot of said radio signal, said snapshot comprising a subset of symbols of said overlay sequence, wherein said radio receiver further comprises:

a local processor, configured to determine a relative position of said implicit time marker of said radio signal based on the position of said subset of symbols of said overlay sequence included in said snapshot comprising N symbols, wherein N is a positive integer and wherein a ratio of L/N being large as possible; and said local processor further is configured to resolve said time ambiguity between said first time scale and said second time scale by evaluating a delay between said implicit time marker expressed in the first time scale and based on said processing of said snapshot and said implicit time marker within said overlay sequence generated based on said second time scale.

* * * * *